United States Patent
Kweon et al.

(10) Patent No.: US 10,518,382 B2
(45) Date of Patent: Dec. 31, 2019

(54) SUBSTRATE PROCESSING SYSTEM

(71) Applicant: K.C.Tech Co., Ltd., Anseong-si, Gyeonggi-do (KR)

(72) Inventors: Young Kyu Kweon, Pyeongtaek-si (KR); Byoung Chaul Son, Anseong-si (KR); Moon Gi Cho, Seoul (KR); Joon Ho An, Busan (KR)

(73) Assignee: KCTECH CO., LTD., Anseong-si, Gyeonggi (KR)

( * ) Notice: Subject to any disclaimer, the term of this patent is extended or adjusted under 35 U.S.C. 154(b) by 434 days.

(21) Appl. No.: 15/373,703

(22) Filed: Dec. 9, 2016

(65) Prior Publication Data

US 2017/0320188 A1 Nov. 9, 2017

(30) Foreign Application Priority Data

May 3, 2016 (KR) .................. 10-2016-0054652
Jun. 21, 2016 (KR) .................. 10-2016-0077267
Jun. 24, 2016 (KR) .................. 10-2016-0079061

(51) Int. Cl.
| | |
|---|---|
| *B24B 37/20* | (2012.01) |
| *B08B 3/02* | (2006.01) |
| *B08B 3/08* | (2006.01) |
| *B08B 3/12* | (2006.01) |
| *H01L 21/02* | (2006.01) |
| *H01L 21/306* | (2006.01) |
| *H01L 21/67* | (2006.01) |

(52) U.S. Cl.
CPC ............. *B24B 37/20* (2013.01); *B08B 3/02* (2013.01); *B08B 3/08* (2013.01); *B08B 3/12* (2013.01); *H01L 21/02057* (2013.01); *H01L 21/02096* (2013.01); *H01L 21/30625* (2013.01); *H01L 21/67046* (2013.01); *H01L 21/67051* (2013.01); *H01L 21/67092* (2013.01)

(58) Field of Classification Search
CPC ......... B24B 49/10; B24B 37/20; H01L 21/02; H01L 21/306
USPC ............................ 451/5, 8–10, 287–288, 41
See application file for complete search history.

(56) References Cited

U.S. PATENT DOCUMENTS

| | | | | |
|---|---|---|---|---|
| 5,779,520 | A * | 7/1998 | Hayakawa | ........ H01L 21/31053 257/E21.244 |
| 2004/0209550 | A1* | 10/2004 | Jeong | .................... B24B 37/345 451/5 |
| 2005/0287928 | A1* | 12/2005 | Hardikar | .................. B08B 1/00 451/5 |

FOREIGN PATENT DOCUMENTS

KR 10-2014-0173576 8/2016 .......... H01L 21/304

\* cited by examiner

*Primary Examiner* — Robert A Rose
(74) *Attorney, Agent, or Firm* — Kusner & Jaffe

(57) ABSTRACT

A substrate processing system comprising a polishing part, a pre-cleaning region, and a cleaning part. The polishing part performs a Chemical Mechanical Polishing (CMP) process on a substrate. The pre-cleaning region is prepared in the polishing part and allows pre-cleaning performed on the substrate having undergone the polishing process. The cleaning part cleans the substrate pre-cleaned in the pre-cleaning region.

35 Claims, 40 Drawing Sheets

SUBSTRATE PROCESSING SYSTEM

CROSS-REFERENCE TO RELATED APPLICATIONS

This U.S. non-provisional patent application claims priority under 35 U.S.C. § 119 of Korean Patent Application Nos. 10-2016-0054652 filed on May 3, 2016, 10-2016-0077267 filed on Jun. 21, 2016 and 10-2016-0079061 filed on Jun. 24, 2016 the entire contents of which are hereby incorporated by reference.

FIELD OF THE INVENTION

The present invention disclosed herein relates to a substrate processing system, and more particularly, to a substrate processing system, which can improve the cleaning efficiency by preparatorily separating foreign substances remaining on a substrate before a process for cleaning the substrate is performed.

BACKGROUND OF THE INVENTION

As fine circuit lines are high-densely integrated in a semiconductor device, precise polishing corresponding thereto needs to be performed on the surface of a wafer. In order to more precisely perform polishing of a wafer, a mechanical polishing process and Chemical Mechanical Polishing (CMP) process in which mechanical polishing and chemical polishing are combined may be performed.

The CMP process is a process of precisely polishing the surface of a water for the purpose of the global planarization for removing a height difference between a cell region and a surrounding circuit region due to an unevenness of the wafer surface generated when masking, etching and interconnection processes of a semiconductor device manufacturing process are repeatedly performed, and the improvement of wafer surface roughness due to high integration of a device and separation contact/wiring film for forming a circuit.

In the CMP process, a wafer is pressurized while a process surface of the wafer faces a polishing pad, and thus chemical polishing and mechanical polishing of the process surface are simultaneously performed. The wafer on which the polishing process is performed is gripped by a carrier head, and then goes through a cleaning process for removing foreign substances from the process surface.

As shown in FIG. 1, when a wafer (W) is supplied to a chemical mechanical polishing system (X1) from a loading unit (20), the chemical mechanical polishing process is performed on a plurality of polishing surface plates (P1, P2, P1', and P2') while the wafer (W) is moved (66-68) along a predetermined path (Po) in a state where the wafer (W) is adhered closely to carrier heads (S1, S2, S1', and S2'; S). The wafer (W) on which the chemical mechanical polishing process is performed is transferred to a cradle (10) of an unloading unit by the carrier head (S), and then is transferred to a cleaning unit (X2) where a cleaning process is performed. Thereafter, a process of removing foreign substances from the wafer (W) is performed in a plurality of cleaning modules (70).

However, since the time taken for the polishing process that is performed in each polishing surface plate is different from the time taken for the cleaning process in each cleaning unit (C1, C2), the wafer (W) transferred by the carrier head (S) may not be introduced into a next process immediately after one process is finished, thereby causing a process delay.

Meanwhile, as a semiconductor is further miniaturized and highly integrated, the importance of the cleaning efficiency of a wafer is growing more and more. Particularly, when foreign substances remain on the surface of a wafer even after the cleaning process of a wafer is finished in the cleaning module, the yield may be reduced, and the stability and reliability may be reduced. Accordingly, foreign substances need to be removed in the cleaning module to the maximum.

For this, there has been proposed a method of increasing the cleaning efficiency, by preparatorily cleaning a wafer to remove foreign substances before a wafer having undergone the polishing process is transferred to the cleaning module and then by again cleaning the wafer in the cleaning module.

However, this method has a limitation in that since a preliminary cleaning space needs to be additionally prepared to perform a separate preliminary cleaning independently of the cleaning module, the layout of equipment is disadvantageous and the transfer and cleaning treatment process of the wafer becomes complicated. Also, the cleaning time increases, and the cost increases but the yield decreases. Particularly, since a wafer unloaded to an unloading position after the polishing process needs to go through a complicated process of being transferred to the separate preliminary cleaning space for the preliminary cleaning and then being again transferred to the cleaning module, the whole treatment process efficiency of a wafer is reduced.

Accordingly, various studies for improving the cleaning efficiency and the yield and reducing the cost are being conducted, but are still insufficient and more development related thereto is needed.

SUMMARY OF THE INVENTION

The present invention provides a substrate processing system, which can improve the cleaning efficiency, and can increase the yield.

The present invention also provides a substrate processing system, which can preliminarily remove foreign substances remaining on a substrate in a preliminary cleaning region to which the substrate is unloaded before a cleaning process is performed.

The present invention also provides a substrate processing system, which can improve the process efficiency by overcoming a limitation in that substrates having undergone the polishing process cannot be continuously introduced into the cleaning process as the pre-cleaning process is performed on the substrate having undergone the polishing process before the main cleaning process is performed.

The present invention also provides a substrate processing system, which can minimize foreign substances remaining on a substrate before a cleaning process without modifying or supplementing a layout of existing equipment or reducing the process efficiency.

The present invention also provides a substrate processing system, which can continuously perform each treatment process without a break by improving the process efficiency.

The present invention also provides a substrate processing system, which can shorten the time taken for unloading of a substrate and thus reduce the transfer time of the substrate introduced into the polishing process, by directly piling up substrates on which the polishing process is performed while being transferred by a carrier head, without a separate robot arm or gripper.

The present invention also provides a substrate processing system, which can minimize foreign substances remaining on a substrate before a cleaning process without modifying or supplementing a layout of existing equipment or reducing the process efficiency.

Embodiments of the present invention provide substrate processing systems comprising: a polishing part performing a Chemical Mechanical Polishing (CMP) process on a substrate; a pre-cleaning region prepared in the polishing part and having pre-cleaning performed on the substrate having undergone the polishing process; and a cleaning part for cleaning the substrate pre-cleaned in the pre-cleaning region.

For cleaning of the substrate, after foreign substances remaining on the substrate are preliminarily pre-cleaned in the pre-cleaning region to which the substrate is unloaded, a main cleaning process may be performed on the substrate in the cleaning part. Thus, foreign substances remaining on the surface can be effectively removed, and the cleaning efficiency of the substrate can be improved.

Particularly, foreign substances remaining on the substrate prior to the cleaning process can be minimized without a reduction of the process efficiency, by performing pre-cleaning on the substrate in the pre-cleaning region which is prepared in the polishing part and to which the substrate is unloaded, without a change or addition of the layout of existing equipment.

In other words, before the substrate on which the polishing process is performed is transferred to undergo the main cleaning process, the substrate may be transferred to a separate cleaning region to be pre-cleaned, and then may be again transferred to the cleaning part. In this case, however, since the substrate needs to go through a complicate transfer process in which the substrate unloaded to the unloading region needs to be transferred to the separate cleaning region and then needs to be again transferred to the cleaning part, the whole processing efficiency of the substrate may be reduced. Also, in order to additionally prepare a separate cleaning region, since the layout of existing equipment needs to be changed or added, the space utilization may be reduced, and the cost may increase for the change of equipment. However, a process sequence in which the substrate having undergone the polishing process is unloaded to the pre-cleaning region and then is transferred to the cleaning part may be maintained without a change, and foreign substances remaining on the substrate may be preliminarily pre-cleaned in the pre-cleaning region. Thus, without a change or addition of the layout of existing equipment, foreign substances remaining on the substrate can be minimized without a reduction of the process efficiency before a main cleaning process is performed.

Furthermore, since foreign substances remaining on the substrate can be maximally removed through the pre-cleaning process performed in the pre-cleaning region prior to the cleaning process, the cleaning effect by the main cleaning process can be improved, and the cleaning efficiency may also be improved.

Also, the pre-cleaning in the pre-cleaning region may be performed by at least one of a cleaning liquid spraying part that sprays a cleaning liquid onto the surface of the substrate, a steam spraying part that sprays steam onto the surface of the substrate, a heterogeneity fluid spraying part that sprays heterogeneity fluids onto the surface of the substrate, a cleaning brush that makes rotational contact with the surface of the substrate, and a megasonic generator that supplies vibration energy to the surface of the substrate. The pre-cleaning may be performed with optimal conditions by selecting the type of pre-cleaning in accordance with the characteristics of the substrate or the deposition characteristics.

Furthermore, at least one of the cleaning liquid spraying part, the steam spraying part, and the heterogeneity fluid spraying part may be provided so as to be oscillatable in the pre-cleaning region. This structure can maximize the cleaning efficiency by cleaning liquids, steam and/or heterogeneity fluids, and can reduce the amount of cleaning liquids, steam and/or heterogeneity fluids that are used, by allowing cleaning liquids and/or heterogeneity fluids to be oscillation-sprayed onto the surface of the substrate. Also, this method may have an effect of separating foreign substances from the surface of the substrate by a cleaning power (including hitting force) by cleaning liquids, steam and/or heterogeneity fluids and sweeping and discharging separated foreign substances out of the substrate.

A blocking unit may be provided to block a pre-cleaning processing space of the pre-cleaning region from other spaces while pre-cleaning is being performed in the pre-cleaning region. The blocking unit may block a chemical and a cleaning liquid used for the pre-cleaning from being introduced to the substrate on which the polishing process is being performed, by blocking the pre-cleaning processing space of the pre-cleaning region from other spaces.

Also, a blocking unit may be provided to selectively block the polishing part and the cleaning part. The blocking unit can keep the cleaning part cleaner by fundamentally blocking polishing substances and foreign substances generated in the polishing part from being introduced to the cleaning part. That is, much more foreign substances may be generated in the polishing part compared to the cleaning part, and foreign substances generated in the polishing part and introduced into the cleaning part may cause a cleaning failure or cleaning deterioration. Thus, the blocking unit can improve the cleaning efficiency of the cleaning process performed in the cleaning part, by wholly blocking a boundary of the polishing part and the cleaning part, and thus by blocking polishing substances and foreign substances generated in the polishing part from being introduced to the cleaning part.

Also, the polishing part may include a first polishing region comprising a plurality of first polishing surface plates disposed therein, a second polishing region facing the first polishing region and comprising a plurality of second polishing surface plates disposed therein, and a substrate transfer line disposed between the first polishing region and the second polishing region and transferring a substrate loaded to a loading region prepared in the polishing part. The substrate loaded to the loading region may be transferred along the substrate transfer line to be polished in the first polishing region or the second polishing region, and then may be unloaded to a pre-cleaning region.

Thus, in this embodiment, the substrate may be first transferred along the substrate transfer line, and may be polished in the first polishing region or the second polishing region and then immediately unloaded to the pre-cleaning region. Thus, a separate spraying device for maintaining the wet state of the substrate having undergone the polishing may not be needed, and an occurrence of a watermark may be prevented.

In other words, the substrate may be first polished in the first polishing region or the second polishing region, and the substrate having undergone the polishing may be transferred along the substrate transfer line and then unloaded from the pre-cleaning region. However, in this structure where the substrate is transferred after being polished, the substrate having undergone the polishing may be dried while being transferred along the substrate transfer line, and a watermark may occur or a mounted part of the substrate may be damaged. Accordingly, a separate spraying device or wetting bath needs to be inevitably provided on the substrate transfer line to maintain the wet state of the substrate. However, in this embodiment, since the substrate is first transferred through the substrate transfer line provided at the center between the first polishing region and the second polishing region, and the substrate is polished in the first polishing region or the second polishing region and then immediately unloaded to the pre-cleaning region, a separate device for wetting the substrate may not be needed, and the substrate having undergone the polishing process may be prevented from being dried. In addition, damage of substrate-mounted parts due to drying and a defect due to a watermark may be prevented.

The cleaning part may include at least one of a contact-type cleaning unit and a non-contact-type cleaning unit. The contact-type cleaning unit may make contact with the surface of the substrate so as to effectively remove organic matters and other foreign substances remaining on the surface of the substrate and may perform cleaning. The non-contact-type cleaning unit may not make contact with the surface of the substrate and may perform cleaning. The contact-type cleaning unit may make physical contact with the surface of the substrate, and may remove foreign substances having relatively large sizes or strongly stuck to the surface of the substrate, and the non-contact-type cleaning unit may remove fine foreign substances remaining on the substrate by a non-contact method of spraying a fluid to the substrate.

More specifically, the contact-type cleaning unit may include a cleaning brush and a chemical supply part, and the non-contact-type cleaning unit may clean the substrate using at least one of the cleaning fluid spraying part (cleaning liquid spraying part, steam spraying part, and heterogeneity fluid spraying part), the isopropyl alcohol spraying part, and the megasonic generator.

Also, the substrate processing system may include an inverting unit. The inverting unit may be disposed to be movable from a loading region to which a substrate provided in the polishing part is loaded to a pre-cleaning region. The inverting unit may receive the substrate from the loading region, and may transfer the substrate to the pre-cleaning region. The substrate may be pre-cleaned in the pre-cleaning region while being supported by the inverting unit.

Particularly, the substrate may be transferred from the loading region of the substrate formed on the moving path of a transfer unit (e. g., carrier head) to the pre-cleaning region after being gripped by the inverting unit. Accordingly, since the transfer unit has only to move the loading region without moving to the pre-cleaning region, the moving path of the transfer unit can be minimized.

Specifically, the inverting unit may include an operation assembly moving from the loading region to the pre-cleaning region, a rotation assembly invertibly connected to the operation assembly, and a grip assembly connected to the rotation assembly and gripping the substrate.

Otherwise, the inverting unit may be fixedly installed at the pre-cleaning region, and may grip the substrate in the pre-cleaning region to invert the substrate.

In addition, by performing pre-cleaning in the pre-cleaning region while the substrate is being supported by the inverting unit, the supporting process for allowing the substrate not to move during the pre-cleaning in the pre-cleaning region can be simplified.

Naturally, it may be possible to support the substrate using a separate supporting unit and perform the pre-cleaning. However, since the substrate is supported during the inverting process of the substrate which is necessarily performed regardless of the pre-cleaning, the process of supporting the substrate can be simplified, and thus the whole process can be reduced.

In one embodiment, the pre-cleaning in the pre-cleaning region may be performed when the substrate is inverted by the inverting unit (when the polishing surface is inverted so as to face upward), or may be performed when the substrate is disposed upright by the inverting unit. According to circumstances, the pre-cleaning may also be performed while the substrate is being supported by the inverting unit before the substrate is inverted by the inverting unit 140 (when the polishing surface of the substrate is disposed to face downward).

Also, the cleaning part may be configured to include a plurality of cleaning units which are stacked in a vertical direction and individually perform cleaning on the substrate. Thus, a footprint of the cleaning part can be reduced and the space efficiency can be improved, by stacking the plurality of cleaning units.

Here, the stacking of the plurality of cleaning units in a vertical direction may be defined as stacking the plurality of cleaning units in a two or more-layered structure.

In one embodiment, the cleaning units may include a plurality of contact-type cleaning units, and a plurality of non-contact-type cleaning units. The plurality of contact-type cleaning units may be stacked in a vertical direction, may make physical contact with the surface of the substrate, and may individually perform cleaning on the substrate. The plurality of non-contact-type cleaning units may be stacked in a vertical direction, may not physically contact the surface of the substrate, and may individually perform cleaning on the substrate. According to circumstances, only one of the contact-type cleaning unit and the non-contact-type cleaning unit may be provided in a stacked structure.

In addition, the cleaning part may include a transfer unit to transfer the substrate from any one of the plurality of cleaning units to another of the plurality of cleaning units. The substrate may be transferred in the cleaning part by the transfer unit.

The substrate may be cleaned along various cleaning paths that are defined in the cleaning part. Here, the cleaning path of the substrate may be construed as an order in which the substrate is cleaned in the cleaning part or a path along which the substrate is transferred while being cleaned in the cleaning part.

More specifically, the substrate is configured to be cleaned along the cleaning path that passes through at least one of the plurality of cleaning units in the cleaning part. The cleaning path of the substrate may go through at least one of the plurality of contact-type cleaning units and 404 and at least one of the plurality of non-contact-type cleaning units in order to improve the cleaning efficiency of the substrate.

Otherwise, the cleaning path can be maximally shortened by skipping at least one of the plurality of cleaning units which is predetermined in the preparatory cleaning path. Here, the skipping of at least one of the plurality of cleaning units which is predetermined in the cleaning unit of the substrate may be construed as being cleaned in the cleaning part without going through a specific cleaning unit that is skipped.

In addition, the plurality of cleaning units constituting the cleaning part may include a blocking unit that independently blocks each cleaning space from other spaces. Thus, a cleaning failure and a cleaning deterioration due to an inflow of fumes generated during the cleaning of the substrate into a cleaning space of another cleaning unit that is adjacent can be prevented.

Specifically, the blocking unit may include a casing disposed to surround the substrate and providing an independent cleaning processing space and a shutter straightly moving in a vertical direction and opening and closing the inlet of the casing.

Preferably, the casing may include a lower stepped part disposed under the inlet of the casing, an upper stepped part disposed over the inlet of the casing, and a side inclination stepped part obliquely disposed at a side of the inlet of the casing, which are disposed at an outer surface of the casing. A shutter may include an extension stepped part formed on an inner surface of an upper portion thereof and making contact with a top surface of the upper stepped part. The shutter may have an undersurface of a lower portion thereof making contact with a top surface of the lower stepped part; and the shutter may have a side surface thereof making contact with the side inclination stepped part.

Thus, by forming a multi-sealing structure which is bent along the circumferential surface of each stepped part, the sealing performance of each cleaning space of the plurality of cleaning units can be increased, and fumes can be more effectively prevented from being leaked to the outside during the cleaning.

Also, since a packing member is provided to seal a gap between the casing and the shutter of the cleaning unit, each cleaning space of the plurality of cleaning units can be more effectively sealed.

The packing member may include an upper packing part disposed between the extension stepped part and the upper stepped part, a lower packing part disposed between the undersurface of a lower portion of the shutter, and a side packing part disposed the side surface of the shutter and the side inclination stepped part.

Thus, a multi-sealing structure may be formed around the inlet using the stepped parts. Also, a gap between the casing and the shutter can be sealed by the packing member. Accordingly, the sealing performance of each cleaning space of the plurality of cleaning units can be increased, and fumes can be more effectively prevented from being leaked through a gap between the casing and the shutter during the cleaning.

Meanwhile, the substrate processing system may include a buffer module that is disposed in at least one of the polishing part and the cleaning part and allows the substrate to be located therein and stand by until the next process.

There may inevitably occurs a time deviation between the time taken for the polishing process and the pre-cleaning process in the polishing part and the time taken for the main cleaning process of a substrate in the cleaning part. When the substrates are held in equipment such as the carrier head, the delay of the process time may be incurred as much as the deviation of the process time. According to this embodiment, the substrates can be located in the buffer module until the substrates can be introduced into the next process.

Thus, since a component that performs the treatment process while holding the substrate can perform a new process while locating the substrate at the buffer module during a time when the treatment process is not performed, the treatment process of the substrate can be continuously performed, thereby improving the processing efficiency.

Here, the drying of the substrate may be prevented by supplying a liquid to the substrate locate at the buffer module and thus maintaining the wetted state of the substrate. Thus, foreign substances remaining on the polishing surface of the substrate during the polishing process can be prevented from being stuck to the polishing surface and damage due to an occurrence of a watermark according to the drying of the substrate can be prevented.

Above all, the buffer module may include a first buffer module prepared in the polishing part so as to receive the substrate having undergone the polishing process in the polishing part when the pre-cleaning process is being performed on the substrate in the pre-cleaning region.

Accordingly, the substrate may be located in the first buffer module when the substrate having undergone the polishing process cannot be immediately pre-cleaned in the pre-cleaning region. Thus, the carrier head that performs the polishing process while gripping the substrate and moving can continuously perform the polishing process without a break by being immediately supplied with a new substrate. Thus, the polishing process can be continuously performed in the polishing part, thereby improving the process efficiency.

Here, the first buffer module may include a plurality of cradles to receive a plurality of substrates, which are placed on the plurality of cradles.

In this case, the polishing part may be configured to perform the polishing process on a polishing surface plate when the carrier head moves while gripping the substrate, and the first buffer module may be disposed between the path through the carrier head moves and the pre-cleaning region. Thus, a moving distance for placing the substrate from the carrier head in the first buffer module can be shortened.

Also, the first buffer module may be configured to be movable between the moving path of the carrier head and the pre-cleaning region, and thus may move to a lower side of the carrier head gripping the substrate having undergone the polishing process.

Thus, as the substrate is directly received and placed from the carrier head, the moving path of the carrier head can be shortened.

Particularly, the cradles may be configured to circulate in a component of upward and downward directions, and thus the first buffer module may receive a substrate from the carrier head when one of the circulating cradles is located at an upper side thereof to allow the substrate to be piled up therein. Thus, the process of seating the substrate on the first buffer module from the carrier head can be efficiently performed in a short time without an additional moving distance and time.

Thus, as disclosed in Korean Patent Application No. 2014-173576 filed by the present applicant, when various polishing processes are performed in a single layout, the treatment efficiency may become more significant. For this, the contents disclosed in Korean Patent Application No. 2014-173576 filed by the present applicant may be incorporated in this disclosure. That is, since the feeding cycle of the substrate having undergone the polishing process in the polishing part and transferred by the carrier head varies according to the conditions of the polishing process, the treatment process of a substrate can be continuously performed without a break even on a substrate having undergone the polishing process at a non-uniform time interval in the polishing part.

On the other hand, in the pre-cleaning region, the substrate having undergone the polishing process may be unloaded to undergo the pre-cleaning, or the pre-cleaning may be performed on the substrate that stands by in the buffer module.

For cleaning of the substrate, after foreign substances remaining on the substrate are preliminarily pre-cleaned in the pre-cleaning region to which the substrate is unloaded, a main cleaning process may be performed on the substrate in the cleaning part. Thus, foreign substances remaining on the surface can be effectively removed, and the cleaning efficiency of the substrate can be improved.

Particularly, foreign substances remaining on the substrate prior to the cleaning process can be minimized without a reduction of the process efficiency, by performing pre-cleaning on the substrate in the pre-cleaning region which is prepared in the polishing part and to which the substrate is unloaded, without a change or addition of the layout of existing equipment.

In other words, before the substrate having undergone the polishing process is transferred to undergo the main cleaning process, the substrate may be transferred to a separate cleaning region to be pre-cleaned, and then may be again transferred to the cleaning part. In this case, however, since the substrate needs to go through a complicate transfer process in which the substrate unloaded to the unloading region needs to be transferred to the separate cleaning region and then needs to be again transferred to the cleaning part, the whole processing efficiency of the substrate may be reduced. Also, in order to additionally prepare a separate cleaning region, since the layout of existing equipment needs to be changed or added, the space utilization may be reduced, and the cost may increase for the change of equipment. However, a process sequence in which the substrate having finished the polishing process is unloaded to the pre-cleaning region and then is transferred to the cleaning part may be maintained without a change, and foreign substances remaining on the substrate may be preliminarily pre-cleaned in the pre-cleaning region. Thus, without a change or addition of the layout of existing equipment, foreign substances remaining on the substrate can be minimized without a reduction of the process efficiency before a main cleaning process is performed.

Furthermore, since foreign substances remaining on the substrate while not adhering to the substrate can be maximally removed through the pre-cleaning process performed in the pre-cleaning region prior to the cleaning process, the cleaning effect by the main cleaning process can be improved, and the cleaning efficiency may also be improved.

Also, when the cleaning process is being performed on the substrate in a first cleaning unit that is one of the plurality of cleaning units, the buffer module may further include a cleaning buffer module prepared in the cleaning part so as to receive the substrate to be supplied to the first cleaning unit. Thus, the cleaning unit that has undergone the treatment process may not hold a substrate as much as the cleaning time deviation of the plurality of cleaning units, and the substrates having the cleaning process in each cleaning unit may be located at the cleaning buffer module B2. Also, the cleaning process can be continuously performed without a break in each cleaning unit.

Particularly, the stacked cleaning units may include a contact-type cleaning unit stacked in one footprint region in a vertical direction; and a non-contact-type cleaning unit stacked in another footprint region in a vertical direction. Usually, a deviation may occur between the treatment times taken for the cleaning in the contact-type cleaning unit and the non-contact-type cleaning unit.

Accordingly, the cleaning buffer module may be disposed between the non-contact-type cleaning unit and the contact-type cleaning unit. Also, according to another embodiment, the cleaning buffer module may also be disposed between the respective cleaning units, and may also be movably installed similarly to the first buffer module. Also, the cleaning buffer module may be stackedly disposed in a footprint region that one of the non-contact-type cleaning unit and the contact-type cleaning unit occupies, thereby allowing the substrates to be piled up without occupying a separate area.

In addition, the cleaning buffer module may include a plurality of cradles to accommodate a plurality of substrates, which are placed on the plurality of cradles.

For reference, the pre-cleaning of the substrate may mean a cleaning process that is first performed on the substrate having undergone the polishing process, and may be construed as a cleaning process of preliminarily removing foreign substances existing on the surface of the substrate prior to a cleaning process by the cleaning part.

In addition, the cleaning by the cleaning part may be construed as a main cleaning process for removing foreign substances remaining on the surface of the substrate after the pre-cleaning process.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE INVENTION

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Hereinafter, it will be described about an exemplary embodiment of the present invention in conjunction with the accompanying drawings.

Figure 1:
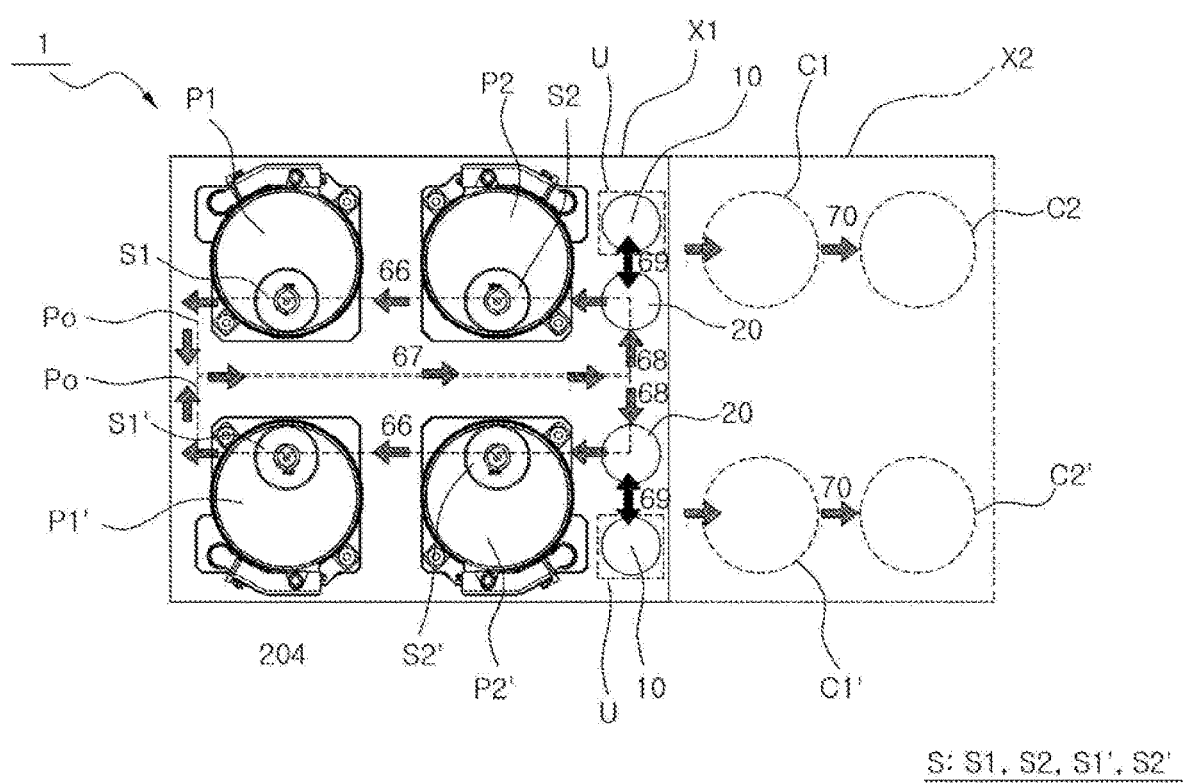
FIG. 1 is a view illustrating a configuration of a typical chemical mechanical polishing machine.
Figure 2:
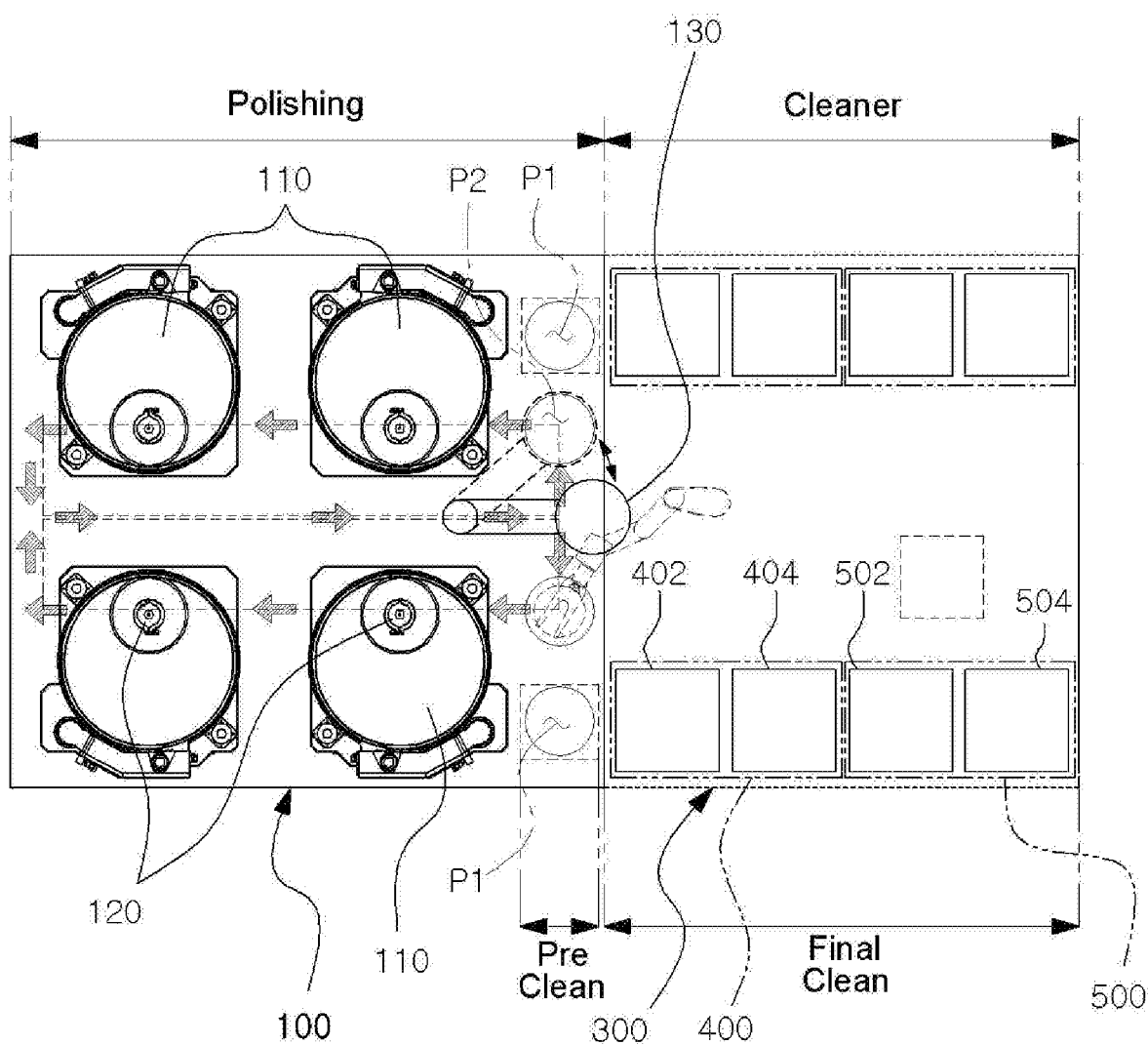
FIG. 2 is a view illustrating a substrate processing system according to an embodiment of the present invention.

Referring to FIG. 2, a substrate processing system 1 according to an embodiment may include a polishing part 100 for performing a Chemical Mechanical Polishing (CMP) process on a substrate, a pre-cleaning region P1 which is prepared in the polishing part 100 and in which pre-cleaning is performed on a substrate 10 having undergone the CMP process, and a cleaning part 300 for cleaning the substrate 10 pre-cleaned in the pre-cleaning region P1.

The polishing part 100 may be provided in various structures by which the chemical mechanical polishing process can be performed, and the present invention is not limited by the structure and layout of the polishing part 100.

A plurality of polishing surface plates 110 may be provided in the polishing part 100, and a polishing pad may be attached to the top surface of each polishing surface plate 110. The substrate 10 supplied to a loading unit provided in the region of the polishing part 100 may make rotational contact with the upper surface of the polishing pad supplied with slurry while adhering closely to a carrier head 120 moving along a predetermined path, and thus the chemical mechanical polishing process may be performed.

The carrier head 120 may move along a predetermined circulation path on the region of the polishing part 100. The substrate (hereinafter, referred to as a substrate supplied to a loading position of the substrate) 10 supplied to the loading unit may be transferred by the carrier head 120 while adhering closely to the carrier head 120. Hereinafter, a configuration in which the carrier head 120 moves along the circulation path of a substantially rectangular shape from the loading unit via the polishing surface plate 110 will be described with reference to the accompanying drawings.

Also, the polishing part 100 may include a transfer unit that transfers the substrate 10, entering a loading region of the polishing part 100, to the polishing surface plate 110, and a cleaning unit 130 that cleans a loading surface of the transfer unit before the transfer unit loads the substrate 10 from the loading region.

The carrier head 120 may be used as a transfer unit. The cleaning unit 130 may beforehand clean the loading surface before the carrier head 120 loads the substrate 10. Thus, prior to polishing, the substrate 10 may be prevented from being damaged or contaminated by foreign substances remaining on the loading surface (undersurface) of the carrier head 120. In addition, the cleaning unit 13 may be disposed at such a location that does not interrupt the loading of the substrate 100 while the substrate 100 is being loaded to the loading region, and then may be moved to the loading region after the substrate 100 is loaded to the loading region.

The cleaning unit 130 may be provided in various structures that can clean the loading surface of the transfer unit (e. g., carrier head), and the present invention is not limited by the structure and cleaning method of the cleaning unit 130. In one embodiment, since the polishing surface of the substrate 10 is disposed to face down in the polishing part, the cleaning unit 130 may include a plurality of washing water nozzles which can upwardly spray washing water along upward and downward directions. The cleaning unit 130 may be provided so as to be rotatable about the center of the transfer unit while being disposed under the transfer unit.

Figure 3:
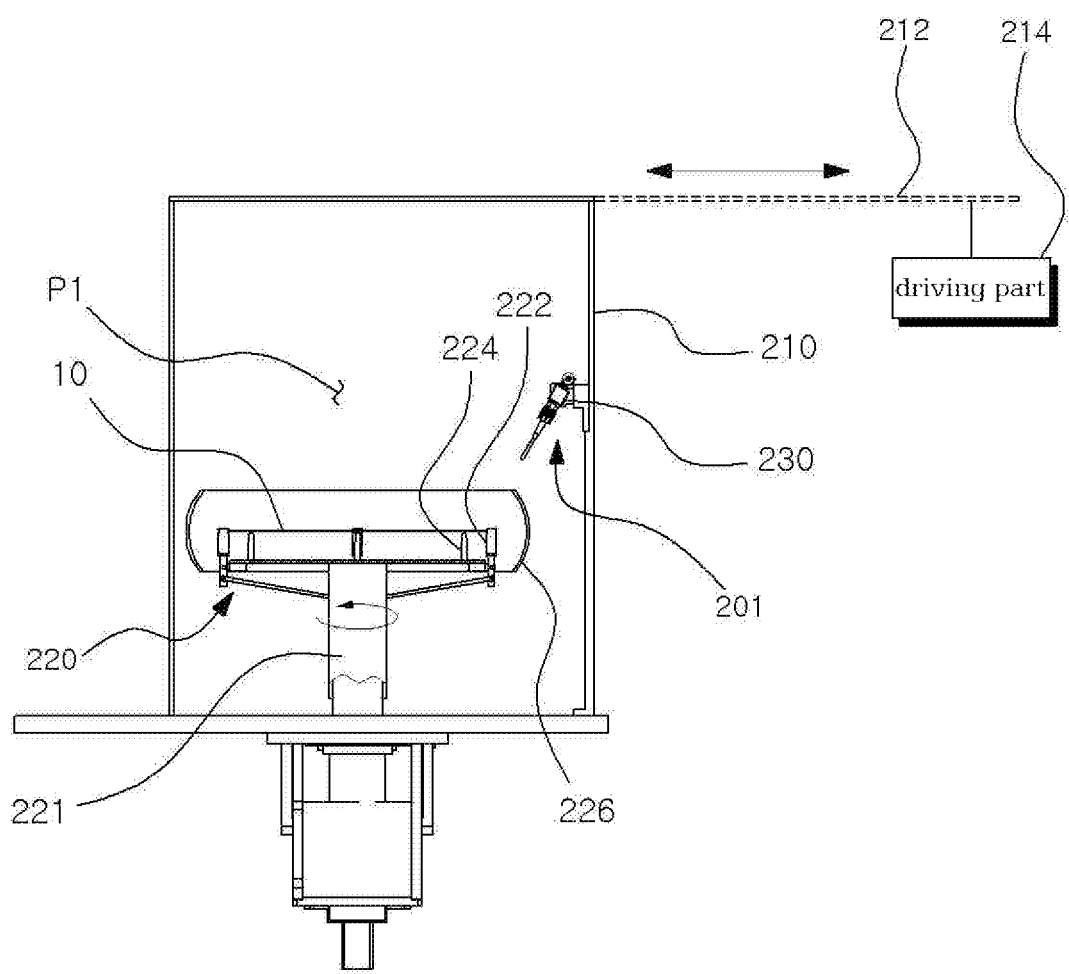
FIG. 3 is a view illustrating a substrate mounting part and a cleaning fluid spraying part in a substrate processing system according to an embodiment of the present invention.

Referring to FIGS. 2 and 3, a pre-cleaning region P1 may be disposed in the region of the polishing part 100, and the substrate 10 having undergone the polishing process may be unloaded to the pre-cleaning region P1. Also, the pre-cleaning region P1 may be provided to perform pre-cleaning on the substrate 10 that is unloaded.

For reference, the pre-cleaning of the substrate 10 set forth herein may be construed as a process for removing foreign substances existing on the surface (particularly, polishing surface of substrate) of the substrate 10 to the maximum before cleaning is performed in the cleaning part 300. Particularly, in the pre-cleaning of the substrate 10, relatively large-sized foreign substances (e. g., foreign substances having a size larger than about 100 nm) of foreign substances existing on the surface of the substrate 10 may be removed, and organic matters existing on the surface of the substrate 10 may be removed.

Thus, since the substrate 10 having undergone the polishing process is unloaded from the pre-cleaning region P1 and pre-cleaning is simultaneously performed, a separate space for the pre-cleaning need not to be additionally prepared. Accordingly, the layout of existing equipment can be almost maintained without a change or an addition, and the increase of contamination of the cleaning part 300 due to a direct entrance of the substrate 10 having undergone the polishing into the cleaning part 300 can be reduced.

Furthermore, a blocking unit may be provided to block a pre-cleaning processing space of the pre-cleaning region P1 from other spaces while pre-cleaning is being performed in the pre-cleaning region P1. Here, the pre-cleaning processing space of the pre-cleaning region P1 may be construed as a space where pre-cleaning is performed, and may be provided in a chamber structure independently sealed by the blocking unit.

The blocking unit may be provided in various structures that can provide an independent sealed space blocked from the outside. Hereinafter, a configuration in which the blocking unit includes a casing 210 disposed to surround the substrate 10 and providing an independent pre-cleaning processing space and a shutter 212 opening and closing the inlet of the casing 210 will be described with reference to the accompanying drawings.

In one embodiment, the casing 210 may be provided in a rectangular parallelepiped shape having an inlet formed at an upper end portion thereof. The shutter 212 may be configured to be moved in a straight-line by a typical driving part (e. g., combination of motor and power transmission member) 214 and thus open and close the inlet of the casing 210. According to circumstances, the inlet may be formed at a sidewall portion of the casing 210, and the shutter may open and close the inlet by moving in a vertical direction.

Furthermore, a substrate mounting part 220 may be disposed in the pre-cleaning region P1. The substrate 10 may be horizontally seated on the substrate mounting part 220, and the substrate mounting part 220 may rotate about the shaft 221 inside the casing 210.

For reference, the substrate mounting part 220 may be construed as a mounting unit from which the substrate 10 can be unloaded and on which the substrate 10 can be maintained at a disposition state while pre-cleaning is being performed.

In one embodiment, a mounting pin 224 supporting the undersurface of the substrate 10 may be disposed on the top surface of the substrate mounting part 220. A plurality of mounting pins 224 may be disposed on the upper surface of a spin jig plate (not shown) forming the substrate mounting part 220 to be spaced from each other at a certain interval. The undersurface of the substrate 10 may be placed on the upper end of the mounting pin 224. The number and the arrangement structure of the mounting pins 224 may be variously modified in accordance with the required conditions and design specifications.

Also, the substrate mounting part 220 may include an edge mounting part 222 on which the edge of the substrate 10 is placed. In one embodiment, the substrate mounting part 220 may be connected to the spin jig plate to support the edge of the substrate 10. A recessed part (not shown) for receiving and supporting the end of the outer circumference of the substrate 10 may be formed in the substrate mounting part so as to prevent the substrate 10 from shaking during the high-speed rotation. In addition, a cover member 226 may be disposed between the casing 210 and the substrate mounting part 220 to block a cleaning fluid scattered from the substrate 10. According to circumstances, the substrate mounting part may be formed into a form of simple plate without the substrate mounting part, the mounting pin, or the edge mounting part.

The pre-cleaning region in the pre-cleaning region P1 may be performed by various cleaning methods in accordance with requirements and design specifications.

In one embodiment, a cleaning fluid spraying part 201 may be provided in the pre-cleaning region P1 to perform pre-cleaning by spraying a cleaning fluid on the surface of the substrate 10.

Here, the cleaning fluid may be construed as including spraying materials such as cleaning liquid, steam, and heterogeneity fluid which are sprayed on the surface of the substrate to perform pre-cleaning, and the present invention is not limited to the type of cleaning fluid.

Figure 4:
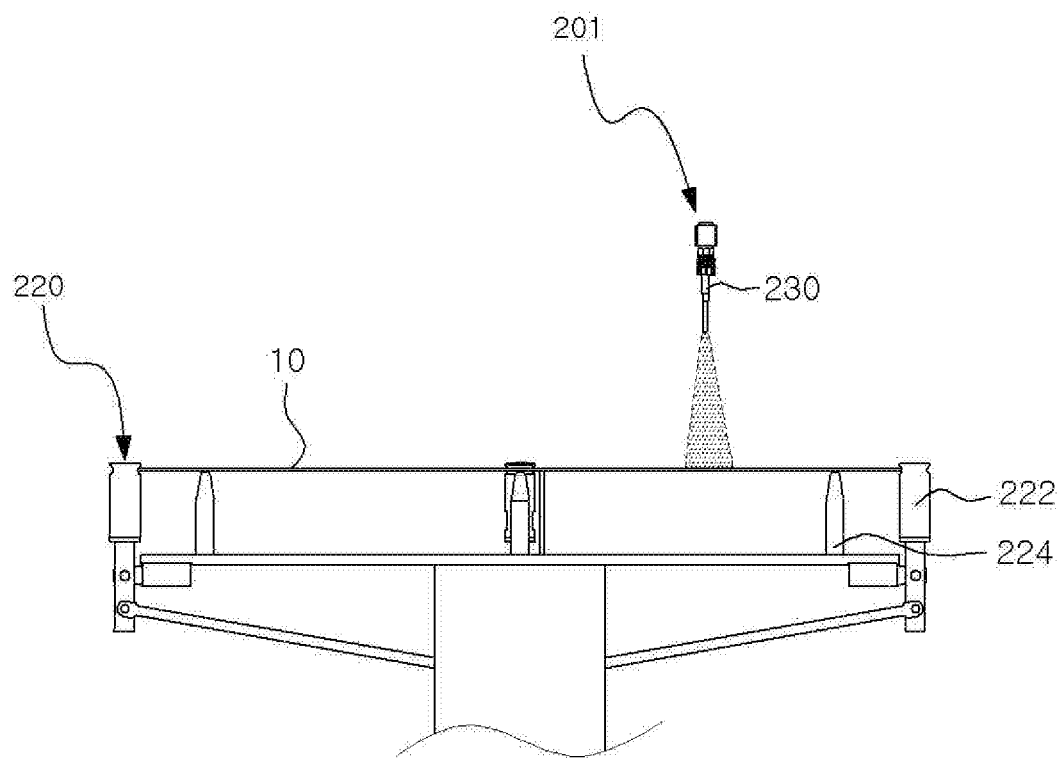
FIG. 4 is a view illustrating a cleaning liquid spraying part in a substrate processing system according to an embodiment of the present invention.

In one embodiment, referring to FIG. 4, the cleaning fluid spraying part 201 may be disposed in the pre-cleaning region P1, and may include a cleaning liquid spraying part 230 that sprays a cleaning liquid onto the surface of the substrate 10.

The cleaning liquid spraying part 230 may be configured to spray various cleaning liquids onto the surface of the substrate 10 in accordance with required conditions. In one embodiment, the cleaning liquid spraying part 230 may be configured to spray at least one of Standard Clean-1 (SC1, APM; ammonia hydroxide-hydrogen peroxide-water mixture), ammonia, sulfuric acid ($H_2SO_4$), hydrogen peroxide, and pure water (DIW). Particularly, since the pre-cleaning processing space of the pre-cleaning region P1 is independently provided as a sealed chamber structure in the present invention, a chemical such as SC1 may be used as a cleaning liquid. Also, since pre-cleaning can be performed using the chemical, a portion of organic matters existing on the surface of the substrate 10 can be removed in advance before cleaning that will be described later.

Figure 5:
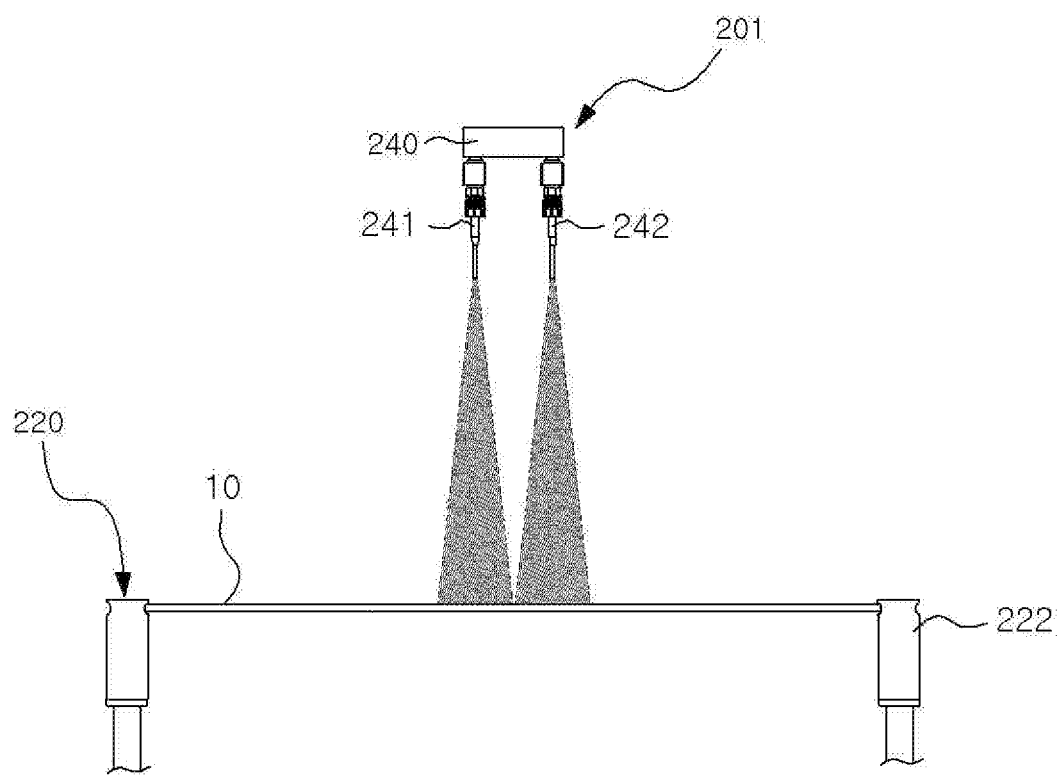
FIG. 5 is a view illustrating a heterogeneity fluid spraying part in a substrate processing system according to an embodiment of the present invention.
Figure 6:
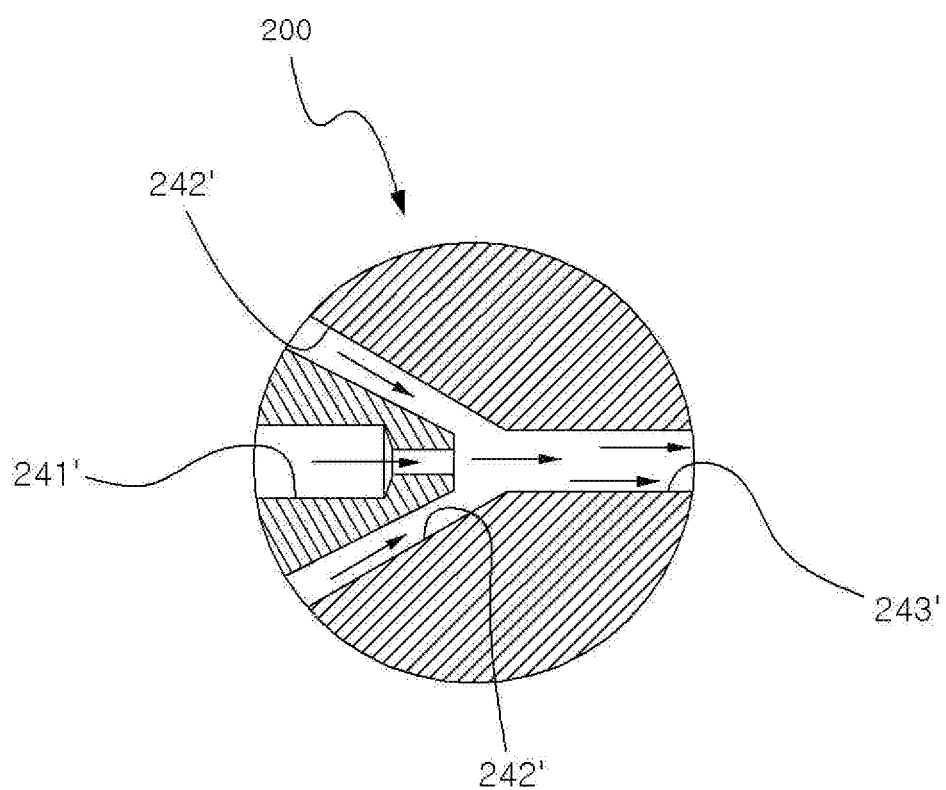
FIG. 6 is a view illustrating another exemplary heterogeneity fluid spraying part in a substrate processing system according to an embodiment of the present invention.

Referring to FIGS. 5 and 6, the cleaning fluid spraying part 201 may be disposed in the pre-cleaning region P1, and may include a heterogeneity fluid spraying part 240 that sprays different heterogeneity fluids onto the surface of the substrate 10.

The heterogeneity fluid spraying part 240 may be provided in various structures that can spray heterogeneity fluids. In one embodiment, the heterogeneity fluid spraying part 240 may include a first fluid supply unit 241 supplying a first fluid and a second fluid supply unit 242 supplying a second fluid different from the first fluid. The first fluid and the second fluid may be sprayed onto the surface of the substrate 10 by a spray member such as a typical nozzle while being mixed with each other or being separated from each other.

In one embodiment, referring to FIG. 5, the heterogeneity fluid spraying part 240 may include a first fluid spraying nozzle 241 and a second fluid spraying nozzle 242 which are separately disposed. The first fluid spraying nozzle 241 and the second fluid spraying nozzle 242 may independently spray the first fluid and the second fluid onto the surface of the substrate 10, respectively.

In another embodiment of the heterogeneity fluid spraying part 240, referring to FIG. 6, the heterogeneity fluid spraying part 240 may include a first fluid passage 241' for supplying the first fluid, a second fluid passage 242' for supplying the second fluid, and a mixture spray passage 243' from which the first fluid and the second fluid are fixed and sprayed. The first fluid and the second fluid may be sprayed at a high speed onto the surface of the substrate 10 while being mixed with each other in the mixture spray passage 243'.

The types and characteristics of the heterogeneity fluids that can be sprayed from the heterogeneity fluid spraying part 240 may be variously modified in accordance with the required conditions and design specifications. In one embodiment, the first fluid may be any one of gases and liquids, and the second fluid may be any one of gases and liquids. For example, the heterogeneity fluid spraying part 240 may be configured to spray both of pure water (DIW) that is a liquid and nitrogen ($N_2$) that is a gas, so as to increase the foreign substances removal efficiency. According to circumstances, two different types of liquids or two different types of gases may be used as long as the hitting force and the foreign substance removal efficiency by the heterogeneity fluids can be secured.

Also, cleaning liquids and/or heterogeneity fluids which are sprayed from the cleaning liquid spraying part 230 and the heterogeneity fluid spraying part 240 may be sprayed at a high pressure so as to hit foreign substances existing on the surface of the substrate 10 with a sufficient hitting force.

Figure 7:
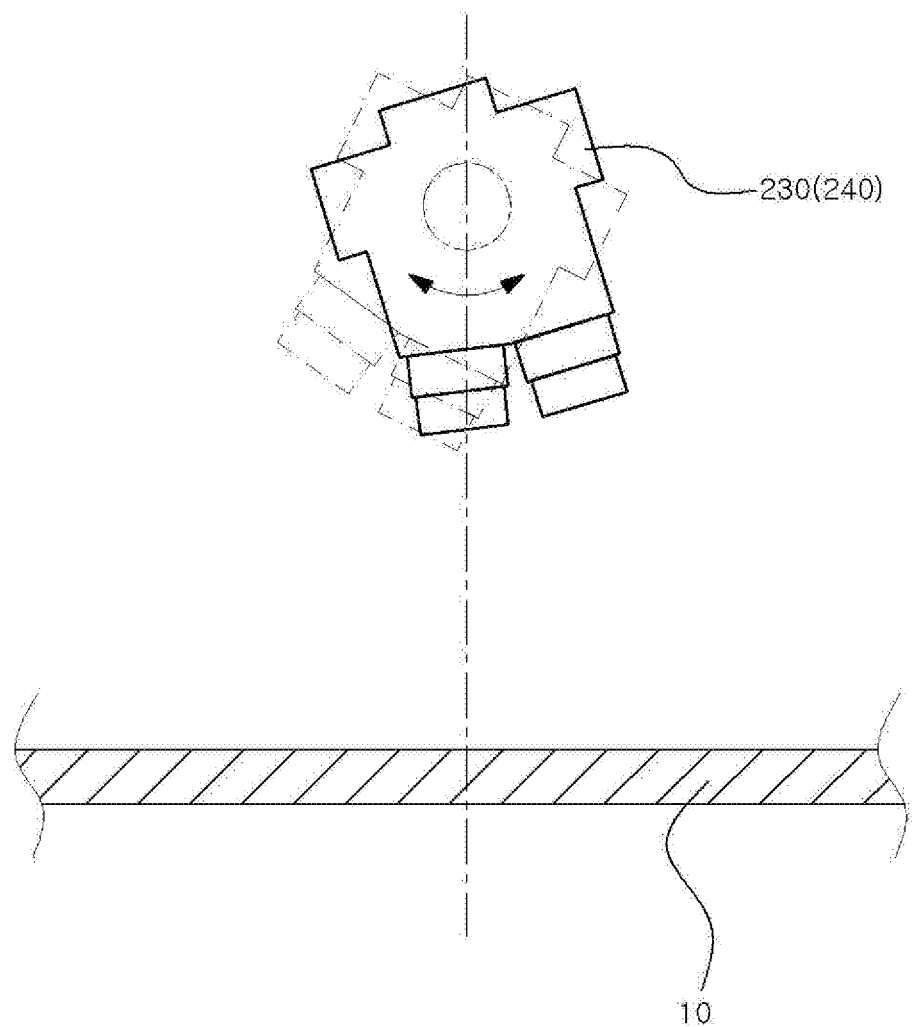
FIG. 7 is a view illustrating an oscillation function of a heterogeneity fluid spraying part in a substrate processing system according to an embodiment of the present invention.

In addition, referring to FIG. 7, at least one of the cleaning liquid spraying part 230 and the heterogeneity fluid spraying part 240 may be disposed to oscillate with respect to the surface of the substrate 10, and thus cleaning liquids and/or heterogeneity fluids may be oscillation-sprayed onto the surface of the substrate 10.

At least one of the cleaning liquid spraying part 230 and the heterogeneity fluid spraying part 240 may be provided so as to be oscillatable in various methods in accordance with the required conditions and design specification. Hereinafter, a configuration in which cleaning liquids and/or heterogeneity fluids can be oscillation-sprayed onto the surface of the substrate 10 by swing the cleaning liquid spraying part 230 and the heterogeneity fluid spraying part 240 will be described. This structure can maximize the cleaning efficiency by cleaning liquids and/or heterogeneity fluids, and can reduce the amount of cleaning liquids and/or heterogeneity fluids used, by allowing cleaning liquids and/or heterogeneity fluids to be oscillation-sprayed onto the surface of the substrate 10. Also, this method may have an effect of separating foreign substances from the surface of the substrate 10 by a cleaning power (including hitting force) by cleaning liquids and/or heterogeneity fluids and sweeping and discharging separated foreign substances out of the substrate 10.

Figure 8:
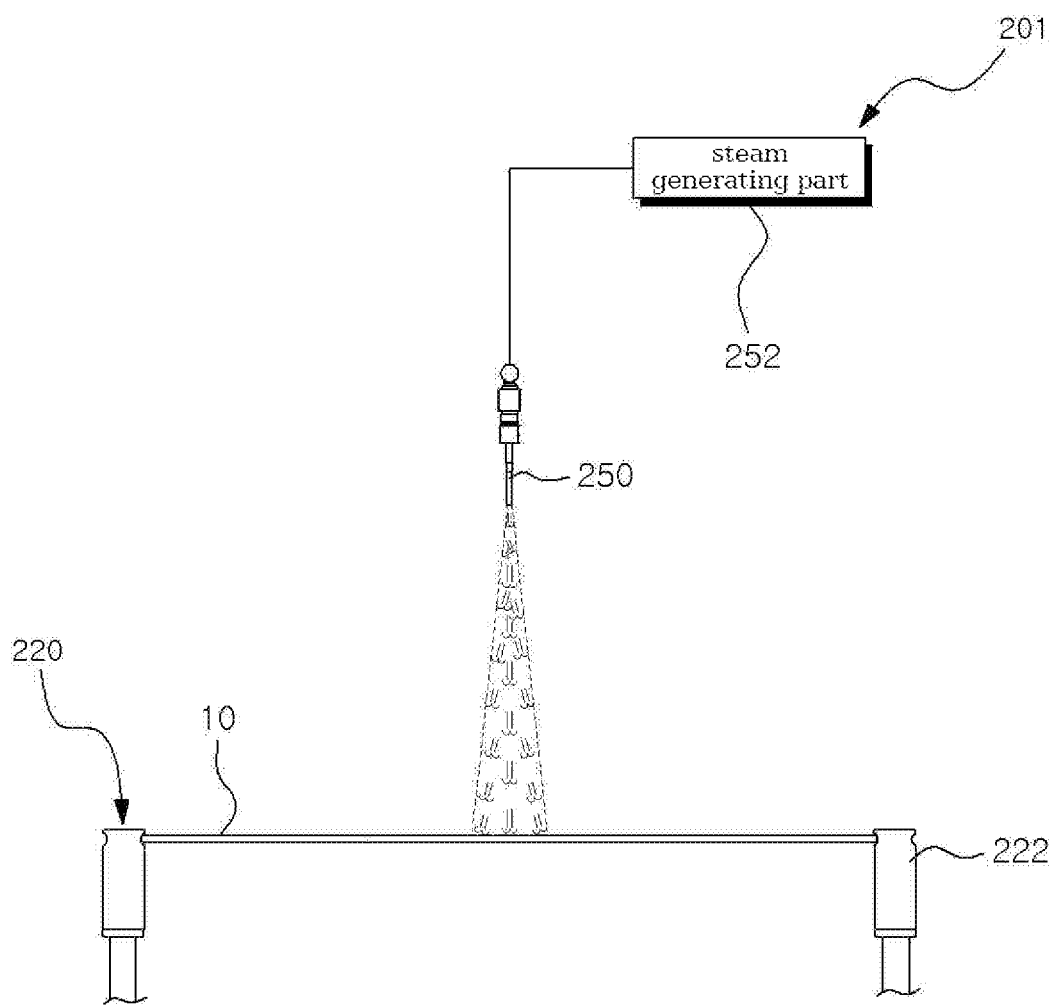
FIG. 8 is a view illustrating a steam spraying part in a substrate processing system according to an embodiment of the present invention.

Also, referring to FIG. 8, the cleaning fluid spraying part 201 may be disposed in the pre-cleaning region P1, and may include a steam spraying part 250 that sprays a steam generated from a steam generating part 252 onto the surface of the substrate 10.

Particularly, the steam sprayed from the steam spraying part 250 may be effective to remove organic matters existing on the surface of the substrate 10. For reference, the steam spraying part 250 may be configured to spray steam at a temperature capable of preventing damage of the substrate 10 while securing the organic matter removal efficiency by steam. The steam spraying part 250 may spray steam at a temperature of about 60 degrees to about 120 degrees.

Similarly to the cleaning liquid spraying part 230 and the heterogeneity fluid spraying part 240, the steam spraying part 250 may also be provided so as to oscillate with respect to the surface of the substrate 10, and thus may oscillation-spray steam onto the surface of the substrate 10. (see FIG. 7)

Figure 9:
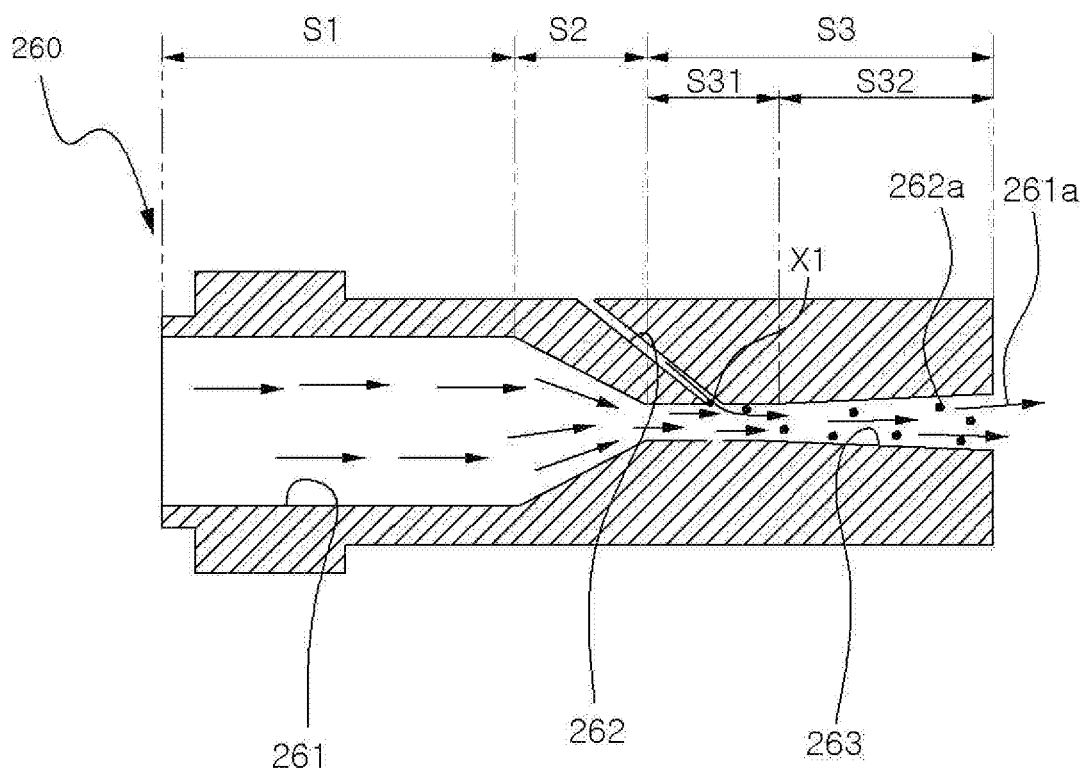
FIGS. 9 and 10 are views illustrating still another exemplary heterogeneity fluid spraying part in a substrate processing system according to an embodiment of the present invention.
Figure 10:
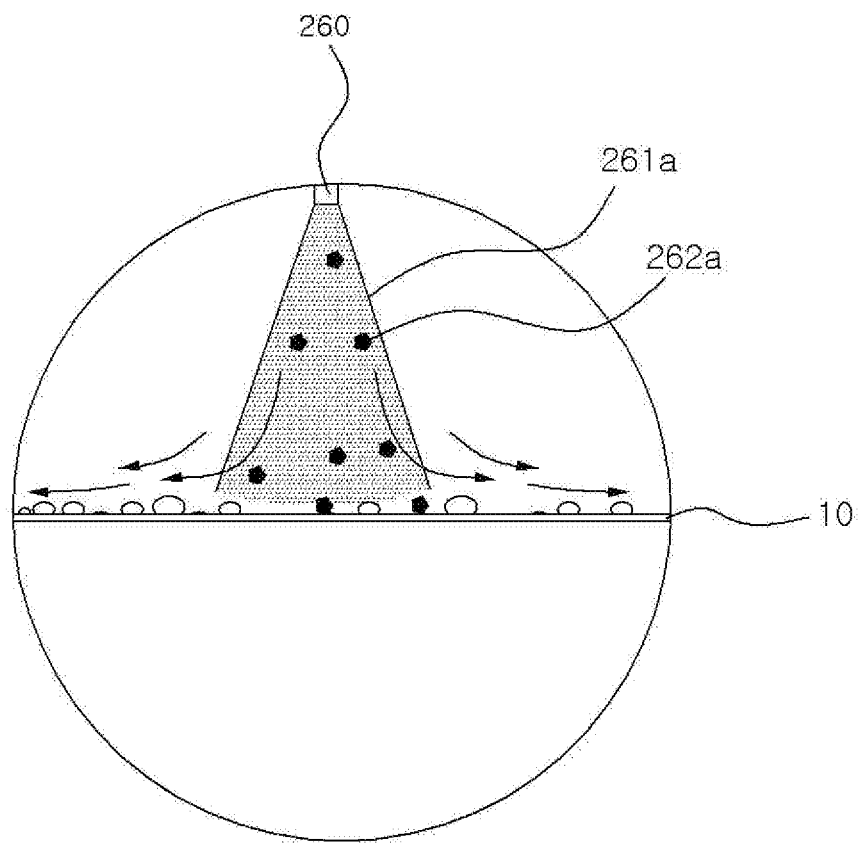

Referring to FIGS. 9 and 10, the cleaning fluid spraying part 201 may be disposed in the pre-cleaning region P1, and may include a heterogeneity fluid spraying part 260 that sprays different heterogeneity fluids onto the surface of the substrate 10. The heterogeneity fluid spraying part 260 may include a dry ice supply unit that supplies dry ice particles, and a fluid spraying unit that vertically sprays a fluid onto the surface of the substrate 10.

The fluid spraying unit may be configured to spray various fluids in accordance with the required conditions and design specifications. In one embodiment, the fluid spraying unit may be configured to spray at least one of gases and liquids. Hereinafter, a configuration in which the heterogeneity fluid spraying part sprays a gas 261a together with dry ice particles will be described. According to circumstances, the heterogeneity fluid spraying part may also be configured to spray a liquid (e. g., DIW) together with dry ice particles.

The fluid spraying unit may be provided in various structures that can mix and spray dry ice particles 262a and a fluid. In one embodiment, the fluid spraying unit may include a gas supply passage 261 through which a gas is supplied, a dry ice supply passage 262 through which dry ice particles are supplied, and a mixture discharge passage 263 through which the gas 261a and the dry ice particles 262a are mixed and sprayed.

Hereinafter, a configuration in which carbon dioxide of liquid state supplied through the dry ice supply passage 262 is solidified into dry ice particles while passing through the mixture discharge passage 263 will be described.

For this, the gas supply passage 261 may include a first constant sectional region S1 in which the sectional area thereof is constant along the flow direction of the gas 261a, a decreasing sectional region S2 in which the sectional area thereof gradually decreases along the flow direction of the gas 261a, and a second constant sectional region S31 in which the sectional area thereof is constant along the flow direction of the gas 261a.

Accordingly, the gas 261a may be stabilized in flow while passing the first constant sectional region S1, and may gradually decrease in pressure and thus increase in flow velocity of the gas while passing the decreasing sectional region S2. Also, the gas 261a may be stabilized in flow while passing a portion of the second constant sectional region S31. In this case, as an outlet of a branched passage (supply passage of dry ice) is formed at a first point spaced by a certain distance from a point where the second constant sectional region S31 starts, a compressed gas supplied through the gas supply passage 261 may become faster in flow velocity while passing the decreasing sectional region S2, and may become stabilized in flow while starting to pass the second constant sectional region S31.

In this state, when carbon dioxide of high-pressure and liquid state flows to a first location X1 of the second constant sectional region through the branched passage (dry ice supply passage) and reaches the second constant sectional region S31 of relatively low pressure, carbon dioxide of liquid state may be solidified into dry ice particles due to a rapid reduction of pressure.

Meanwhile, the gas supply unit may be configured to at least one of inert gases such as air, nitrogen gas, argon gas through the gas supply passage 261. When an inert gas is supplied through the gas supply passage 261, a chemical reaction may be inhibited on the substrate 10, and thus the cleaning effect can be increased.

The branched passage may form an acute angle with the gas supply passage through which a gas is supplied along a center line of a straight-line while having the same directional component as the flow direction of a gas flowing in the gas supply passage 261. Thus, carbon dioxide of liquid state introduced through the branched passage may smoothly flow into the first location X1 of the end of the gas supply passage 261.

In one embodiment, carbon dioxide of liquid state may be supplied through the branched passage (dry ice supply passage) from a high-pressure tank of about 40 bar to about 60 bar. The pressure of carbon dioxide of liquid state which is injected into the branched passage may also be maintained high. Thus, at the moment that carbon dioxide of liquid state supplied through the branched passage flows into the gas supply passage 261, the pressure of carbon dioxide of high-pressure state may be lowered, and thus carbon dioxide of liquid state may be solidified into dry ice of solid state.

Furthermore, since carbon dioxide of liquid state instead of solid state is supplied through the branched passage and thus carbon dioxide of liquid state is solidified into fine dry ice particles when reaching the gas supply passage 261 of low pressure, the dry ice particles may be uniformly mixed with a gas flowing in the gas supply passage 261 while passing the discharge passage together with the gas.

The section of the branched passage may be formed smaller than the section of the gas supply passage 261, and the size of dry ice particles solidified at the first location X1 may be adjusted by the size of the section of the branched passage. For example, the diameter of dry ice particles may range from about 100 μm to about 2,000 μm.

The mixture discharge passage 263 may be aligned with the gas supply passage 261 in a straight line, and at the first location X1 communicating with the branched passage, dry ice particles solidified from carbon dioxide of liquid state supplied through the branched passage may be mixed with the gas to form an injection mixture. The injection mixture may move toward and be discharged out of a discharge port by a flow pressure of the gas and carbon dioxide which are supplied from the gas supply passage 261 and the branched passage, respectively.

In this case, a discharge region S3 through which the injection mixture is discharged may include the second constant sectional region S31 in which the section thereof is maintained constant along the flow direction, and an expanding sectional region S32 in which the section thereof gradually expands along the flow direction. Accordingly, fine dry ice particles may pass the discharge region S3 while uniformly dispersing in the gas that stably flows at the first location X1 of the second constant sectional region S31. Accordingly, the injection mixture discharged out of the discharge port may include the gas and the fine dry ice solid particles which are uniformly mixed with each other therein.

Particularly, since the temperature of the gas is lowered while the gas having a fast flow velocity at the decreasing sectional region S2 expands passing through the expanding sectional area S32, the temperature of the injection mixture that is discharged can be lowered. Accordingly, since the substrate 10 is cooled by the injection mixture hitting on the surface of the substrate 10, fine particles (foreign substance particles) separated from the substrate 10 and floating around the substrate 10 during the cleaning of the substrate 10 can be prevented from re-adhering to the substrate 10 due to the thermo-phoresis effect.

Thus, the heterogeneity fluid spraying part 240 that sprays dry ice and a fluid may allow sludge adhered onto the surface of the substrate 10 having undergone the chemical mechanical polishing process to be more quickly and cleanly removed. Also, the heterogeneity fluid spraying part 240 may shorten the brush cleaning process time described later, and may reduce the amount of chemicals for removing foreign substances on the surface of the substrate 10.

In this embodiment, although carbon dioxide of liquid state is described as being solidified into dry ice particles to be supplied, according to circumstances, already-solidified dry ice particles may also be supplied through the dry ice supply passage 262. Also, the heterogeneity fluid spraying part 240 that sprays dry ice and a fluid may be configured to have a discharge port of a slit shape having a long length.

Also, the heterogeneity fluid spraying part 260 that sprays both dry ice and fluid may also be provided so as to oscillate with respect to the surface of the substrate 10, and thus may oscillation-spray the dry ice and the fluid onto the surface of the substrate 10. (see FIG. 7)

In this embodiment, although the heterogeneity fluid spraying part that sprays dry ice and a fluid is described as including the gas supply passage, the branched passage, and the discharge passage, according to circumstances, cleaning liquid or chemicals may be sprayed at a high speed by a structure equal or similar to the heterogeneity fluid spraying part including the gas supply passage, the branched passage, and the discharge passage.

Also, the spray structure equal or similar to the heterogeneity fluid spraying part that sprays dry ice and a fluid may be applied to a heterogeneity fluid spraying part that sprays a gas and a liquid (or two types of gases or two types of liquids). For example, the heterogeneity fluid spraying part that sprays a gas and a liquid may be configured to include a gas supply passage (see 261 of FIG. 9) and a liquid supply passage (see 262 of FIG. 9). The gas supply passage 261 may include a decreasing sectional region in which the section area thereof gradually decreases along the flow direction of a gas to increase the flow velocity of a gas, and a third region formed from the decreasing sectional region to the discharge port. The liquid supply passage 262 may allow the liquid to flow into the gas supply passage at the first location adjacent the discharge port.

Figure 11:
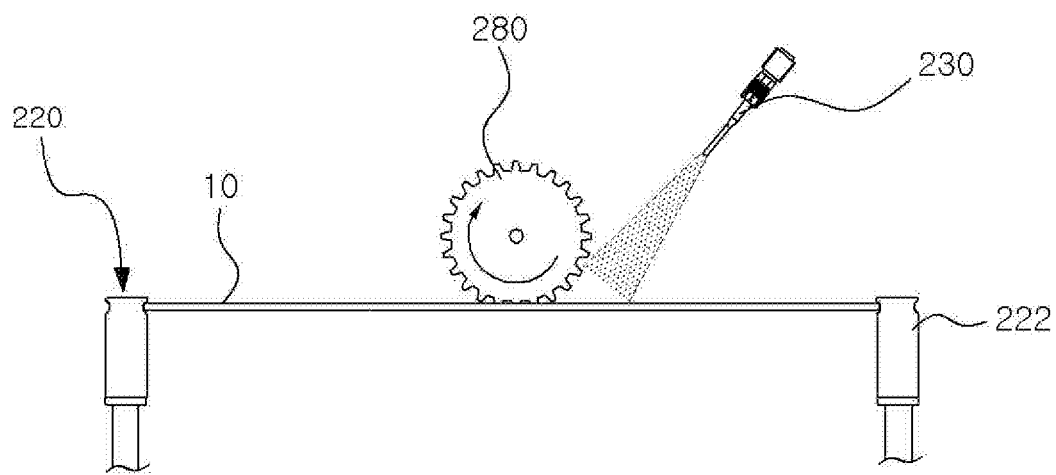
FIG. 11 is a view illustrating a cleaning brush in a substrate processing system according to an embodiment of the present invention.

Referring to FIG. 11, a cleaning brush 280 may be disposed in the pre-cleaning region P1. The cleaning brush 280 may make rotational contact with the surface of the substrate 10.

The cleaning brush 280 may be a brush formed of a typical material (e. g., porous polyvinyl alcohol) that can make fictional contact with the surface of the substrate 10. In addition, a plurality of cleaning protrusions may be formed on the surface of the cleaning brush 280 to improve the contact characteristics of the brush. According to circumstances, a brush without the cleaning protrusion may also be used.

Also, a chemical supply part 230 may be provided to supply a chemical to a contact place between the cleaning brush 280 and the substrate 10 while the cleaning brush 280 is contacting the substrate 10, so as to increase the cleaning effect by the frictional contact between the cleaning brush 280 and the substrate 10 while cleaning is being performed by the cleaning brush 280.

The chemical supply part 230 may be configured to spray a chemical to at least one of the substrate 10 and the cleaning brush 280. The types and characteristics of chemicals sprayed to the cleaning brush 280 may be variously modified in accordance with the required conditions and the design specifications. In order to increase the removal efficiency of fine organic matters, chemicals sprayed to the cleaning brush 280 may include at least one of SC1 (APM) and hydrofluoric acid (HF). According to circumstances, pure water (or other cleaning liquid) instead of a chemical may be sprayed to the contact place between the cleaning brush 280 and the substrate 10, or both chemical and pure water may be together sprayed.

Figure 12:
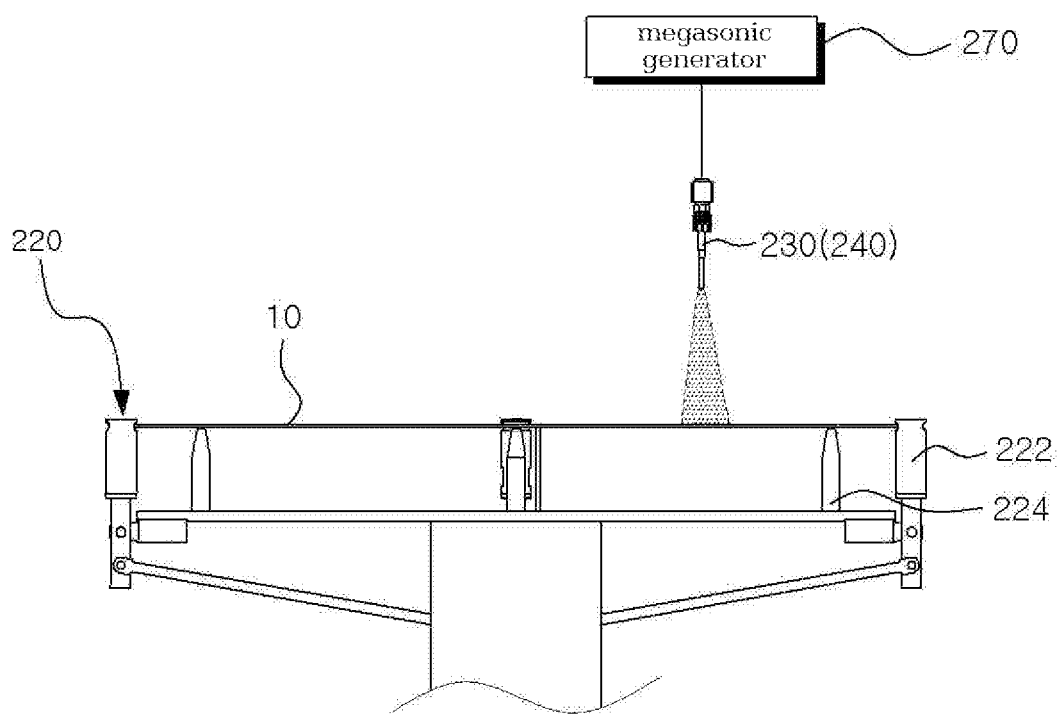
FIG. 12 is a view illustrating a megasonic generator in a substrate processing system according to an embodiment of the present invention.

Referring to FIG. 12, a megasonic generator 270 may be disposed in the pre-cleaning region P1. The megasonic generator 270 may supply vibration energy to the surface of the substrate 10.

The megasonic generator 270 may supply vibration energy (e. g., high-frequency vibration energy or low-frequency vibration energy) to the surface of the substrate 10 by various methods in accordance with the required conditions and the design specifications. Hereinafter, a configuration in which the megasonic generator 270 effectively separates foreign substances existing on the surface of the substrate by vibrating the surface of the substrate 10 by means of a cleaning liquid or a chemical sprayed onto the surface of the substrate 10 through the cleaning liquid spraying part 230 will be described. According to circumstances, the megasonic generator 270 may also be configured to directly supply vibration energy to the substrate 10.

Also, since sizes of particles (foreign substances) that are removed may vary with the frequency band of vibration, the megasonic generator 270 may selectively vary the frequency band in accordance with the size of a particle. This frequency band change method may overcome a limitation that when there are bubbles in a trench or a contact hole formed in the surface of the substrate, ultrasonic vibration is not delivered to the surface of the substrate 10 due to bubbles. Also, the frequency band change method may provide a cleaning liquid to which ultrasonic vibration is uniformly applied, to the surface of the substrate 10.

Meanwhile, the substrate 10 that is pre-cleaned in the pre-cleaning region P1 may be transferred to the cleaning part 300 described later, by a typical transfer arm (not shown). The transfer arm may be disposed to reciprocate between the pre-cleaning region P1 and the cleaning part (e. g., contact-type cleaning unit described later), and thus may be used to transfer the pre-cleaned substrate 10 to the cleaning part 300. For reference, while different substrates 10 are being simultaneously cleaned in the pre-cleaning region P1 and the cleaning part 300, respectively, the transfer arm may temporarily stand by on an avoidance region provided between the pre-cleaning region P1 and the cleaning part 300.

Referring again to FIG. 2, the cleaning part 300 may be adjacently disposed at a side portion of the polishing part 100, and may be provided to remove foreign substances remaining on the surface of the substrate 10 pre-cleaned in the pre-cleaning region P1.

For reference, the cleaning of the substrate 10 performed in the cleaning part 300 may be construed as a process for removing foreign substances remaining on the surface (particularly, non-polishing surface of substrate is also cleanable) of the substrate 10 to the maximum after the pre-cleaning is performed. Particularly, in the cleaning of the substrate 10, relatively small-sized foreign substances (e. g., foreign substances having a size ranging from about 40 nm to about 100 nm) and relatively strongly adhesive foreign substances of foreign substances existing on the surface of the substrate 10 may be removed.

In addition, the substrate 10 cleaned in the cleaning part 300 may be configured to go through a predetermined next process as a non-cleaning state. Here, the performing of the next process as the 'non-cleaning state' may be construed as that all cleaning processes for the substrate 10 are completed by finishing the cleaning process in the cleaning part 300, and thus the phrase of 'non-cleaning state' is used hereinafter as the state in which the substrate does not experience additional cleaning process any more. The substrate 10 having undergone the cleaning process may go through a next process (e. g., deposition process) without an additional cleaning process.

The cleaning part 300 may be provided in a structure capable of performing various stages of cleaning and drying processes, and the present invention is not limited by the structure and layout of a cleaning station constituting the cleaning part 300.

The cleaning part 300 may include a contact-type cleaning unit 400 and a non-contact-type cleaning unit 500. The contact-type cleaning unit 400 may make contact with the surface of the substrate 10 so as to effectively remove organic matters and other foreign substances remaining on the surface of the substrate 10 and may perform cleaning. The non-contact-type cleaning unit may not make contact with the surface of the substrate 10 and may perform cleaning. According to circumstances, the cleaning part 300 may be configured to include only one of the contact-type cleaning unit and the non-contact-type cleaning unit.

The contact-type cleaning unit 400 may make physical contact with the surface of the substrate 10, and may be provided in various structures that can perform cleaning. Hereinafter, a configuration in which the contact-type cleaning unit 400 includes a first contact-type cleaning unit 402 and a second contact-type cleaning unit 404 will be described.

Figure 13:
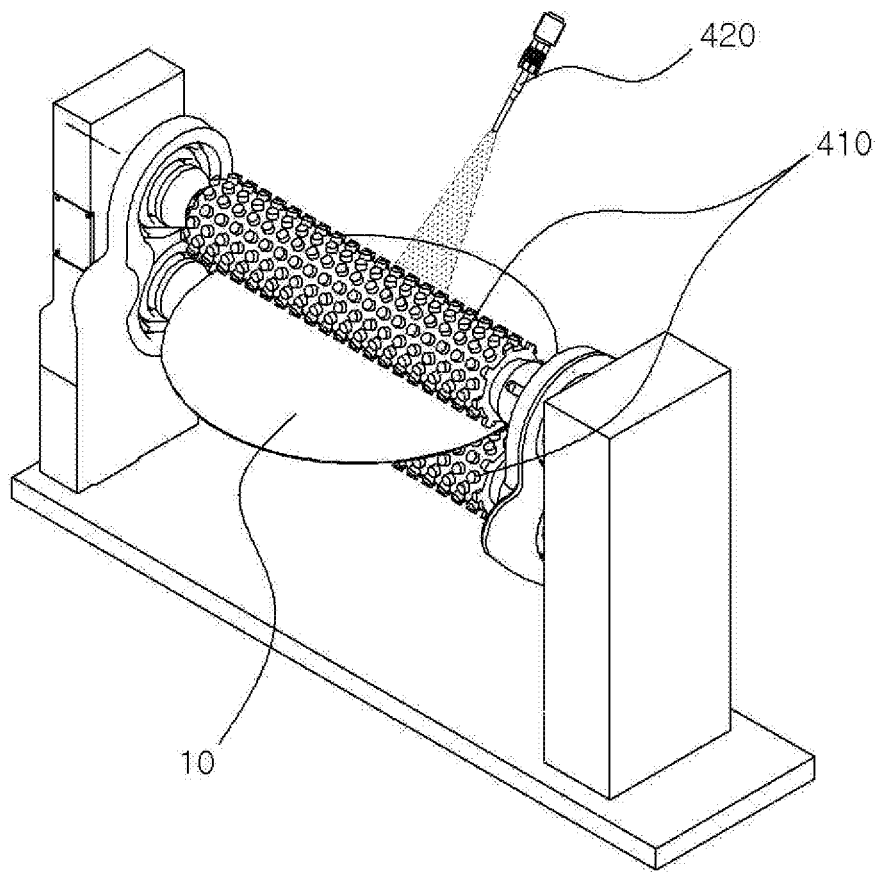
FIG. 13 is a view illustrating a first cleaning brush of a contact-type cleaning unit in a substrate processing system according to an embodiment of the present invention.

Referring to FIG. 13, the first contact-type cleaning unit 402 may include a first cleaning brush 410 that makes rotational contact with the surface of the substrate 10.

In one embodiment, the pre-cleaned substrate 10 may be cleaned by a pair of first cleaning brushes 410 that are rotated by a typical spindle (not shown). According to circumstances, the substrate 10 may be cleaned by the first cleaning brush 410 while being fixed without rotating. Alternatively, only one first cleaning brush 410 may clean only one surface (e. g., polishing surface) of the substrate 10.

The first cleaning brush 410 may be a brush formed of a typical material (e. g., porous polyvinyl alcohol) that can make fictional contact with the surface of the substrate 10. In addition, a plurality of cleaning protrusions may be formed on the surface of the first cleaning brush 410 to improve the contact characteristics of the brush. According to circumstances, a brush without the cleaning protrusion may also be used.

Also, a first chemical supply part 420 may be provided to supply a chemical to a contact place between the first cleaning brush 410 and the substrate 10 while the first cleaning brush 410 is contacting the substrate 10, so as to increase the cleaning effect by the frictional contact between the first cleaning brush 410 and the substrate 10 while cleaning is being performed by the first cleaning brush 410.

The chemical supply part 420 may be configured to spray a chemical to at least one of the substrate 10 and the first cleaning brush 410. The types and characteristics of chemicals sprayed to the first cleaning brush 410 may be variously modified in accordance with the required conditions and the design specifications. In order to increase the removal efficiency of fine organic matters, chemicals sprayed to the first cleaning brush 410 may include at least one of SC1 (APM) and hydrofluoric acid (HF). According to circumstances, pure water instead of a chemical may be sprayed to the contact place between the first cleaning brush and the substrate, or both chemical and pure water may be together sprayed.

Meanwhile, when foreign substances that are separated from the substrate 10 by the frictional contact cleaning of the first cleaning brush 410 adhere to the first cleaning brush 410, the substrate 10 may be again contaminated or reduced in cleaning efficiency. Also, the substrate 10 may be damaged by foreign substances adhering to the first cleaning brush 410.

In order to overcome this limitation, a foreign substance removing part 430 may be provided to remove foreign substances adhering to the surface of the first cleaning brush 410.

The foreign substance removing part 430 may be provided in various structures that can clean foreign substances adhering to the surface of the first cleaning brush 410, and the present invention is not limited by the structure and cleaning method of the foreign substance removing part 430.

Figure 14:
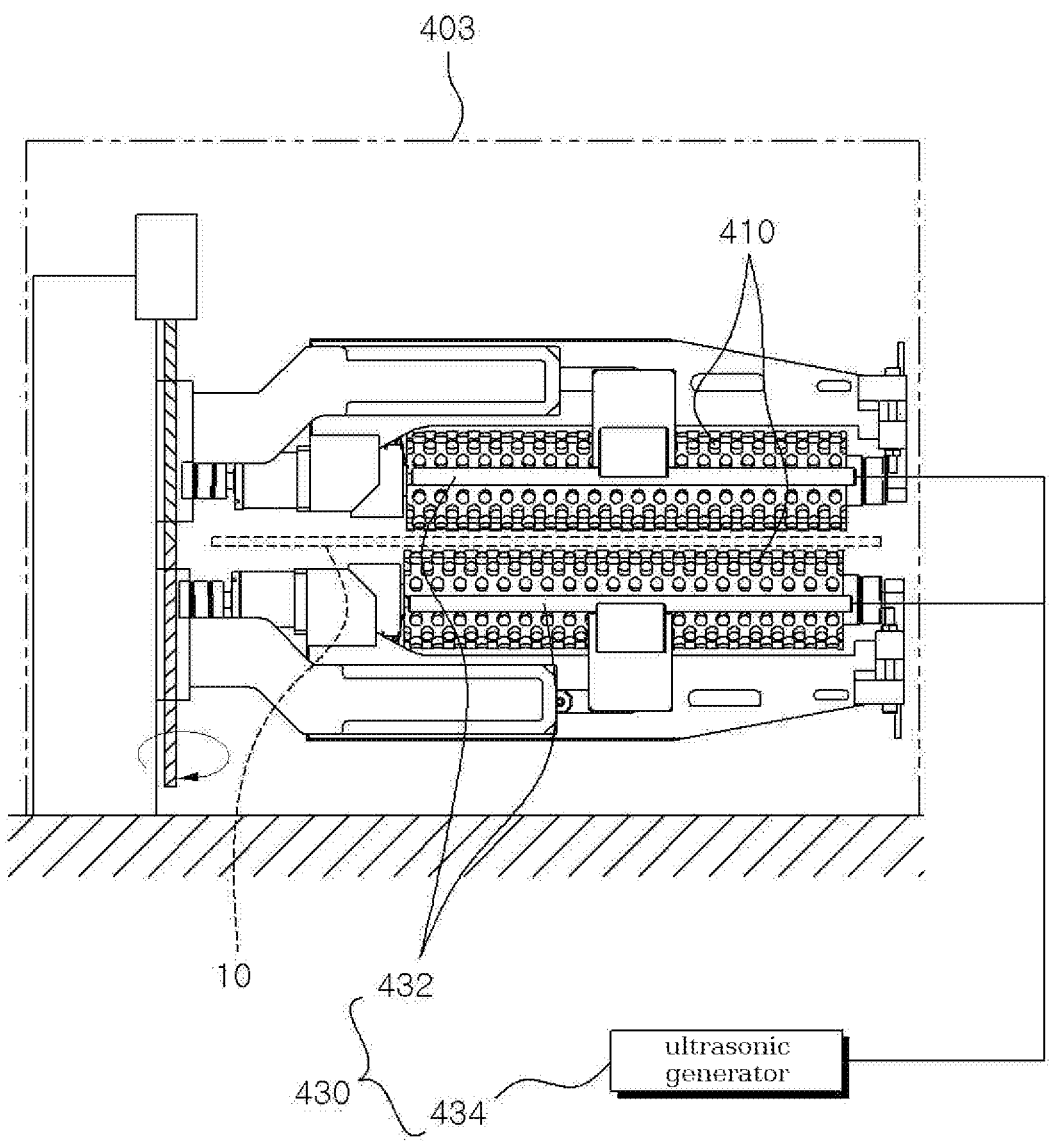
FIGS. 14 and 15 are views illustrating a foreign substance removing part of a contact-type cleaning unit in a substrate processing system according to an embodiment of the present invention.

In one embodiment, referring to FIG. 14, the foreign substance removing part 430 may include a contact member 432 and a ultrasonic generator 434. The contact member 432 may be provided so as to contact the outer surface of the first cleaning brush 410. The ultrasonic generator 434 may apply an ultrasonic wave to the contact member 432.

The contact member 432 may be provided in various structures and forms which can make contact with the outer surface of the first cleaning brush 410. In one embodiment, the contact member 432 may be formed into a bar or rod shape having a length corresponding to the length of the first cleaning brush 410. According to circumstances, the contact member may have a section of an arc shape, or may have contact protrusions formed on the surface thereof.

The ultrasonic generator 434 may apply an ultrasonic wave to the contact member 432 to supply vibration energy to the surface of the contact member 432. The ultrasonic generator 434 may be a typical ultrasonic wave generating unit that can generate an ultrasonic wave.

The surface of the contact member 432 may be vibrated by the ultrasonic generator 434. Accordingly, foreign substances separated from the substrate 10 by the first cleaning brush 410 may not adhere to the surface of the first cleaning brush 410, and may be separated from the surface of the first cleaning brush 410 as the contact member 432 that vibrates may contact. According to circumstances, foreign substances separated from the first cleaning brush by the contact member may be collected by a separate collection container or a suctioning unit.

Figure 15:
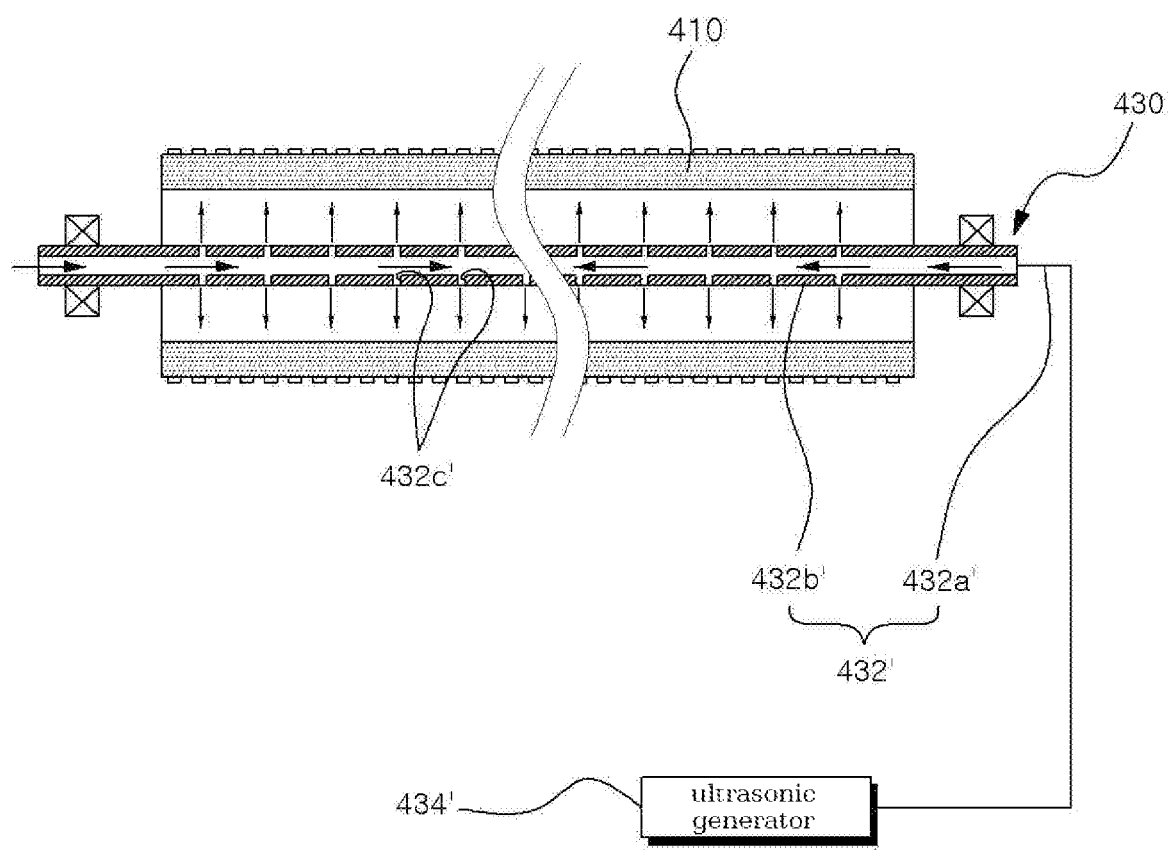

In another embodiment, referring to FIG. 15, the foreign substance removing part 430 may include a fluid spraying unit 432' and an ultrasonic generator 434'. The fluid spraying unit 432' may spray a liquid toward the outside from the inside of the first cleaning brush 410. The ultrasonic generator 434' may apply an ultrasonic wave to the liquid sprayed from the fluid spraying unit 432'.

The fluid spraying unit 432' may be provided in various structures and forms which can spray a liquid toward the outside from the inside of the first cleaning brush 410. In one embodiment, the fluid spraying unit 432' may include a fluid supply flow passage 432a' for supplying a liquid, and a fluid spray tube 432b' connected to the fluid supply flow passage 432a' and disposed in the first cleaning brush 410 along the longitudinal direction of the first cleaning brush 410. Also, a plurality of spray holes 432c' may be radially formed in the surface of the fluid spray tube 432b'.

A liquid supplied from the fluid supply flow passage 432a' may be transferred to the inside of the first cleaning brush 410 in an axial direction along the fluid spray tube 432b. The liquid supplied to the fluid spray tube 432b' may be sprayed through the spray holes 432c' by a supply pressure of the fluid supply flow passage 432a' and a rotation force of the first cleaning brush 410.

The ultrasonic generator 434' may be provided to apply an ultrasonic wave to the liquid sprayed from the fluid spraying unit 432'. The ultrasonic generator 434' may be a typical ultrasonic wave generating unit that can generate an ultrasonic wave.

The liquid that can be sprayed from the fluid spraying unit 432' of the foreign substance removing part 430 may be a typical fluid of a liquid state, and the types and characteristics of the liquid may be variously changed in accordance with the required conditions and design specifications. In one embodiment, the fluid spraying unit 432' of the foreign substance removing part 430 may spray pure water (DIW).

A liquid having vibration energy may be sprayed toward the outside (e. g., in a radial direction of the first cleaning brush) in the first cleaning brush 410 by the fluid spraying unit 432' and the ultrasonic generator 434'. Accordingly, foreign substances separated from the substrate 10 by the first cleaning brush 410 may not adhere to the surface of the first cleaning brush 410, and may be separated from the surface of the first cleaning brush 410 together with the liquid having vibration energy.

Figure 16:
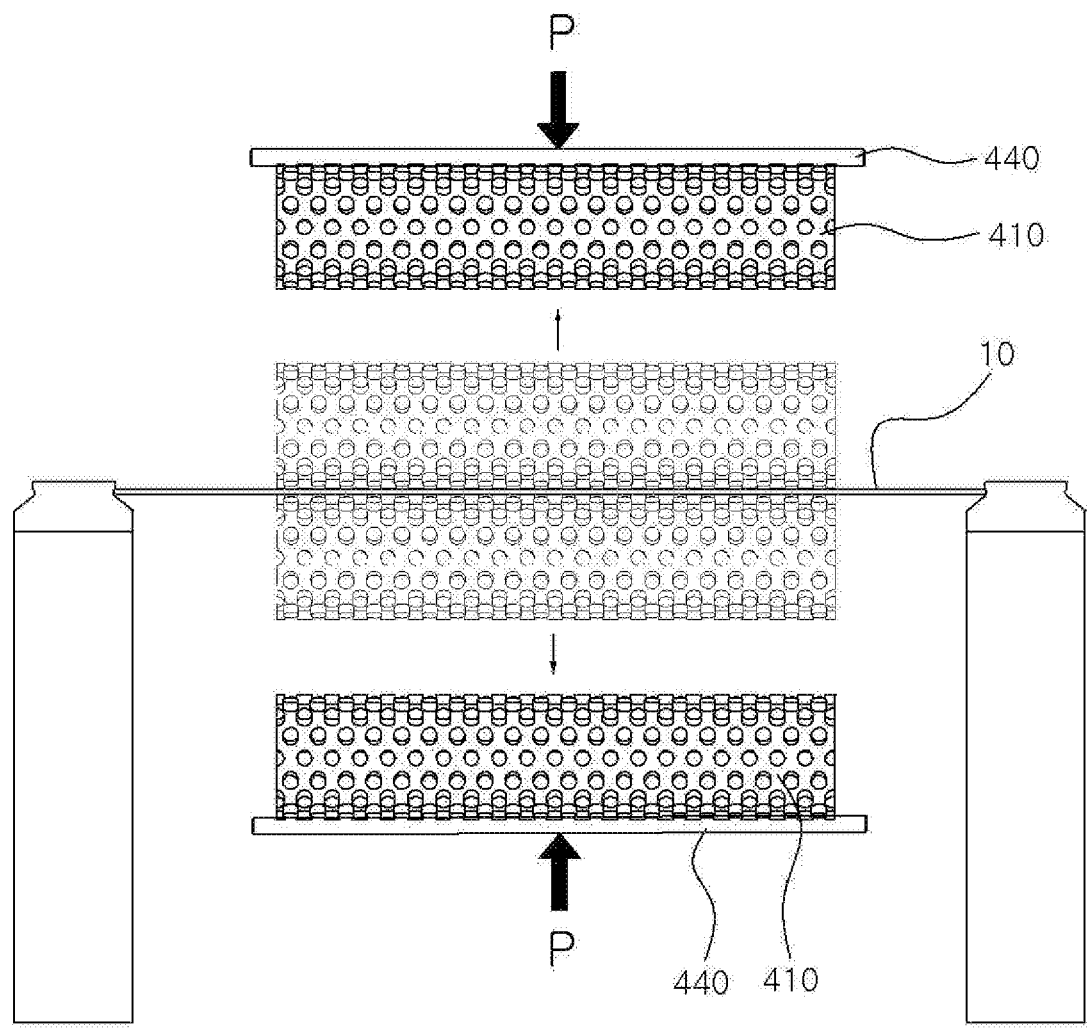
FIG. 16 is a view illustrating a pressurizing member of a contact-type cleaning unit in a substrate processing system according to an embodiment of the present invention.

Also, referring to FIG. 16, a pressurizing member 440 may be provided to pressurize the surface of the first cleaning brush 410 while the first cleaning brush 410 does not contact the substrate 10.

Here, the non-contact state of the first cleaning brush with the substrate 10 may be understood that the first cleaning brush 410 is spaced from the substrate 10 while not contacting the substrate 10. For example, the substrate 10 cleaned by the first cleaning brush 410 may be transferred to a next process, and another substrate 10 may be transferred to the cleaning region of the first cleaning brush 410. Thus, the first cleaning brush 410 may be disposed to make non-contact with the substrate while the substrate 10 is being transferred.

During the cleaning process by the first cleaning brush 410, the first cleaning brush 410 may make contact with the surface of the substrate 10, and the cleaning may be performed while the surface of the first cleaning brush 410 is pressurized (or compressed). The brush cleaning conditions such as rotation speed and frictional force of the first cleaning brush 410 may be set based on a state (pressurized state) that the first cleaning brush 410 makes contact with the substrate 10.

However, when the first cleaning brush 410 is in non-contact with the substrate 10, as a chemical or a cleaning liquid is removed from the first cleaning brush 410, the surface of the first cleaning brush 410 that is compressed may be recovered (expand closely to the original state). Thus, when another substrate 10 is cleaned in a state where the surface of the first cleaning brush 410 is recovered, a frictional force or a pressurizing force by the first cleaning brush 410 may differ. Accordingly, there is a limitation in that it is difficult to maintain a uniform cleaning effect on the substrate 10 by the first cleaning brush 410.

For this, the pressurizing member 440 may pressurize the surface of the first cleaning brush 410 when the first cleaning brush 410 is in non-contact with the substrate 10, and thus may uniformly maintain the cleaning effect by the first cleaning brush 410. The pressurizing member 440 may be configured to pressurize the surface of the first cleaning brush 410 in accordance with a section pressurized while the surface of the first cleaning brush 410 is in contact with the surface of the substrate 10. Accordingly, since the surface of the first cleaning brush 410 can be pressurized by the same conditions in both contact and non-contact states with the substrate 10, the cleaning effect of the substrate 10 by the first cleaning brush 410 can be uniformly maintained.

The pressurizing member 440 may be provided in various structures which can pressurize the surface of the first cleaning brush 410. In one embodiment, the pressurizing member 440 may be formed into a bar or rod shape having a length corresponding to the length of the first cleaning brush 410. According to circumstances, the pressurizing member may have a section of an arc shape, or may have a structure that covers the whole surface of the first cleaning brush.

Meanwhile, while the substrate 10 is being cleaned by the first cleaning brush 410, the frictional force of the first cleaning brush 410 with respect to the substrate 10 may significantly affect the cleaning effect. Accordingly, in order to uniformly maintain the cleaning effect, the frictional force of the first cleaning brush 410 with respect to the substrate 10 needs to be uniformly maintained. For this, a frictional force adjusting part 450 may be provided to adjust the frictional force of the first cleaning brush 410 with respect to the substrate 10.

The frictional force adjusting part 450 may be provided in various structures that can adjust the frictional force of the first cleaning brush 410 with respect to the substrate 10. The frictional force adjusting part 450 may be configured to adjust in real-time the frictional force of the first cleaning brush 410 with respect to the substrate 10 while the cleaning process is being performed by the first cleaning brush 410.

Figure 17:
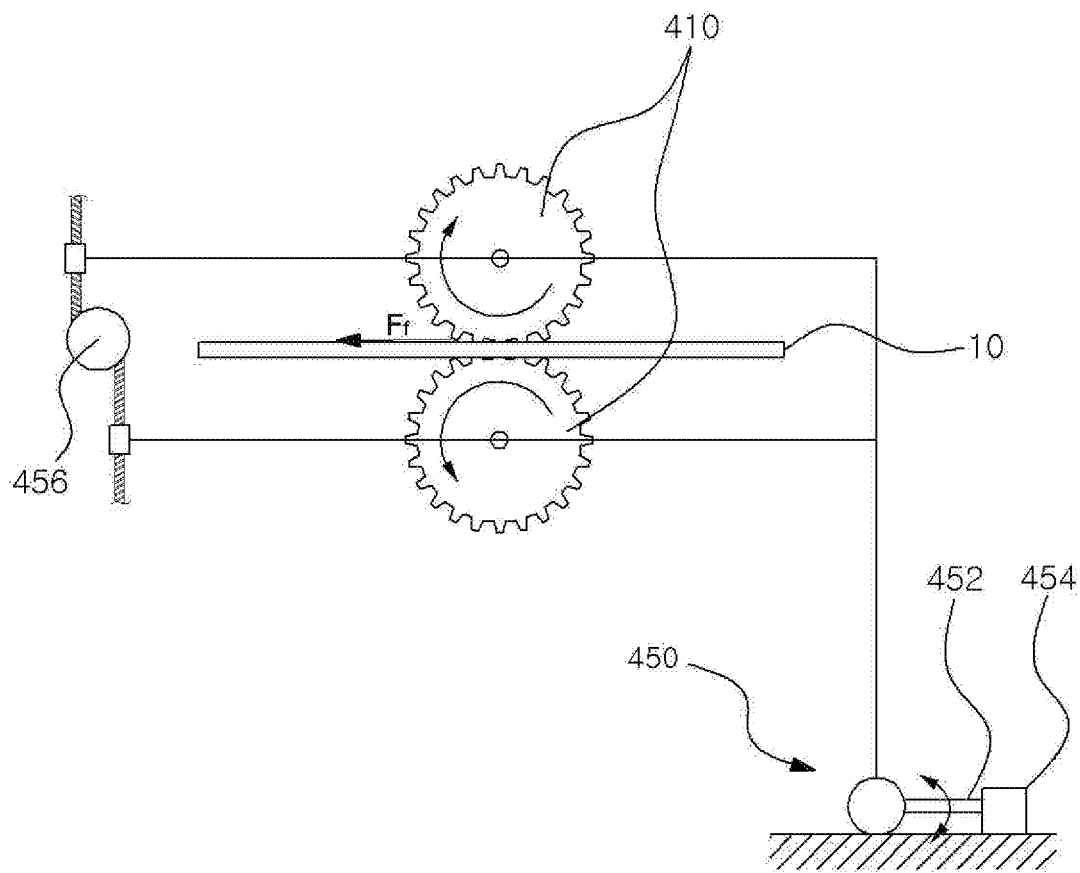
FIG. 17 is a view illustrating a frictional force adjusting part of a contact-type cleaning unit in a substrate processing system according to an embodiment of the present invention.

In one embodiment, referring to FIG. 17, the frictional force adjusting part 450 may include a connection member 452, a sensor 454, and a brush mover 456. The connection member 452 may be connected to the shaft of the first cleaning brush 410. The sensor 454 may sense the displacement of the connection member 452 according to the frictional force of the first cleaning brush 410 with respect to the substrate 10. The brush mover 456 may move the first cleaning brush 410 with respect to the substrate 10 in accordance with the results sensed by the sensor 454.

The connection member 452 may be integrally connected to the shaft of the first cleaning brush 410. When a horizontal displacement occurs on the first cleaning brush 410 in accordance with the change of the frictional force Ff of the first cleaning brush 410 with respect to the substrate 10, the same displacement may occur on the connection member 452.

The sensor 454 may be various units that can sense the displacement of the connection member 452. In one embodiment, the sensor 454 may be a typical load cell. According to circumstances, the displacement of the connection member can be sensed by other typical sensing units.

The brush mover 456 may move the first cleaning brush 410 to adjust the frictional force with respect to the substrate 10 in accordance with the results sensed by the sensor 454. For example, when the frictional force Ff of the first cleaning brush 410 with respect to the substrate 10 is larger than a predetermined condition, the brush mover 456 may move the first cleaning brush 410 away from the substrate 10. On the contrary, when the frictional force Ff of the first cleaning brush 410 with respect to the substrate 10 is smaller than the predetermined condition, the brush mover 456 may move the first cleaning brush 410 toward the substrate 10

The brush mover 456 may be provided in various structures that can move the first cleaning brush 410 away from or toward the substrate 10, and the present invention is limited by the structure and movement method of the brush mover 456. In one embodiment, the brush mover 456 may include a lead screw rotated by a driving force of a drive motor, and a guide member moving along the lead screw.

Also, while the substrate 10 is being cleaned by the first cleaning brush 410, the vertical load acting on the substrate 10 by the first cleaning brush 410 may significantly affect the cleaning effect of the substrate 10 (for example, when the vertical load increases, the frictional force increases). Accordingly, in order to uniformly maintain the cleaning effect of the substrate 10, the vertical load acting on the substrate 10 by the first cleaning brush 410 needs to be uniformly maintained. For this, a vertical load adjusting part 460 may be provided to adjust the vertical load acting on the substrate 10 by the first cleaning brush 410.

The vertical load adjusting part 460 may be provided in various structures that can adjust the vertical load acting on the substrate 10 by the first cleaning brush 410. The vertical load adjusting part 460 may be configured to adjust in real-time the vertical load acting on the substrate 10 by the first cleaning brush 410.

Figure 18:
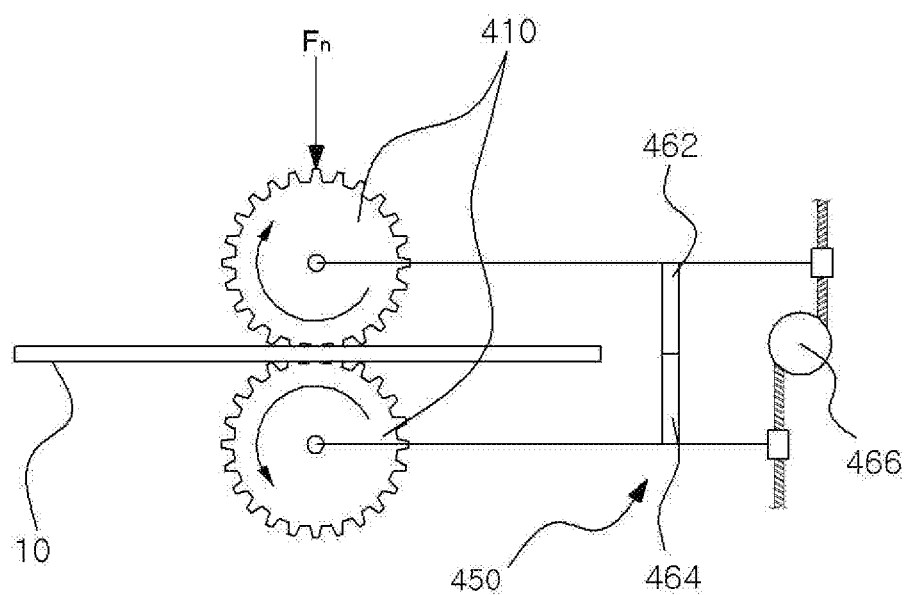
FIG. 18 is a view illustrating a vertical load adjusting part of a contact-type cleaning unit in a substrate processing system according to an embodiment of the present invention.

In one embodiment, referring to FIG. 18, the vertical load adjusting part 460 may include a vertical connection member 462, a sensor 464, and a brush mover 466. The vertical connection member 462 may be vertically connected to the shaft of the first cleaning brush 410. The sensor 464 may sense the displacement of the vertical connection member 462 according to the vertical load acting on the vertical connection member 462 by a contact of the cleaning brush and substrate 10. The brush mover 466 may move the first cleaning brush 410 with respect to the substrate 10 in accordance with the results sensed by the sensor 464.

The vertical connection member 462 may be integrally connected to the shaft of the first cleaning brush 410 so as to be vertically disposed in the gravity direction. When the first cleaning brush 410 makes contact with the substrate 10 and a vertical displacement occurs on the first cleaning brush 410 in accordance with the change of the vertical load Fn acting on the substrate 10 by the first cleaning brush 410, the same displacement may also occur on the vertical connection member 462.

The sensor 464 may be disposed on the same vertical line as the vertical connection member 462, and may sense a vertical displacement occurring on the vertical connection member 462 when the first cleaning brush 410 is in contact and non-contact with the substrate 10.

The sensor 464 may be various units that can sense a vertical displacement of the vertical connection member 462. In one embodiment, the sensor 464 may be a typical load cell. According to circumstances, the displacement of the vertical connection member can be sensed by other typical sensing units.

For example, when the first cleaning brush 410 is not in contact with the substrate, the result sensed by the sensor 464 through the vertical connection member 462 may be 'A', and when the first cleaning brush 410 makes contact with the substrate 10, the result sensed by the sensor 464 may be 'B' smaller than 'A'. In this case, the vertical load Fn acting on the substrate 10 can be calculated by a difference between 'A' and 'B'. For reference, when the first cleaning brush 410 is not in contact with (spaced from) the substrate 10, the pure load 'A' of the first cleaning brush may be sensed by the sensor 464. On the other hand, when the first cleaning brush 410 makes contact with the substrate 10, the load of the first cleaning brush 410 may be partially dispersed to the substrate 10. Accordingly, the value 'B' sensed by the sensor 464 may be smaller than the value 'A'. Accordingly, the vertical load Fn acting on the substrate 10 may be calculated by the difference between the value 'A' and the value 'B'.

The brush mover 466 may move the first cleaning brush 410 with respect to the substrate 10 in accordance with the results sensed by the sensor 464, thereby adjusting the vertical load Fn acting on the substrate 10. For example, when the vertical load Fn acting on the substrate 10 is larger than a predetermined condition, the brush mover 466 may move the first cleaning brush 410 away from the substrate 10. On the contrary, when the vertical load Fn acting on the substrate 10 is smaller than the predetermined condition, the brush mover 466 may move the first cleaning brush 410 toward the substrate 10.

The brush mover 466 may be provided in various structures that can move the first cleaning brush 410 away from or toward the substrate 10, and the present invention is limited by the structure and movement method of the brush mover 466. In one embodiment, the brush mover 466 may include a lead screw rotated by a driving force of a drive motor, and a guide member moving along the lead screw.

Figure 19:
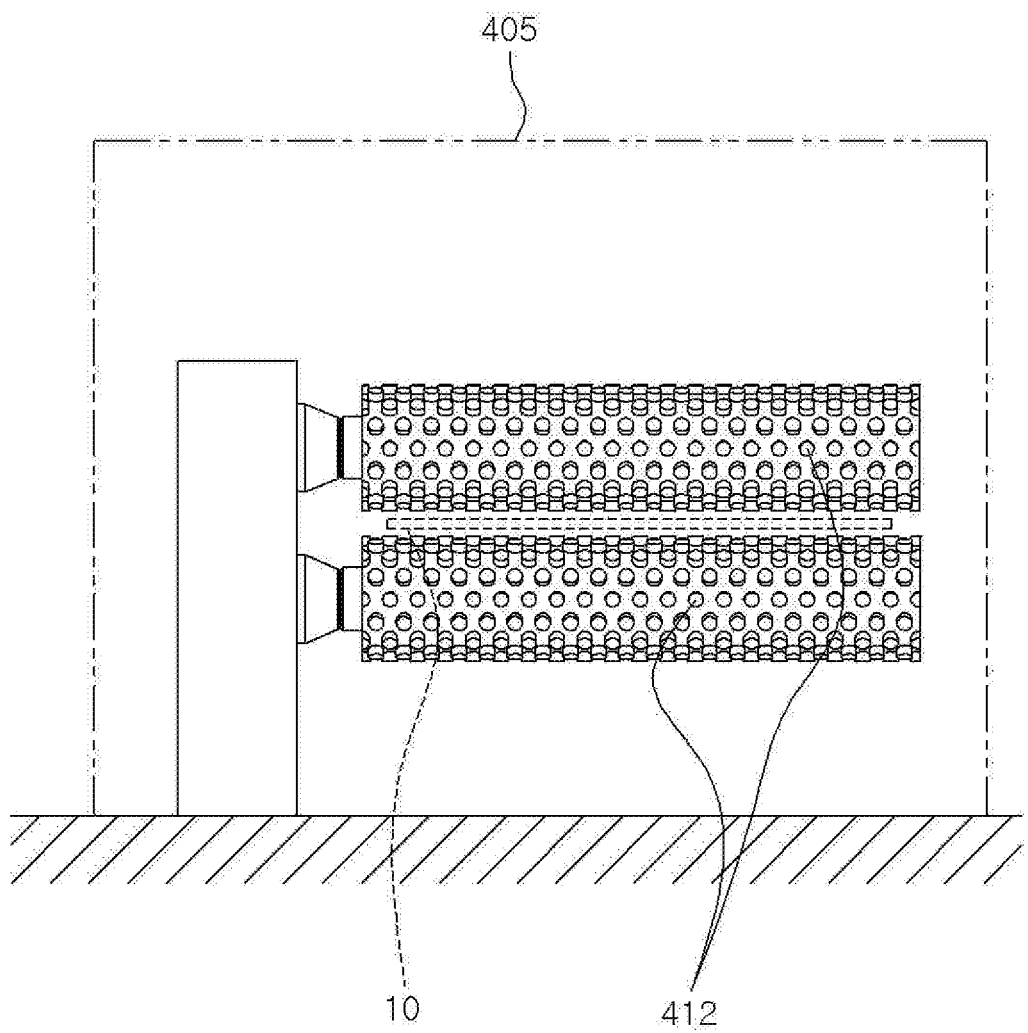
FIG. 19 is a view illustrating a second cleaning brush of a contact-type cleaning unit in a substrate processing system according to an embodiment of the present invention.

Referring to FIG. 19, the second contact-type cleaning unit 405 may include a second cleaning brush 412 that makes rotational contact with the surface of the substrate 10.

The second cleaning brush 412 may perform cleaning on the substrate 10 in the structure and method identical or similar to the first cleaning brush 410. According to circumstances, the contact-type cleaning unit may include only the first cleaning brush, excluding the second cleaning brush 412.

In addition, even when the substrate 10 is cleaned by the second cleaning brush 412, at least one of the foreign substance removing part 430, the chemical supply part 420, the pressurizing member 440, the frictional force adjusting part 450 and the vertical load adjusting part 460 may be used, and the cleaning process by the second cleaning brush 412 may be variously modified in accordance with the required conditions and the design specifications.

Figure 20:
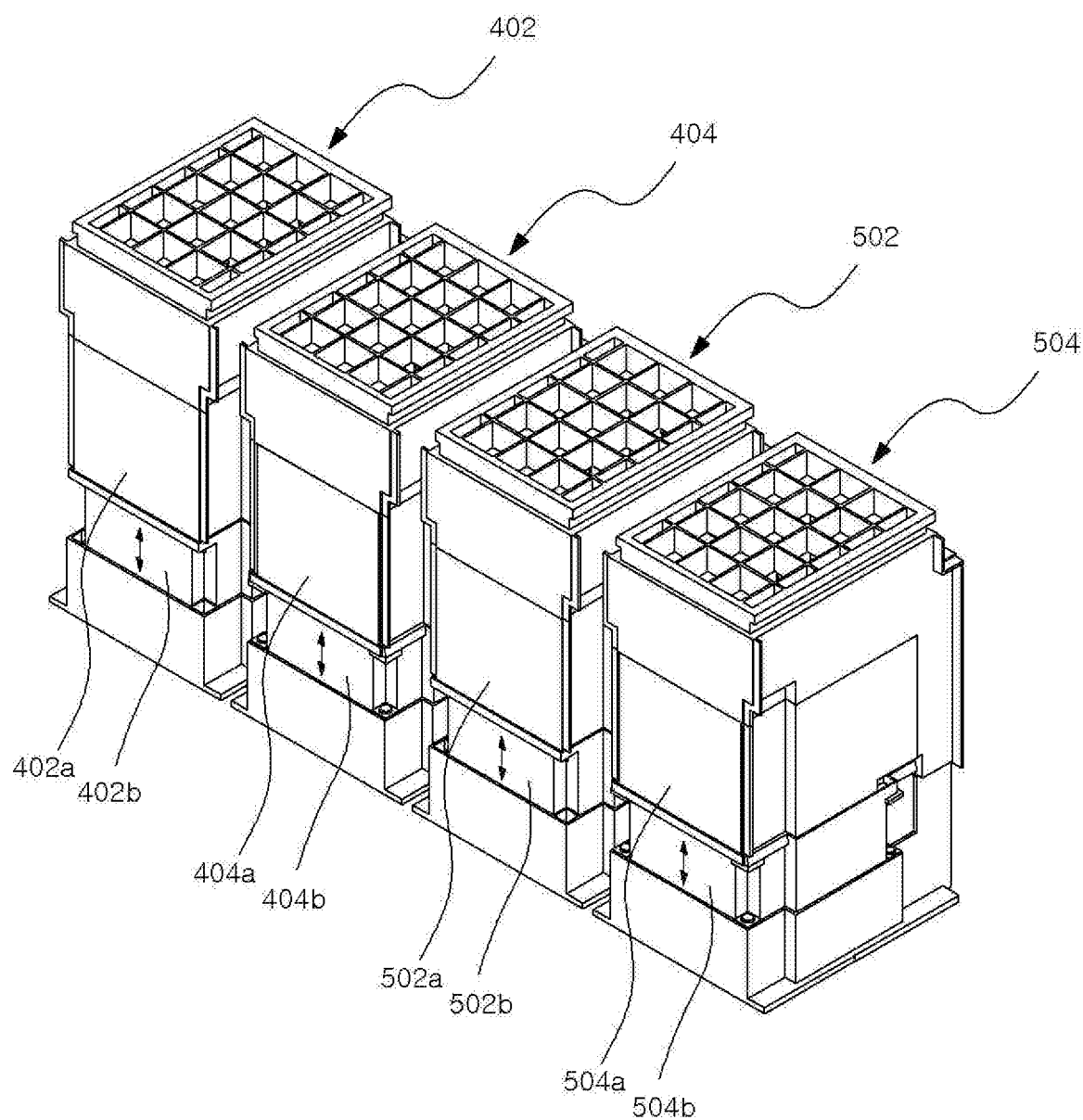
FIG. 20 is a view illustrating a cleaning part in a substrate processing system according to an embodiment of the present invention.

Furthermore, the first cleaning brush 410 and the second cleaning brush 412 may perform the cleaning process in independent cleaning processing spaces provided by separate blocking units (see 402 and 404 of FIG. 20), respectively.

Meanwhile, the substrate 10 cleaned in the first contact-type cleaning unit (e. g., first cleaning brush) may be transferred to the second contact-type cleaning unit (e. g., second cleaning brush) by a typical transfer arm. The transfer arm may be provided to reciprocate between the first contact-type cleaning unit and the second contact-type cleaning unit, and thus may transfer the substrate 10 cleaned in the first contact-type cleaning unit to the second contact-type cleaning unit. For reference, while different substrates 10 are being simultaneously cleaned in the first contact-type cleaning unit and the second contact-type cleaning unit, respectively, the transfer arm may temporarily stand by on an avoidance region provided between the first contact-type cleaning unit and the second contact-type cleaning unit.

Also, the substrate 10 cleaned in the second contact-type cleaning unit (e. g., second cleaning brush) may be transferred to a non-contact-type cleaning unit (e. g., second cleaning brush) described later by a typical transfer arm. The transfer arm may be provided to reciprocate between the second contact-type cleaning unit and the non-contact-type cleaning unit 500, and thus may transfer the substrate 10 cleaned in the second contact-type cleaning unit to the non-contact-type cleaning unit 500. For reference, while different substrates 10 are being simultaneously cleaned in the second contact-type cleaning unit and the non-contact-type cleaning unit, respectively, the transfer arm may temporarily stand by on an avoidance region provided between the second contact-type cleaning unit and the non-contact-type cleaning unit.

The non-contact-type cleaning unit 500 may physically make non-contact with the surface of the substrate 10, and may be provided in various structures that can perform cleaning. Hereinafter, a configuration in which the non-contact-type cleaning unit 500 includes a first non-contact-type cleaning unit 502 and a second non-contact-type cleaning unit 504 will be described. According to circumstances, the non-contact-type cleaning unit may include only one cleaning unit.

Blocking units 502 and 504 may be provided to block a cleaning processing space of the non-contact-type cleaning unit 500 from other spaces while cleaning is being performed in the non-contact-type cleaning unit 500. Here, the cleaning processing space of the non-contact-type cleaning unit 500 may be construed as a space where cleaning is performed by the non-contact-type cleaning unit 500, and may be provided in a chamber structure independently sealed by the blocking units 502 and 504.

The blocking units 502 and 504 may be provided in various structures that can provide an independent sealed space blocked from the outside. Hereinafter, a configuration in which the blocking unit 502 or 504 includes a casing 502a or 504a disposed to surround the substrate 10 and providing an independent cleaning processing space and a shutter 502b or 504b opening and closing the inlet of the casing 502a or 504a will be described with reference to the accompanying drawings. (see FIG. 20)

In one embodiment, the casing 502a or 504a may be provided in a substantially rectangular parallelepiped shape having an inlet formed at a side wall portion thereof. The shutter 502b or 504b may be configured to be vertically moved in a straight-line by a typical driving part (e. g., combination of motor and power transmission member) and thus open and close the inlet of the casing 502a or 504a.

In addition, the non-contact-type cleaning unit 500 may include a cradle 520 and a recovery container 530. The cradle 520 may allow the substrate 10 to be placed thereon one by one, and may rotate about the center of the shaft 521 inside the casing 402a. The recovery container 530 may surround the circumference of the cradle 520, and may collect a processing fluid scattering from the surface of the substrate 10.

The cradle 520 may be provided to be movable in a vertical direction, and a plurality of recover cups 532 to 538 forming a plurality of recovery ducts for collecting different processing fluids at different heights along the vertical direction may be disposed on the inner wall of the recovery container 530. Hereinafter, a configuration in which the recovery container 530 includes four recovery cups 532 to 538 independently forming four recovery ducts, respectively, will be described. According to circumstances, the recovery container may be configured to include three or less or five or more recovery cups. (See FIGS. 21 to 24)

In this structure, since the substrate 10 can be cleaned by various methods using different types of chemicals and/or fluids by varying the height of the cradle 520 in a single processing space, the removal effect of foreign substances remaining on the substrate can be improved.

A spraying part described later may be disposed over the upper portion of the cradle 520. The spraying part may spray chemicals, fluids, heterogeneity fluids, and steam onto the top surface of the substrate 10. The processing fluids (fluids used for the cleaning processing of the substrate surface) scattering from the surface of the substrate 10 may be collected in different recovery cups 532 to 538 according to the height of the cradle 520. In addition, a drainage passage may be individually connected to the recovery cups 532 to 538 to discharge the processing fluids that are collected.

The non-contact-type cleaning unit 500 may be configured to perform cleaning by various methods in accordance with the required conditions and design specifications.

Figure 21:
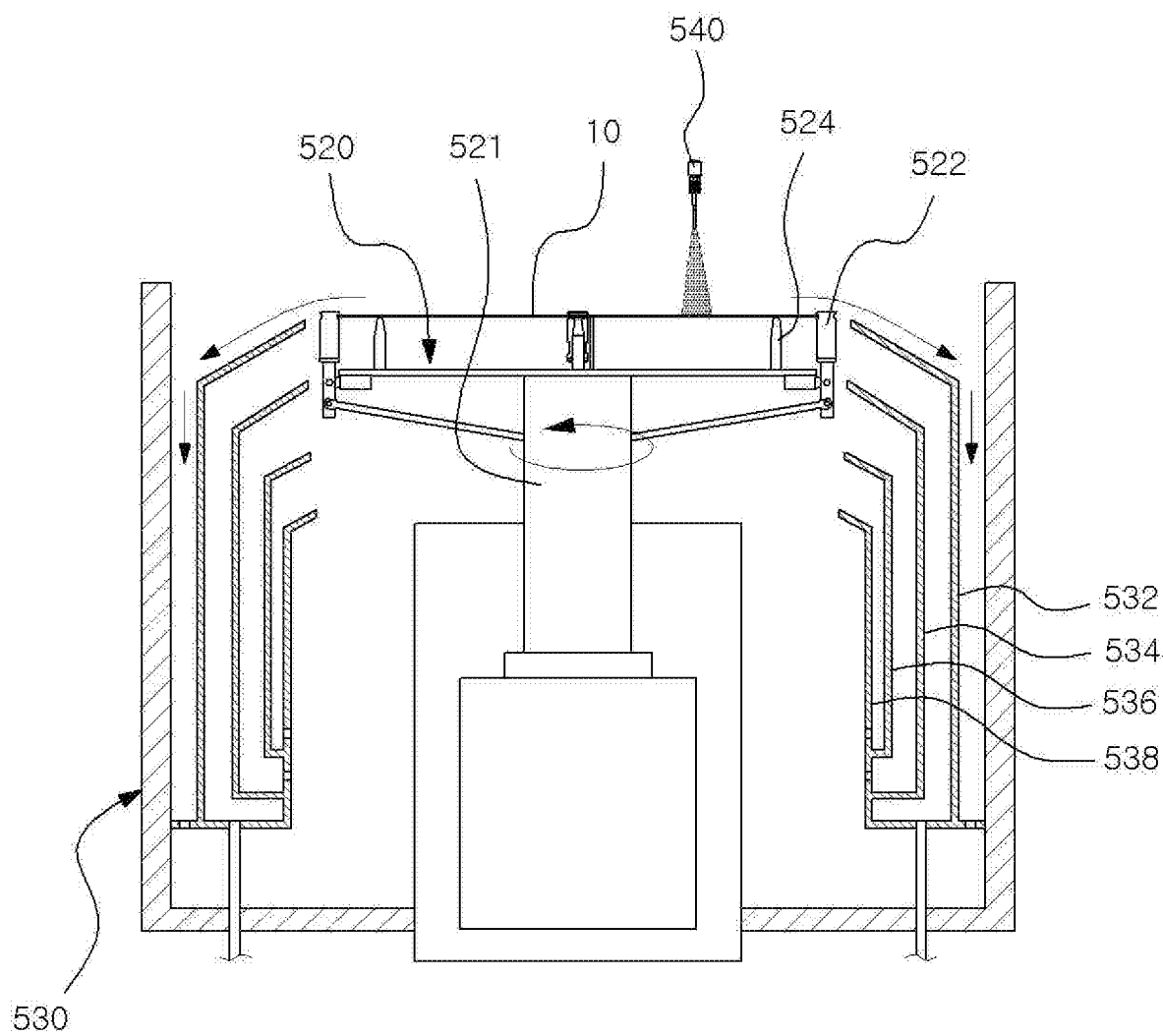
FIGS. 21 to 24 are views illustrating structures and operational structures of a cradle and a recovery container of non-contact-type cleaning unit in the substrate processing system according to an embodiment of the present invention.

Referring to FIG. 21, the non-contact-type cleaning unit 500 may include a chemical spraying part 540 that can spray at least one type of chemical onto the surface of the substrate 10.

In this embodiment, since the cleaning processing space of the non-contact-type cleaning unit 500 is independently provided as a sealed chamber structure, a chemical may be used as a cleaning liquid.

A typical nozzle that can spray chemicals may be used as the chemical spraying part 540, and the present invention is not limited by the type and characteristics of the nozzle. A nozzle that can uniformly spray a chemical onto the surface at a high pressure may be used.

The chemical spraying part 540 may be configured to spray various chemicals onto the surface of the substrate 10 in accordance with the required conditions and the design specifications. The chemical spraying part 540 of the non-contact-type cleaning unit 500 may spray at least one of ozone hydrofluoric acid ($O_3HF$) and hydrofluoric acid (HF) which are effective to remove organic matters. According to circumstances, the chemical spraying part 540 of the non-contact-type cleaning unit 500 may also spray other chemicals such as Standard Clean-1 (SC1, APM), sulfuric acid ($H_2SO_4$), ammonia, and hydrogen peroxide.

Also, the chemical spraying part 540 of the non-contact-type cleaning unit 500 may be disposed to oscillate with respect to the surface of the substrate 10 equally or similarly to the chemical spraying part disposed in the pre-cleaning region P1, and thus may oscillation-spray a chemical onto the surface of the substrate 10. (see FIG. 7)

For reference, the disposition condition (height) of the cradle 520 may be variously modified in accordance with the required conditions and the design specifications. In one embodiment, when a chemical is sprayed from the chemical spraying part 540 of the non-contact-type cleaning unit 500, the cradle 520 may be disposed at the uppermost location, and a processing fluid (chemical) scattering from the substrate 10 may be collected by the first recovery cup 532.

Figure 22:
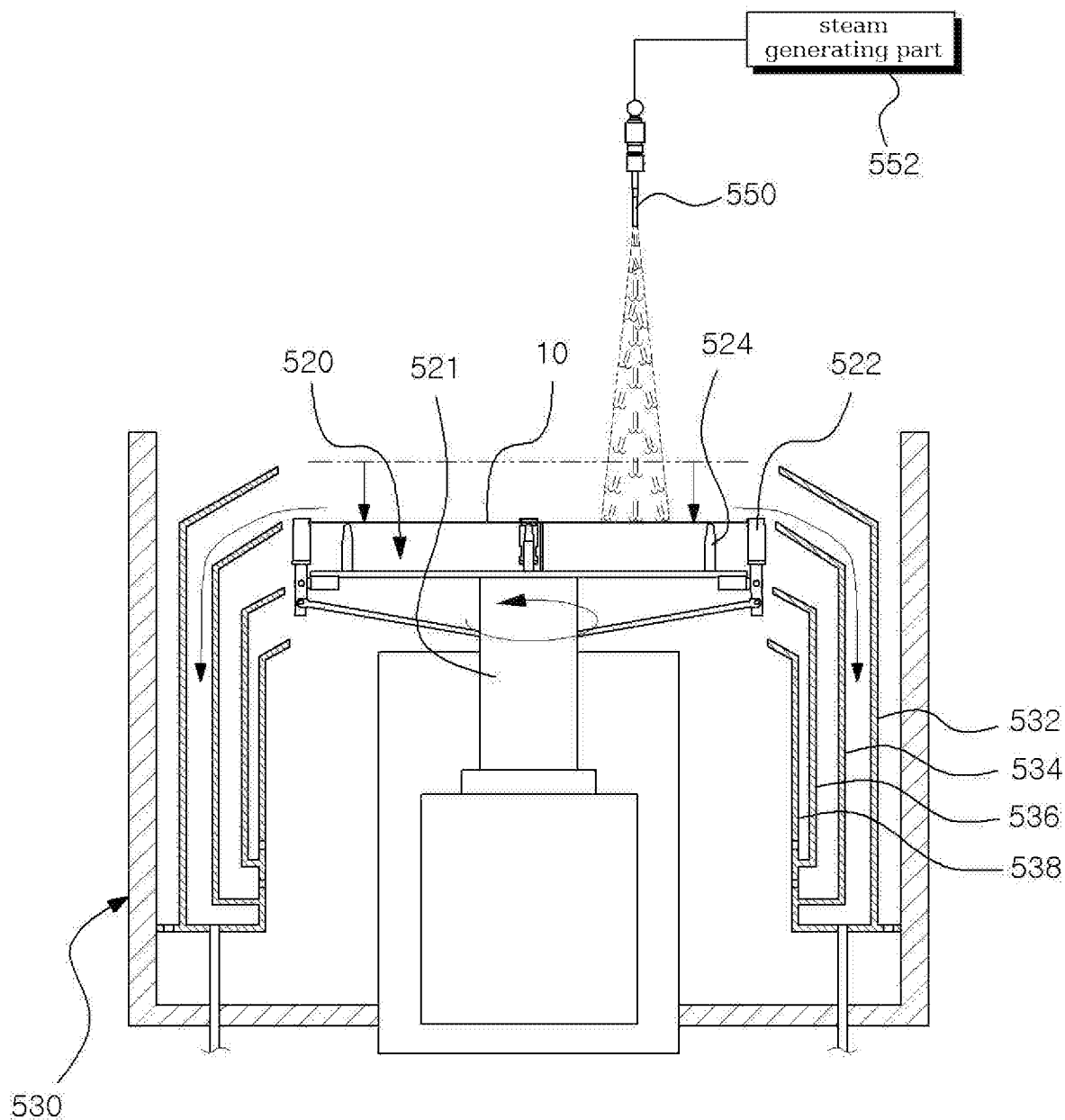

Referring to FIG. 22, the non-contact-type cleaning unit 500 may include a steam spraying part 550 that sprays steam onto the surface of the substrate 10.

Particularly, the steam sprayed from the steam spraying part 550 may be effective to remove organic matters existing on the surface of the substrate 10. For reference, the steam spraying part 550 may be configured to spray steam at a temperature capable of preventing damage of the substrate 10 while securing the organic matter removal efficiency by steam. The steam spraying part 550 may spray steam at a temperature of about 60 degrees to about 120 degrees.

In one embodiment, when steam is sprayed from the steam spraying part 550 of the non-contact-type cleaning unit 500, the cradle 520 may be disposed at the first location just under the uppermost end, and a processing fluid scattering from the substrate 10 may be collected by the second recovery cup 534.

Also, the non-contact-type cleaning unit 500 may include a cleaning liquid spraying part (not shown) that sprays a cleaning liquid onto the surface of the substrate 10.

The cleaning liquid spraying part may be configured to spray various cleaning liquids onto the surface of the substrate 10 in accordance with required conditions. In one embodiment, the cleaning liquid spraying part may be configured to spray a cleaning liquid such as pure water (DIW). According to circumstances, a process of spraying pure water after a chemical is sprayed may also be repeatedly performed.

Also, the non-contact-type cleaning unit 500 may include a heterogeneity fluid spraying part (not shown) that sprays different heterogeneity fluids onto the surface of the substrate 10.

The heterogeneity fluid spraying part may be provided in various structures that can spray heterogeneity fluids. In one embodiment, the heterogeneity fluid spraying part may include a first fluid supply unit supplying a first fluid and a second fluid supply unit supplying a second fluid different from the first fluid. The first fluid and the second fluid may be sprayed onto the surface of the substrate by a spray member such as a typical nozzle while being mixed with each other or being separated from each other.

For example, the heterogeneity fluid spraying part may include a first fluid spraying nozzle and a second fluid spraying nozzle which are separately disposed. The first fluid spraying nozzle and the second fluid spraying nozzle may independently spray the first fluid and the second fluid onto the surface of the substrate 10, respectively. (see FIG. 5)

In another embodiment of the heterogeneity fluid spraying part, the heterogeneity fluid spraying part may include a first fluid passage for supplying the first fluid, a second fluid passage for supplying the second fluid, and a mixture spray passage from which the first fluid and the second fluid are fixed and sprayed. The first fluid and the second fluid may be sprayed at a high speed onto the surface of the substrate 10 while being mixed with each other in the mixture spray passage. (see FIG. 6)

The types and characteristics of the heterogeneity fluids that can be sprayed from the heterogeneity fluid spraying part may be variously modified in accordance with the required conditions and design specifications. In one embodiment, the first fluid may be any one of gases and liquids, and the second fluid may be any one of gases and liquids. For example, the heterogeneity fluid spraying part may be configured to spray both of pure water (DIW) that is a liquid and nitrogen ($N_2$) that is a gas, so as to the foreign substance removal efficiency. According to circumstances, two different types of liquids or two different types of gases may be used as long as the hitting force and the foreign substance removal efficiency by the heterogeneity fluids can be secured.

Similarly to the chemical spraying part 540, at least one of the cleaning liquid spraying part, the steam spraying part and the heterogeneity fluid spraying part may be provided so as to oscillate with respect to the surface of the substrate 10, and thus may oscillation-spray a cleaning liquid, steam and heterogeneity fluids onto the surface of the substrate 10. (see FIG. 7)

Figure 23:
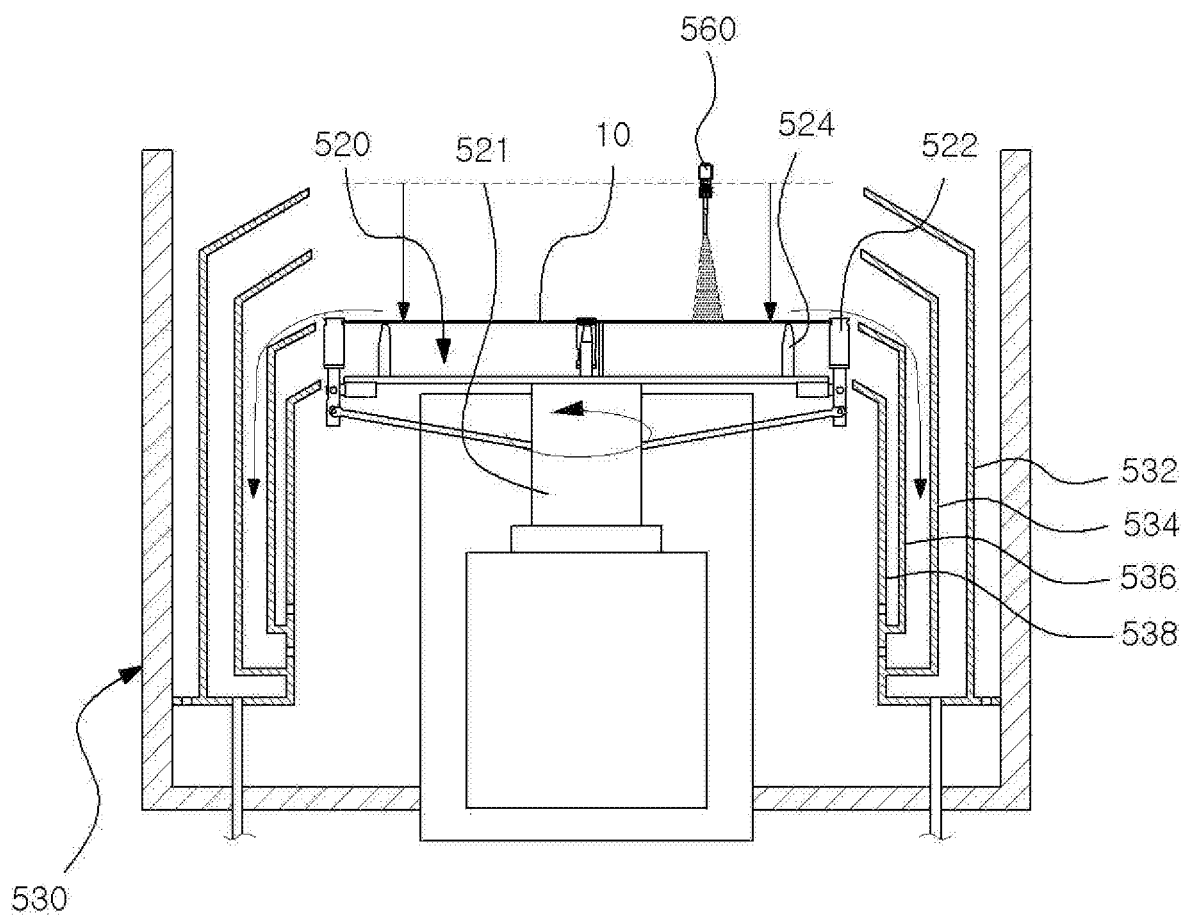

Also, referring to FIG. 23, the non-contact-type cleaning unit 500 may include a heterogeneity fluid spraying part 560 that sprays different heterogeneity fluids onto the surface of the substrate 10. The heterogeneity fluid spraying part 560 may include a dry ice supply unit that supplies dry ice particles, and a fluid spraying unit that sprays a fluid onto the surface of the substrate 10.

The fluid spraying unit may be configured to spray various fluids in accordance with the required conditions and design specifications. In one embodiment, the fluid spraying unit may be configured to spray at least one of gases and liquids. Hereinafter, a configuration in which the heterogeneity fluid spraying part 560 sprays a gas together with dry ice particles will be described. According to circumstances, the heterogeneity fluid spraying part may also be configured to spray a liquid (e. g., DIW) together with dry ice particles.

Figure 24:
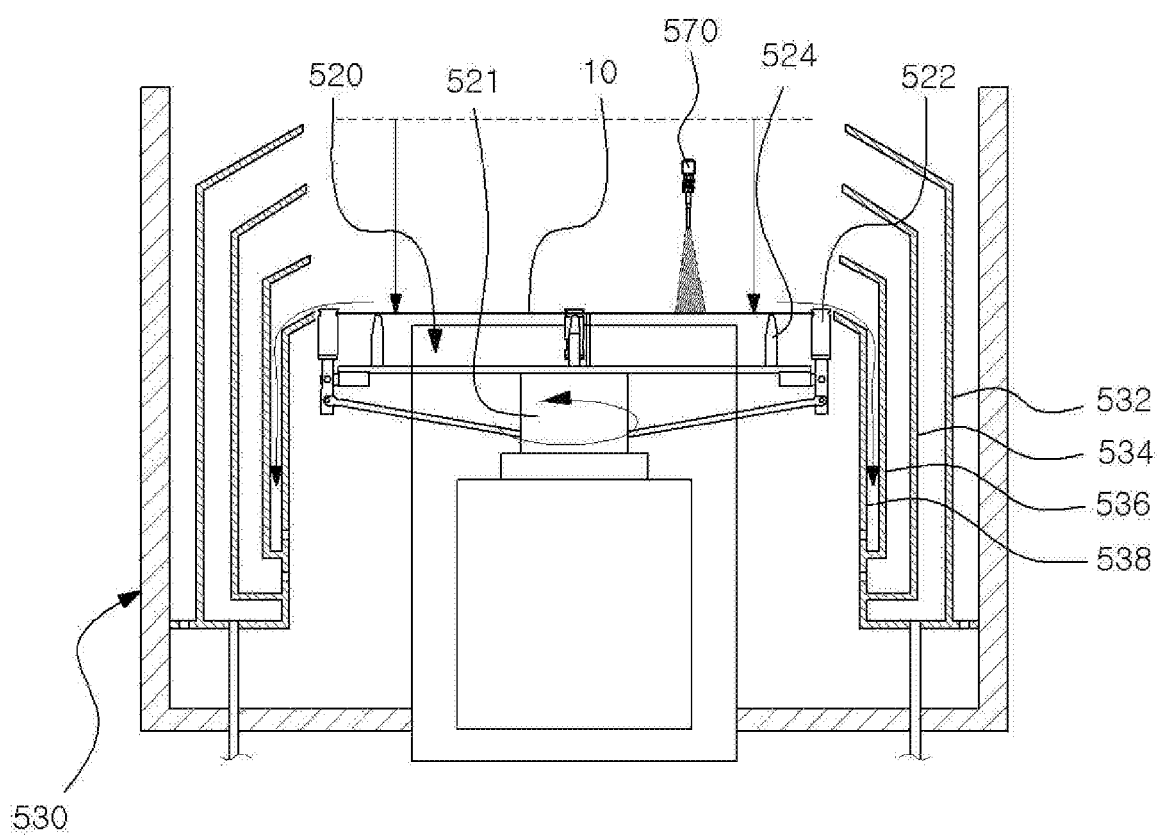

Also, referring to FIG. 24, the non-contact-type cleaning unit 500 may include an isopropyl alcohol (IPA) spraying part 570 that sprays isopropyl alcohol onto the surface of the substrate 10.

The isopropyl alcohol spraying part 570 may spray isopropyl alcohol onto the surface of the substrate 10, and isopropyl alcohol may be dried on the surface of the substrate 10. Thus, the cleaning process of the substrate 10 may be finished.

In addition, the substrate 10 cleaned in the first non-contact-type cleaning unit 502 may be transferred to the second non-contact-type cleaning unit 504 by a typical transfer arm. The transfer arm may be provided to reciprocate between the first non-contact-type cleaning unit 502 and the second non-contact-type cleaning unit 504, and thus may transfer the substrate 10 cleaned in the first non-contact-type cleaning unit 502 to the second non-contact-type cleaning unit 504. For reference, while different substrates 10 are being simultaneously cleaned in the first contact-type cleaning unit 502 and the second contact-type cleaning unit 504, respectively, the transfer arm may temporarily stand by on an avoidance region provided between the first contact-type cleaning unit 502 and the second contact-type cleaning unit 504.

In this embodiment, although the non-contact-type cleaning unit (or contact-type cleaning unit) is described as being arranged on a single layer, according to circumstances, the non-contact-type cleaning unit may be provided in a multi-layered structure.

Figure 25:
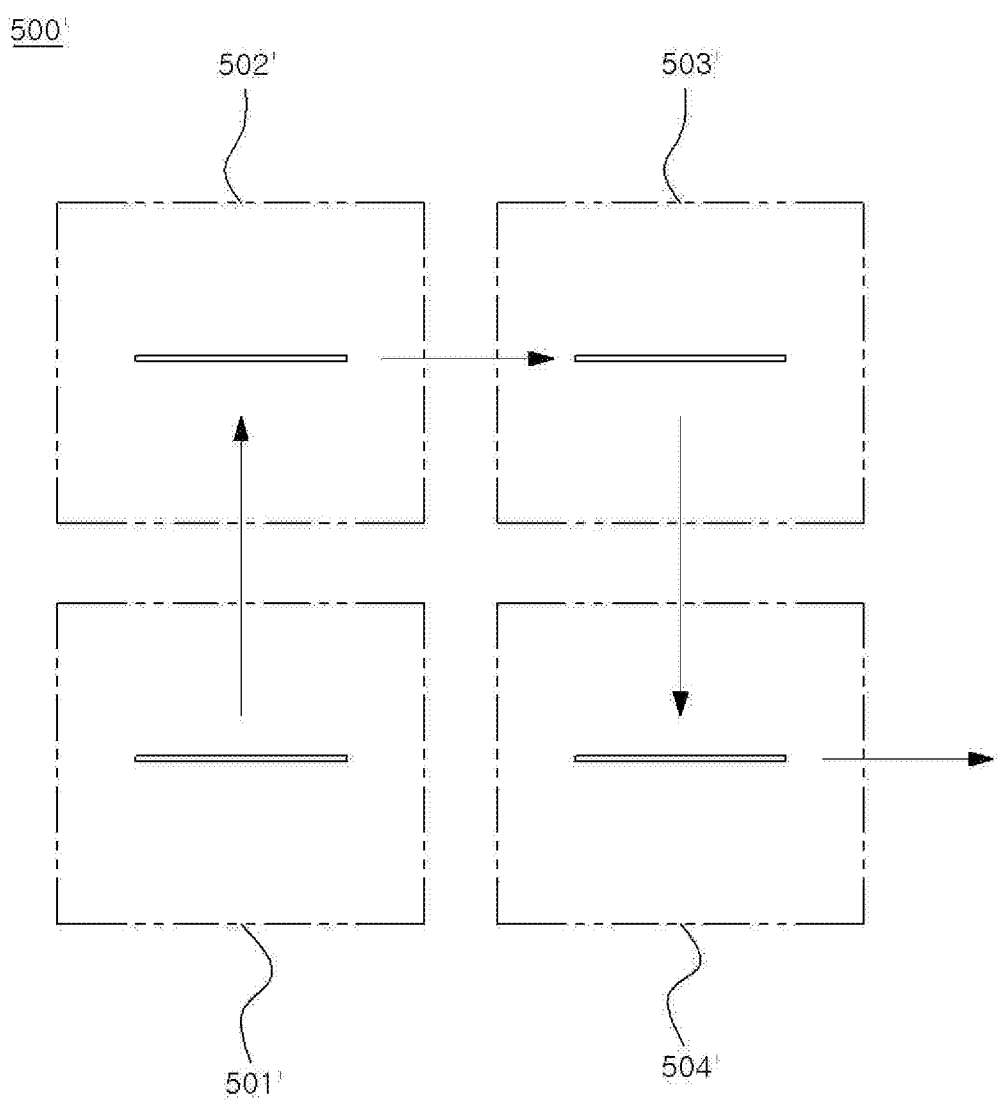
FIG. 25 is a view illustrating another exemplary non-contact-type cleaning unit in a substrate processing system according to an embodiment of the present invention.

Referring to FIG. 25, a non-contact-type cleaning unit 500' may be provided in a two-layered structure, and may include a plurality of blocking units 501' to 504' providing independently sealed processing spaces. The substrate 10 may be cleaned while moving to the plurality of blocking units 501' to 504' along a predetermined path. According to circumstances, the non-contact-type cleaning unit may be provided in a three or more-layered structure, and the present invention is not limited by the disposition structure and method of the blocking unit.

Meanwhile, in this embodiment, although the pre-cleaning region is described as being simply provided in an independently sealed chamber structure, according to circumstances, a blocking unit may be provided to selectively block the polishing part and the cleaning part.

The blocking unit may be provided in various structures that can selectively block the polishing part and the cleaning part, and the present invention is not limited by the type and structure of the blocking unit. In one embodiment, the blocking unit may be implemented in a typical left-to-right sliding method or up-and-down method.

This structure may keep the cleaning part cleaner by fundamentally blocking polishing substances and foreign substances generated in the polishing part from being introduced to the cleaning part. That is, much more foreign substances may be generated in the polishing part compared to the cleaning part, and foreign substances generated in the polishing part and introduced into the cleaning part may cause a cleaning failure or cleaning deterioration. Thus, the blocking unit may improve the cleaning efficiency of the cleaning process performed in the cleaning part, by wholly blocking a boundary of the polishing part and the cleaning part, and thus by blocking polishing substances and foreign substances generated in the polishing part from being introduced to the cleaning part.

Figure 26:
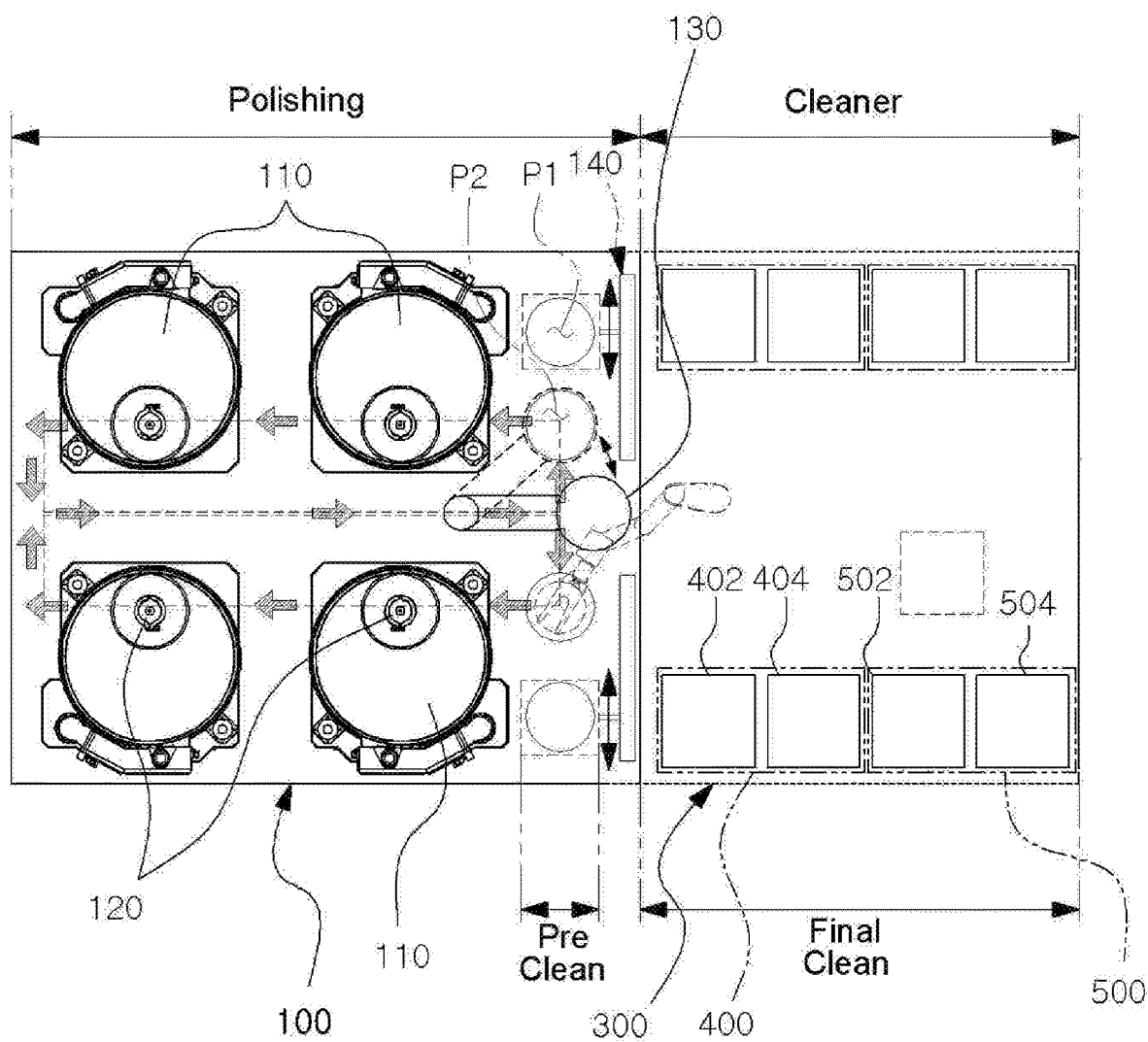
FIG. 26 is a view illustrating a substrate processing system according to another embodiment of the present invention.
Figure 27:
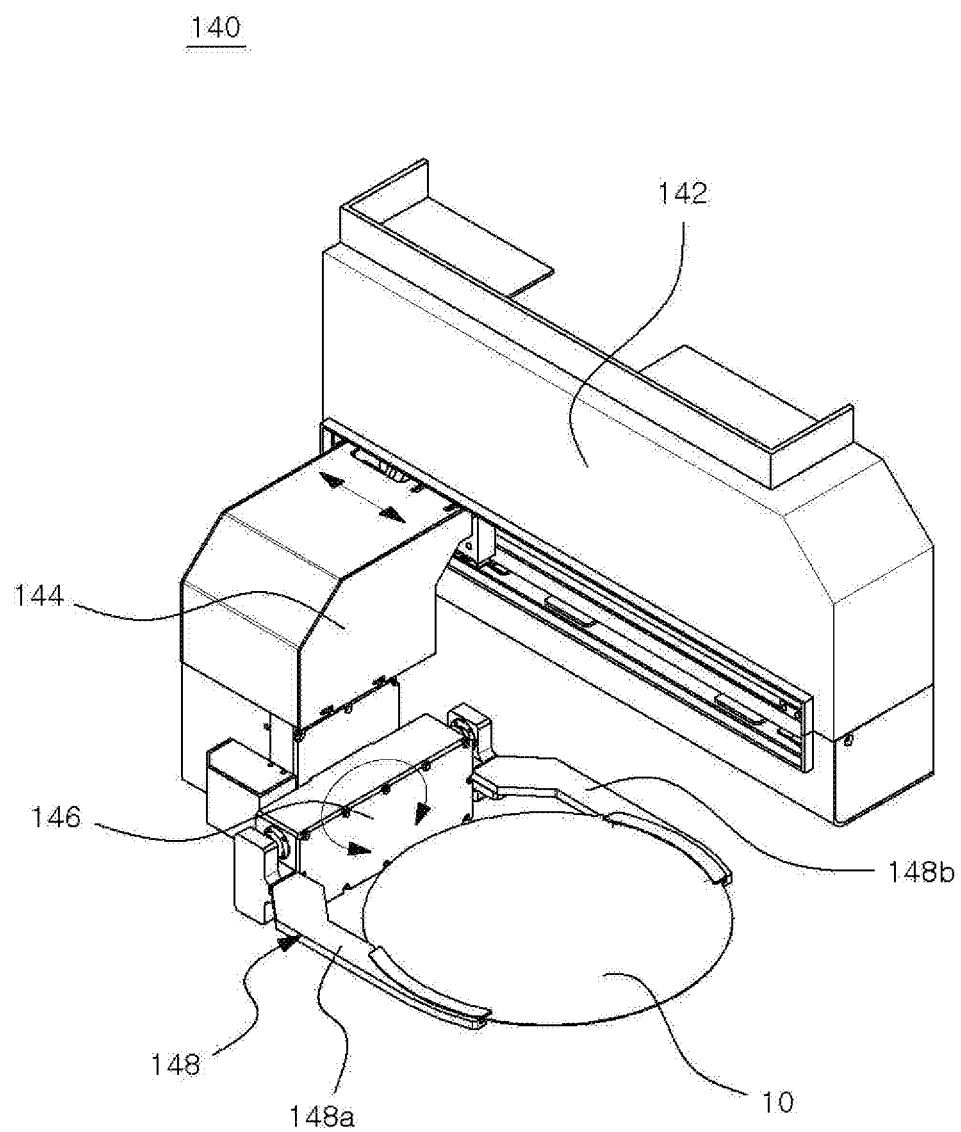
FIGS. 27 and 28 are views illustrating an inverting unit of FIG. 26.
Figure 28:
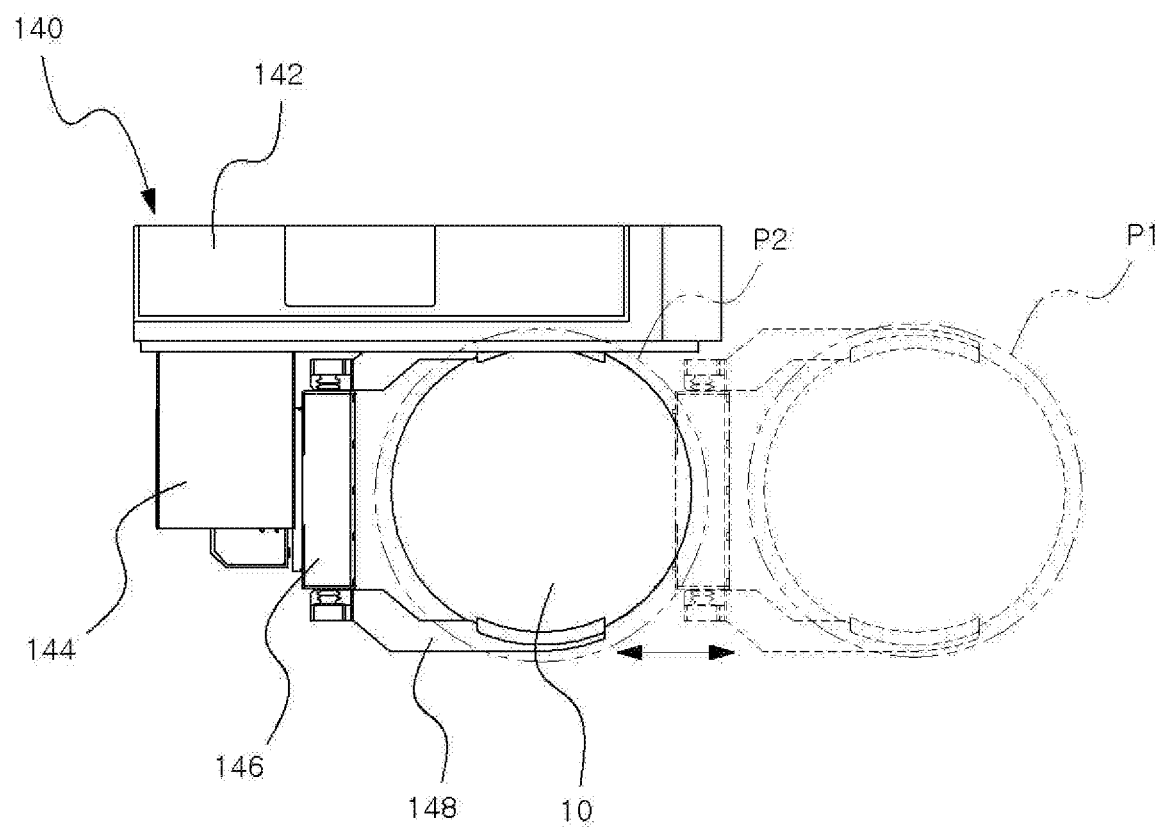

FIG. 26 is a view illustrating a substrate processing system according to another embodiment of the present invention. FIGS. 27 to 28 are views illustrating an inverting unit of FIG. 26. For parts equivalent to and similar to the configurations described above, the same reference numerals will be assigned, and detailed descriptions thereof will be omitted.

Referring to FIGS. 26 to 28, the substrate processing system 1 according to another embodiment may include an inverting unit 140. The inverting unit 140 may be disposed to be movable from a loading region P2, to which a substrate 10 provided in the polishing part (see 100 of FIG. 2) is loaded, to a pre-cleaning region P1. The inverting unit 140 may receive the substrate 10 from the loading region P2, and may transfer the substrate 10 to the pre-cleaning region P1. The substrate 10 may be pre-cleaned in the pre-cleaning region P1 while being supported by the inverting unit 140.

The inverting unit 140 may invert the polishing surface of the substrate 10 in an opposite direction before the substrate 10 having undergone the chemical mechanical polishing process is supplied to the cleaning part 300.

For reference, the polishing surface of the substrate 10 may mean a surface (undersurface or top surface) of the substrate 10 which makes contact with the polishing pad (see 110 of FIG. 2) to be polished. Substantially, during the chemical mechanical polishing process, the polishing surface (e. g., undersurface of the substrate) of the substrate 10 may be disposed to face downward, and the inverting unit 140 may invert the substrate 10 180 degrees such that the polishing surface of the substrate 10 faces upward.

Specifically, the inverting unit 140 may include an operation assembly 144 moving from the loading region P2 to the pre-cleaning region P1, a rotation assembly 146 invertibly connected to the operation assembly 144, and a grip assembly 148 connected to the rotation assembly 146 and gripping the substrate 10.

The operation assembly 144 may be provided to be movable from the loading region P2 to which the substrate 10 is loaded to the pre-cleaning region P1 from which the substrate 10 is unloaded in the polishing part 100.

The loading region P2 of the substrate 10 may be variously modified in accordance with the required conditions and the design specifications. In order to shorten the moving path of the carrier head 120, the loading region P2 may be provided on the moving path (e. g., circulation path) of the transfer unit (e. g., carrier head).

That is, when the pre-cleaning region of the substrate is provided at an outer side of the moving path of the carrier head, the carrier head needs to move along the moving path, and then needs to move again to the pre-cleaning region of the substrate provided at the outer side of the moving path. In this case, the moving path of the carrier head may inevitably increase. However, in a structure where the substrate 10 is gripped by the inverting unit 140 at the loading region P2 of the substrate 10, since the carrier head 120 need not move to the pre-cleaning region P1 and may move only along the moving path, the moving path of the carrier head 120 can be minimized.

The operation assembly 144 may be provided to move toward and away from the pre-cleaning region P1 by various methods in accordance with the required conditions and the design specifications. In one embodiment, the operation assembly 144 may be provided to straightly move from the loading region P2 to the pre-cleaning region P1 (or from the pre-cleaning region to the loading region). According to circumstances, the operation assembly may be configured to move from the loading region to the pre-cleaning region while rotating on the basis of a certain point.

The operation assembly 144 may be configured to move from the loading region P2 to the pre-cleaning region P1 by a driving force of a driving assembly 142. In one embodiment, the operation assembly 144 may straightly move from the loading region P2 to the pre-cleaning region P1 by a driving force of the driving assembly 142.

A typical drive unit that can provide a driving force may be used as the driving assembly 142, and the present invention is not limited by the type and characteristics of the driving assembly 142. In one embodiment, a typical linear motor may be used as the driving assembly 142. According to circumstances, the driving assembly may be configured with a combination (e. g., combination of a gear or a belt) of a typical motor and power transmission member), or may be configured with a screw member.

The grip assembly 146 may be configured to be connected to the operation assembly 144 and selectively grip the substrate 10. The grip assembly 146 may selectively move to the loading region P2 or the pre-cleaning region P1 by the operation assembly 144. The grip assembly 146 may escape to the pre-cleaning region P1 deviating from the moving path of the carrier head 120 during the chemical mechanical polishing process (or during the loading of the substrate) of the substrate 10, and may approach the loading region P2 only when gripping the substrate 10 having undergone the chemical mechanical polishing process.

Also, the rotation assembly 148 may be rotatably connected to the operation assembly 144, and the grip assembly 146 may be connected to the rotation assembly 148 to be selectively invertible with respect to the operation assembly 144 by the rotation assembly 148.

The rotation assembly 148 may be configured with a typical shaft and drive unit, and the structure and characteristics of the rotation assembly 148 may variously modified in accordance with the required conditions and design specifications. According to circumstances, the grip assembly may also be configured to be fixed onto the operation assembly, and the operation assembly may be configured to invertibly rotate on the driving assembly.

The grip assembly 146 may be provided in various structures that can selectively grip the substrate 10, and the present invention is not limited by the structure and characteristics of the grip assembly 146. In one embodiment, the grip assembly 146 may include a first grip member 442*a* supporting one side of the substrate 10, and a second grip member 442*b* facing the first grip member 442*a* and supporting the other side of the substrate 10.

Also, pre-cleaning in the pre-cleaning region P1 may be performed while the substrate 10 is being supported by the inverting unit 140. In other words, the inverting unit 140 may serve to invert the substrate 10, and simultaneously, may serve as a supporting part for supporting the substrate 10.

Thus, by performing pre-cleaning in the pre-cleaning region P1 while the substrate 10 is being supported by the inverting unit 140, the supporting process for allowing the substrate 10 not to move during the pre-cleaning in the pre-cleaning region P1 can be simplified.

Naturally, it may be possible to support the substrate 10 using a separate supporting unit and perform the pre-cleaning. However, since the substrate 10 is supported during the inverting process of the substrate 10 which is necessarily performed regardless of the pre-cleaning, the process of supporting the substrate 10 can be simplified, and thus the whole process can be reduced.

In one embodiment, the pre-cleaning in the pre-cleaning region P1 may be performed when the substrate 10 is inverted by the inverting unit 140 (when the polishing surface is inverted so as to face upward).

In another embodiment, the pre-cleaning in the pre-cleaning region P1 may be performed when the substrate 10 is disposed upright by the inverting unit 140. Thus, by performing pre-cleaning when the substrate 10 is disposed upright, a cleaning fluid such as a cleaning liquid or a chemical used in the pre-cleaning may not remain on the surface of the substrate 10, and may be more quickly and easily discharged.

According to circumstances, the pre-cleaning may also be performed while the substrate 10 is being supported by the inverting unit 140 before the substrate 10 is inverted by the inverting unit 140 (when the polishing surface of the substrate 10 is disposed to face downward).

In addition, the pre-cleaning while the substrate 10 is being supported by the inverting unit 140 may be defined as a concept including all of a method of spraying a cleaning fluid such as chemicals, pure water (DIW), steam and heterogeneity fluids onto the surface of the substrate 10, a method of allowing the cleaning brush to make rotational contact with the surface of the substrate 10, and a method of supplying vibration energy to the surface of the substrate 10.

Figure 29:
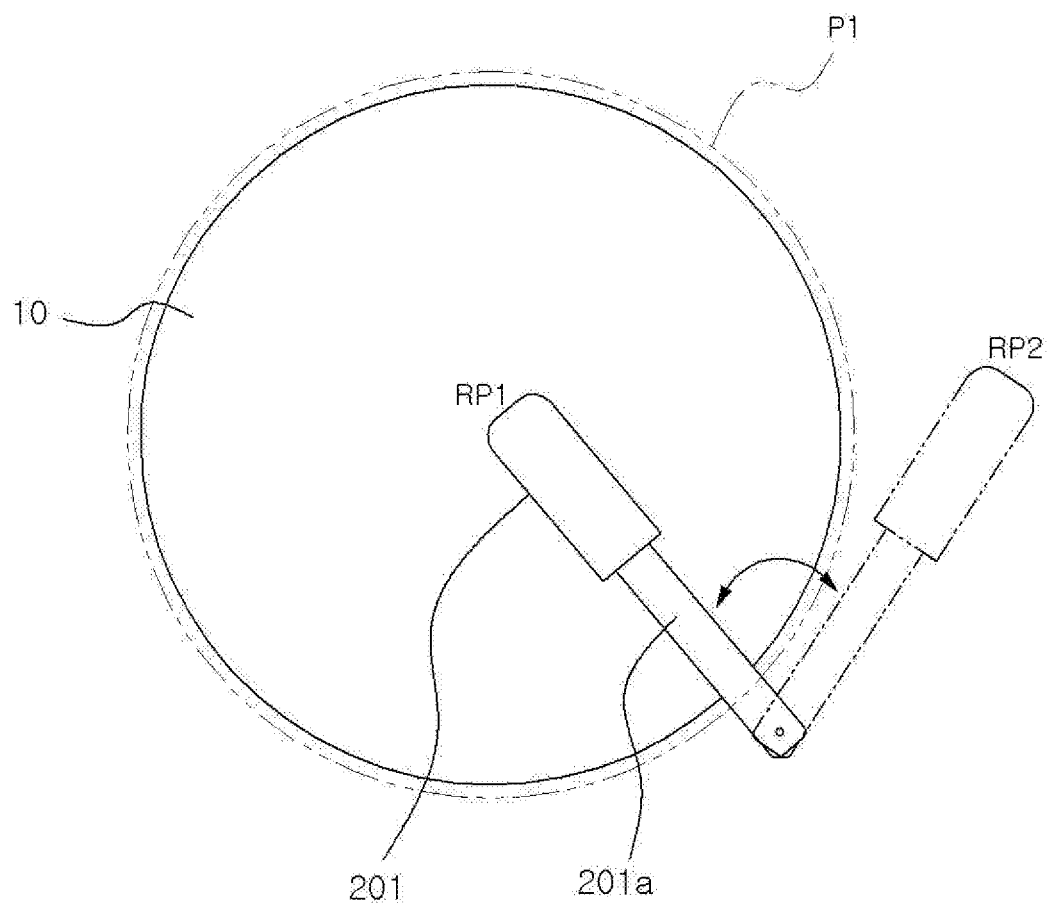
FIG. 29 is a view illustrating a rotation arm applicable to a substrate processing system according to an embodiment of the present invention.

FIG. 29 is a view illustrating a rotation arm applicable to a substrate processing system according to an embodiment of the present invention.

Referring to FIG. 29, the substrate processing system 1 according to the embodiment may include a rotation arm 201*a* that is disposed to be pivotable from a first position RP1 disposed in the pre-cleaning region P1 of the polishing part (see 100 of FIG. 2) to a second position RP2 disposed outside the pre-cleaning region P1 of the polishing part 100. The cleaning fluid spraying part 201 may be separably mounted to the rotation arm 201*a* to spray a cleaning fluid onto the surface of the substrate 10 placed on the substrate mounting part (see 220 of FIG. 3).

Here, the placing of the substrate 10 on the substrate mounting part 220 may be construed as a concept including both of a state where substrate 10 is placed on the substrate mounting part 220 and a state where the substrate 10 is supported by the inverting unit (140 of FIG. 27).

The rotation arm 201a may move from the first position RP1 to the second position RP2 while pivoting about one end thereof. When the rotation arm 201a is disposed at the first position RP1, the cleaning fluid spraying part 201 may spray a cleaning fluid onto the surface of the substrate 100.

The cleaning fluid spraying part 201 may selectively and separably mounted onto the rotation arm 201a.

Here, cleaning fluid spraying part 201 may include at least one of the chemical spraying part, the cleaning liquid spraying part, the steam spraying part, and the heterogeneity fluid spraying part which can spray a cleaning fluid such as chemicals, pure water (DIW), steam and heterogeneity fluids.

Thus, by mounting different cleaning fluid spraying parts 201 onto one rotation arm 201a, different rotation arms or supporting units onto which spraying parts are mounted to spray different cleaning fluids need not to be provided. Since only one rotation arm can be used for different spraying parts, the structure can be simplified, and the space utilization can be increased. Furthermore, by disposing the rotation arm 201a at the second position RP2 when the pre-cleaning of the substrate 10 is finished, conflicts with peripheral devices such as a carrier head, a conditioner, and an inverting unit can be prevented.

Figure 30:
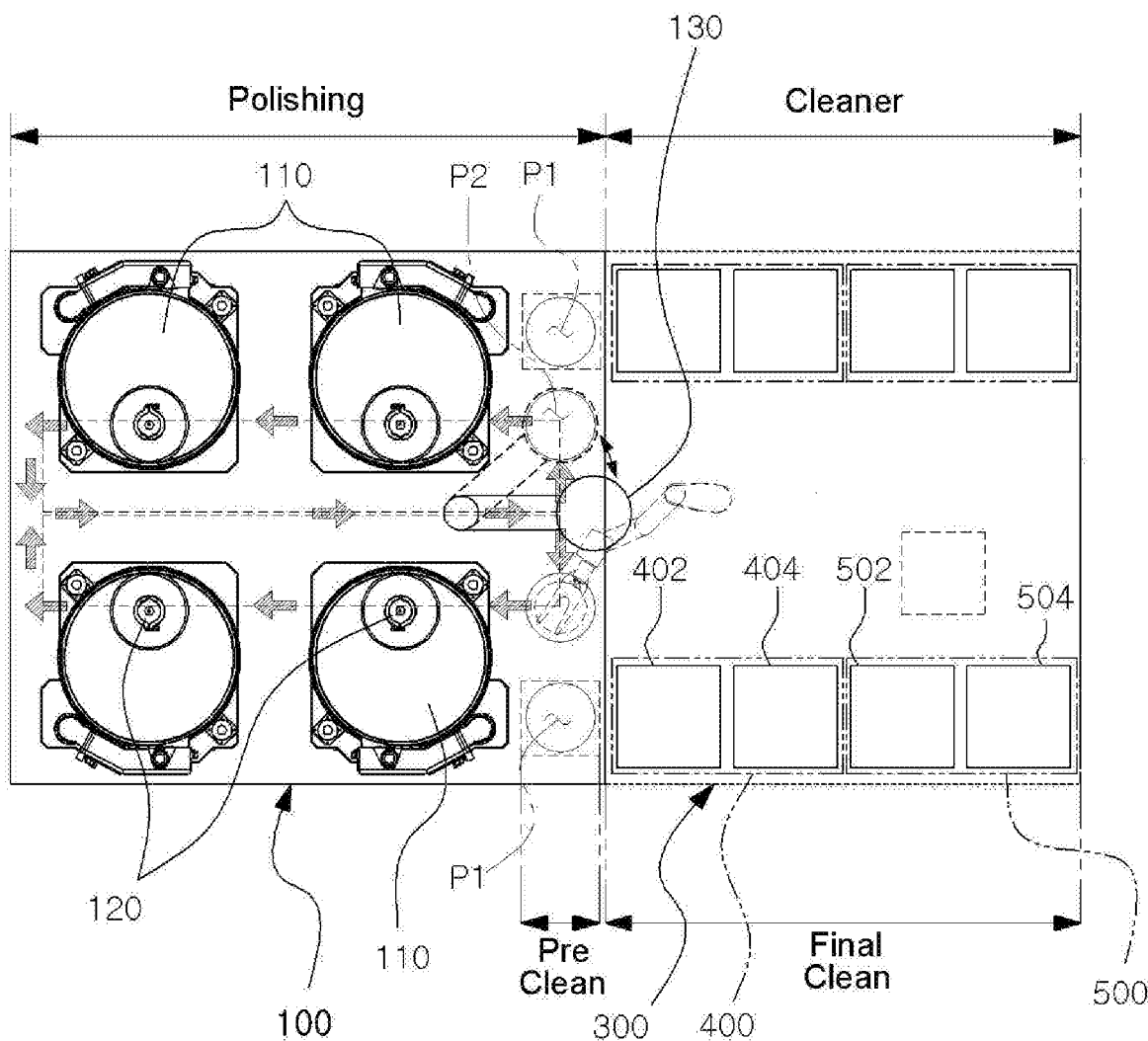
FIG. 30 is a view illustrating a substrate processing system according to another embodiment of the present invention.
Figure 31:
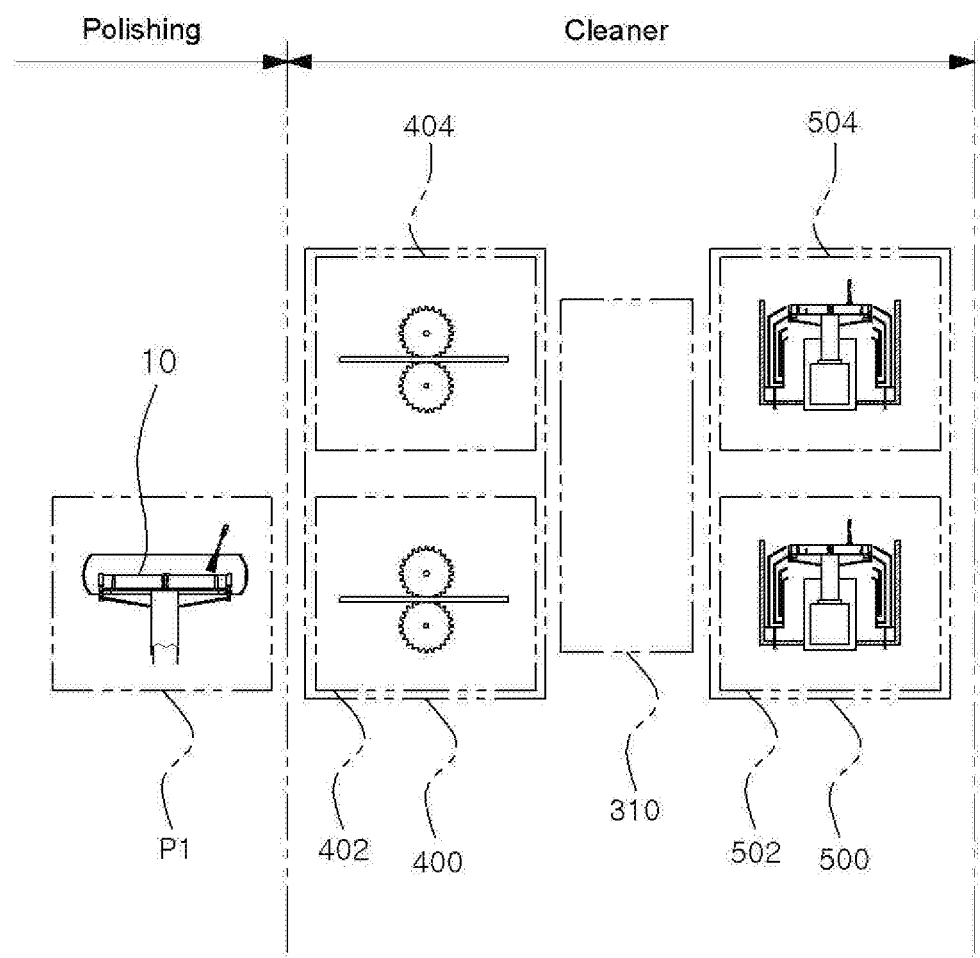
FIG. 31 is a view illustrating a cleaning part in a substrate processing system of FIG. 30.
Figure 32:
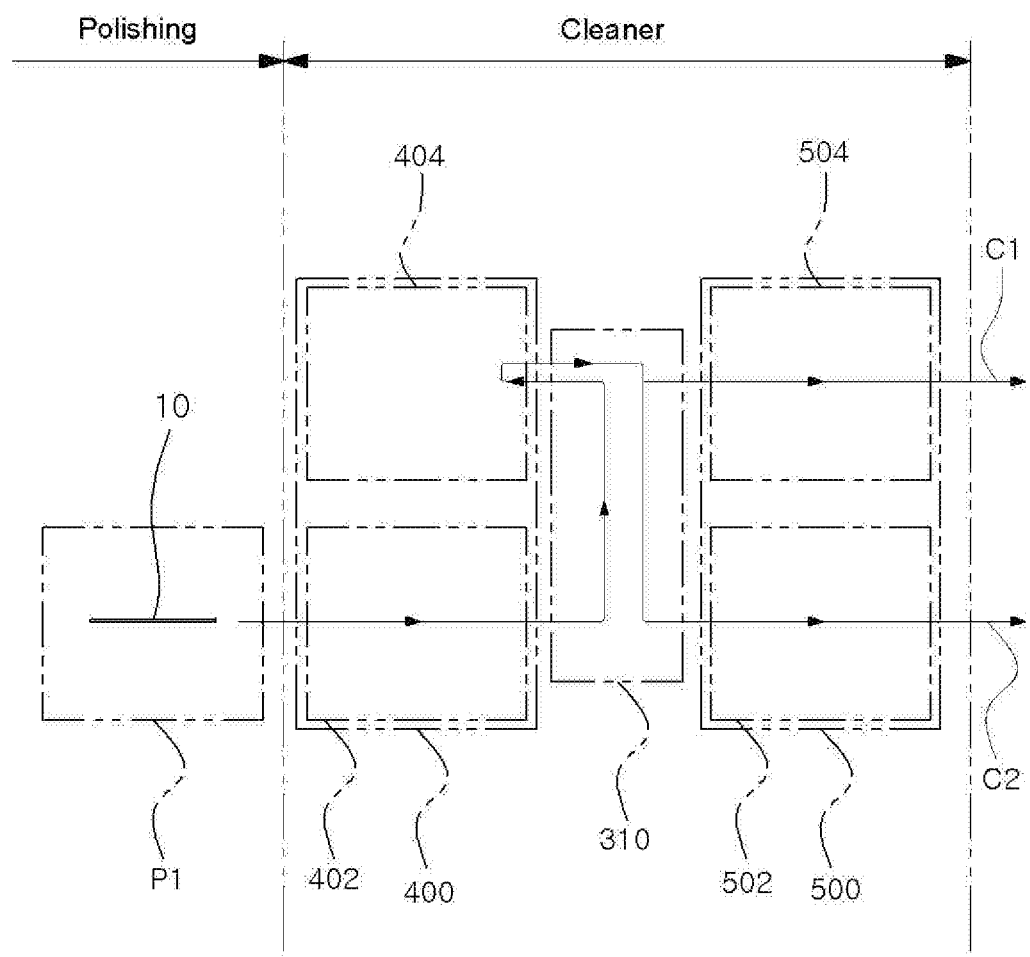
FIGS. 32 to 34 are views illustrating a treatment process of a substrate by a substrate processing system of FIG. 30.
Figure 33:
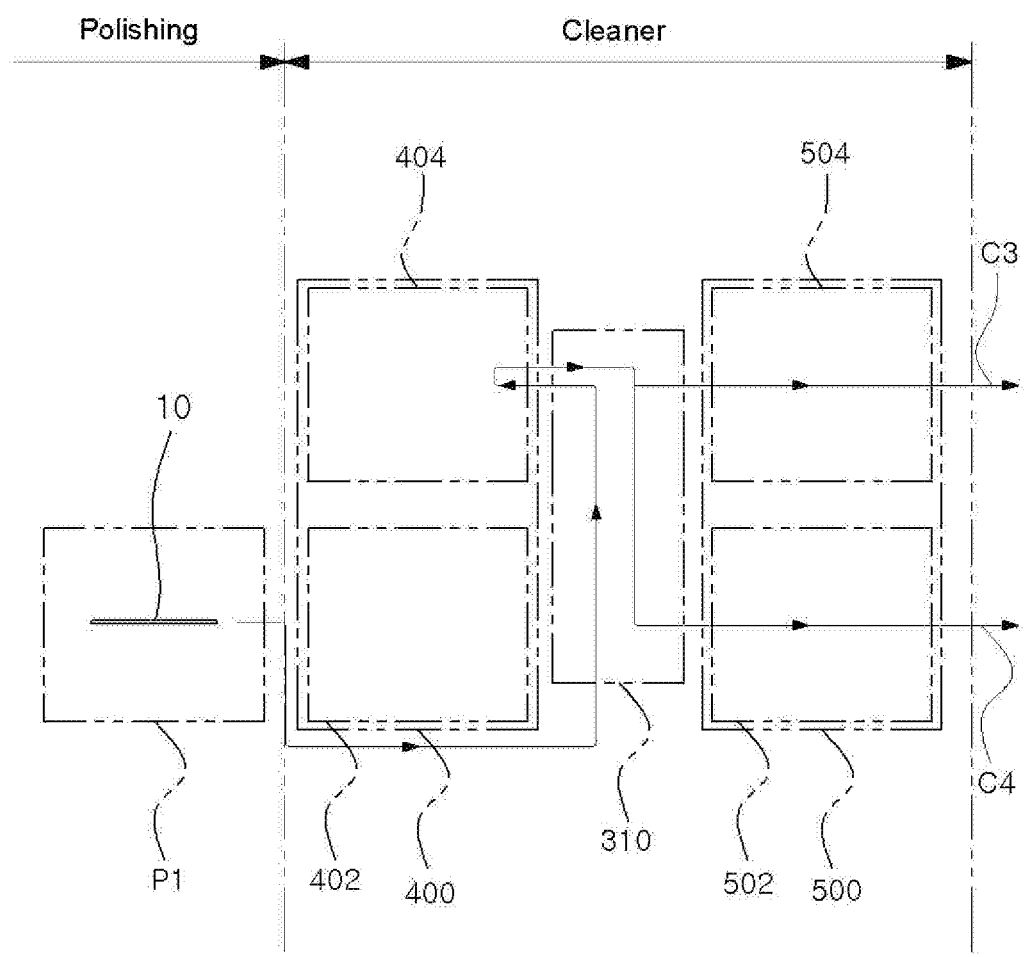
Figure 34:
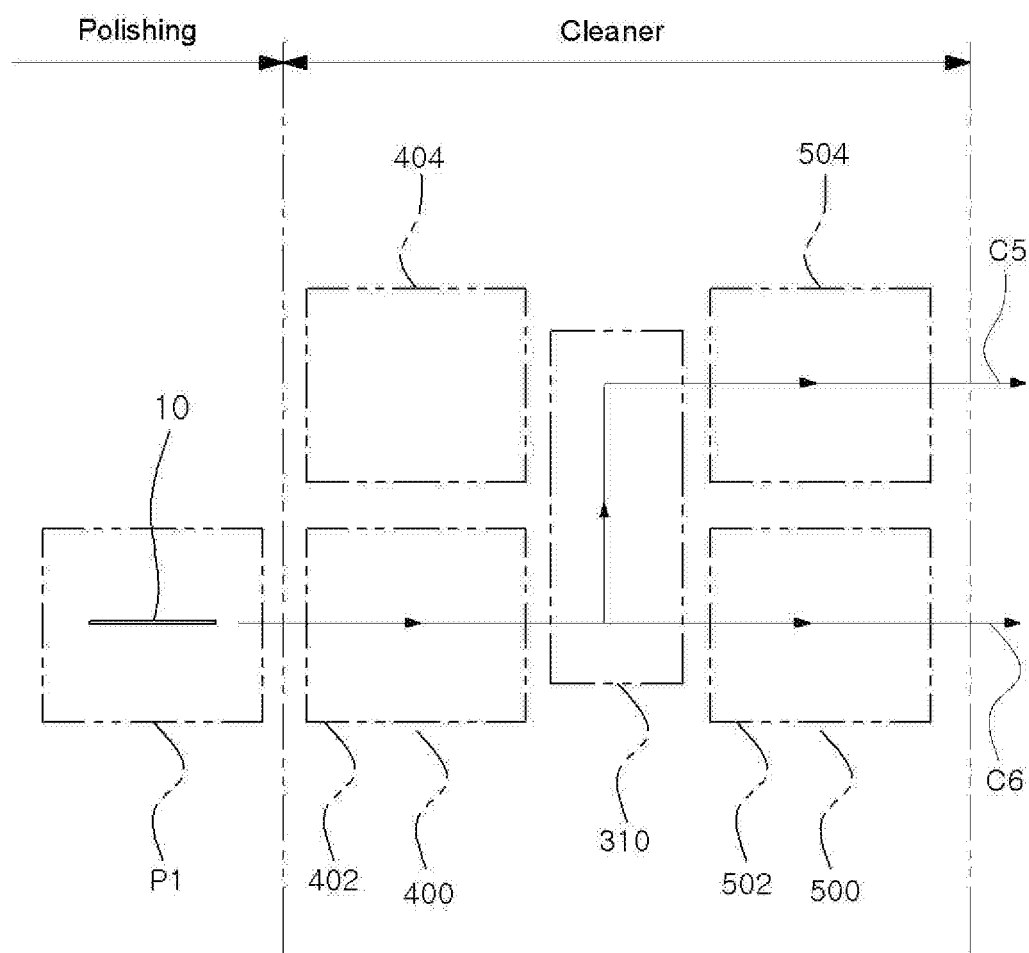
Figure 35:
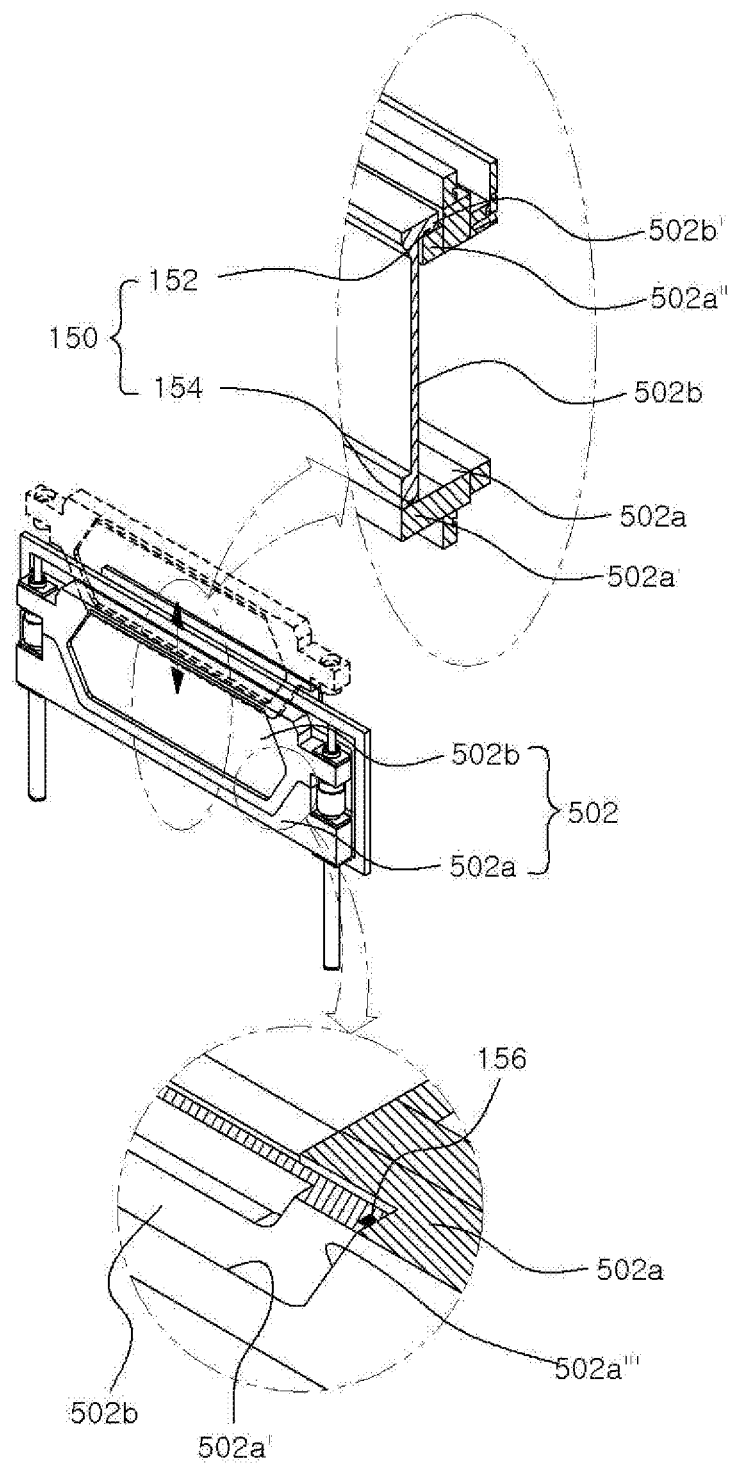
FIG. 35 is a view illustrating a packing member applied to a substrate processing system of FIG. 30.

FIG. 30 is a view illustrating a substrate processing system according to another embodiment of the present invention. FIG. 31 is a view illustrating a cleaning part of the substrate processing system of FIG. 30. FIGS. 32 to 34 are views illustrating a treatment process of a substrate by a substrate processing system of FIG. 30. FIG. 35 is a view illustrating a packing member applied to the substrate processing system of FIG. 30.

Referring to FIGS. 30 and 31, a substrate processing system 1 according to another embodiment may include a polishing part 100 for performing a Chemical Mechanical Polishing (CMP) process on a substrate, a pre-cleaning region P1 prepared in the polishing part 100 and performing pre-cleaning on the substrate 10 having undergone the CMP process, and a cleaning part 300 for cleaning the substrate 10 pre-cleaned in the pre-cleaning region P1. The cleaning part 300 may include a plurality of cleaning units 402, 404, 502 and 504 stacked in a vertical direction and individually performing cleaning on the substrate 10.

A plurality of polishing surface plates 110 may be provided in the polishing part 100, and a polishing pad may be attached to the top surface of each polishing surface plate 110. The substrate 10 supplied to a loading unit provided in the region of the polishing part 100 may make rotational contact with the upper surface of the polishing pad supplied with slurry while adhering closely to a carrier head 120 moving along a predetermined path, and thus the chemical mechanical polishing process may be performed.

In one embodiment, the polishing part 100 may include a first polishing region 101 comprising a plurality of first polishing surface plates 110 disposed therein, a second polishing region 102 facing the first polishing region and comprising a plurality of second polishing surface plates 110' disposed therein, and a substrate transfer line 104 disposed between the first polishing region 101 and the second polishing region 102 and transferring a substrate 10 loaded to a loading region P2 prepared in the polishing part 100. The substrate 10 loaded to the loading region P2 may be transferred along the substrate transfer line 104 to be polished in the first polishing region 101 or the second polishing region 102, and then may be unloaded to a pre-cleaning region P1.

The substrate transfer line 104 may be disposed at the center between the first polishing region 101 and the second polishing region 102, and the substrate 10 loaded to the loading region P2 may be transferred along the substrate transfer line 104. Thereafter, the substrate 10 may enter the first polishing region 101 or the second polishing region 102.

Thus, in this embodiment, the substrate 10 may be first transferred along the substrate transfer line 104, and may be polished in the first polishing region 101 or the second polishing region 102 and then immediately unloaded to the pre-cleaning region P1. Thus, a separate spraying device for maintaining the wet state of the substrate 10 having undergone the polishing may not be needed, and an occurrence of a watermark may be prevented.

In other words, the substrate may be first polished in the first polishing region or the second polishing region, and the substrate having undergone the polishing may be transferred along the substrate transfer line and then unloaded from the pre-cleaning region. However, in this structure (see FIG. 25) where the substrate is transferred after being polished, the substrate having undergone the polishing may be dried while being transferred along the substrate transfer line, and a watermark may occur or a mounted part of the substrate may be damaged. Accordingly, a separate spraying device or wetting bath needs to be inevitably provided on the substrate transfer line to maintain the wet state of the substrate. However, in this embodiment, since the substrate 10 is first transferred through the substrate transfer line 104 provided at the center between the first polishing region 101 and the second polishing region 102, and the substrate 10 is polished in the first polishing region 101 or the second polishing region 102 and then immediately unloaded to the pre-cleaning region P1, a separate device for wetting the substrate 10 may not be needed, and the substrate 10 having undergone the polishing process may be prevented from being dried. In addition, damage of substrate-mounted parts due to drying and a defect due to a watermark may be prevented.

The substrate 10 having undergone the polishing process may be cleaned by at least one of the cleaning fluid spraying part (cleaning liquid spraying part, steam spraying part, and heterogeneity fluid spraying part), the megasonic generator, and the cleaning brush when the substrate 10 is placed on the substrate mounting part (see 200 of FIG. 5) disposed in the pre-cleaning region P1. The details will be described below referring to FIGS. 4 to 12.

The cleaning part 300 including the plurality of cleaning units 402, 404, 502 and 504 provided in a stacked structure may be provided in various structures in accordance with the required conditions. Here, the stacking of the plurality of cleaning units 402, 404, 502 and 504 in a vertical direction may be defined as stacking the plurality of cleaning units 402, 404, 502 and 504 in a two or more-layered structure.

In one embodiment, the cleaning units 402, 404, 502 and 504 may include a plurality of contact-type cleaning units 402 and 404, and a plurality of non-contact-type cleaning units 502 and 504. The plurality of contact-type cleaning units 402 and 404 may be stacked in a vertical direction, may make physical contact with the surface of the substrate 10, and may individually perform cleaning on the substrate 10. The plurality of non-contact-type cleaning units 502 and 504 may be stacked in a vertical direction, may not physically contact the surface of the substrate 10, and may individually perform cleaning on the substrate 10. Hereinafter, a configuration in which two contact-type cleaning units 402 and 404 and two non-contact-type cleaning units 502 and 504 are disposed in two-layered structure, respectively, will be described. According to circumstances, only one of the contact-type cleaning unit and the non-contact-type cleaning unit may be provided in a stacked structure.

The plurality of contact-type cleaning units 402 and 404 may be provided with the cleaning brush (see 410 of FIG. 13) and the chemical supply part (see 420 of FIG. 13).

The non-contact-type cleaning units 502 and 504 may include a cradle 520 and a recovery container 530. The cradle 520 may allow the substrate 10 to be placed thereon one by one, and may rotate about the center of the shaft 521 inside the casing 402a. The recovery container 530 may surround the circumference of the cradle 520, and may collect a processing fluid scattering from the surface of the substrate 10. The substrate 10 may be cleaned by at least one of the cleaning fluid spraying part (cleaning liquid spraying part, steam spraying part, and heterogeneity fluid spraying part), the isopropyl alcohol spraying part, and the megasonic generator when the substrate 10 is placed on the cradle 520. (See FIGS. 12 and 21 to 24)

In addition, the cleaning part 300 may include a transfer unit 310 to transfer the substrate 100 from any one of the plurality of cleaning units 402, 402, 502 and 504 to another of the plurality of cleaning units 402, 402, 502 and 504. The substrate 10 may be transferred in the cleaning part 300 by the transfer unit 310.

A typical robot arm that can move in a vertical direction may be used as the transfer unit 310, and the present invention is not limited by the type and structure of the transfer unit 310.

The substrate 10 may be cleaned along various cleaning paths that are defined in the cleaning part 300. Here, the cleaning path of the substrate 10 may be construed as an order in which the substrate 10 is cleaned in the cleaning part 300 or a path along which the substrate 10 is transferred while being cleaned in the cleaning part 300.

More specifically, the substrate 10 may be configured to be cleaned along the cleaning path passing through at least one of the plurality of cleaning units 402, 404, 502 and 504 in the cleaning part 300. The cleaning path of the substrate 10 may go through at least one of the plurality of contact-type cleaning units 402 and 404 and at least one of the plurality of non-contact-type cleaning units 502 and 504 in order to improve the cleaning efficiency of the substrate 10.

In one embodiment, referring to FIG. 32, the substrate 10 entering the cleaning part 300 after pre-cleaned in the pre-cleaning region P1 may be cleaned along a cleaning path C1 that sequentially goes through the first contact-type cleaning unit 402, the second contact-type cleaning unit 404, and the second non-contact-type cleaning unit 504, and then may be discharged. In this case, the substrate 10 cleaned in the first contact-type cleaning unit 402 may be transferred to the second contact-type cleaning unit 404 by the transfer unit 310, and the substrate 10 cleaned in the second contact-type cleaning unit 404 may be transferred to the second non-contact-type cleaning unit 504 by the transfer unit 310.

In another embodiment, referring to FIG. 32, the substrate 10 entering the cleaning part 300 after pre-cleaned in the pre-cleaning region P1 may be cleaned along a cleaning path C2 that sequentially goes through the first contact-type cleaning unit 402, the second contact-type cleaning unit 404, and the first non-contact-type cleaning unit 502, and then may be discharged. In this case, the substrate 10 cleaned in the first contact-type cleaning unit 402 may be transferred to the second contact-type cleaning unit 404 by the transfer unit 310, and the substrate 10 cleaned in the second contact-type cleaning unit 404 may be transferred to the first non-contact-type cleaning unit 502 by the transfer unit 310.

In addition, at least one of the plurality of cleaning units 402, 404, 502 and 504 which is predetermined may be skipped in the cleaning path of the substrate 10.

Here, the skipping of at least one of the plurality of cleaning units 402, 404, 502 and 504 which is predetermined in the cleaning path of the substrate 10 may be construed as being cleaned in the cleaning part without going through a specific cleaning unit that is skipped.

In one embodiment, referring to FIG. 33, the substrate 10 entering the cleaning part 300 after pre-cleaned in the pre-cleaning region P1 may be cleaned along a cleaning path C3 that sequentially goes through the second contact-type cleaning unit 404 and the second non-contact-type cleaning unit 504 without going through the first contact-type cleaning unit 402, and then may be discharged. In this case, the substrate 10 entering the cleaning part 300 may be transferred to the second contact-type cleaning unit 404 by the transfer unit 310, and the substrate 10 cleaned in the second contact-type cleaning unit 404 may be transferred to the second non-contact-type cleaning unit 504 by the transfer unit 310.

In another embodiment, referring to FIG. 33, the substrate 10 entering the cleaning part 300 after pre-cleaned in the pre-cleaning region P1 may be cleaned along a cleaning path C4 that sequentially goes through the second contact-type cleaning unit 404 and the first non-contact-type cleaning unit 502 without going through the first contact-type cleaning unit 402, and then may be discharged. In this case, the substrate 10 entering the cleaning part 300 may be transferred to the second contact-type cleaning unit 404 by the transfer unit 310, and the substrate 10 cleaned in the second contact-type cleaning unit 404 may be transferred to the first non-contact-type cleaning unit 502 by the transfer unit 310.

In another embodiment, referring to FIG. 34, the substrate 10 entering the cleaning part 300 after pre-cleaned in the pre-cleaning region P1 may be cleaned along a cleaning path C5 that sequentially goes through the first contact-type cleaning unit 402 and the second non-contact-type cleaning unit 504 without going through the second contact-type cleaning unit 404, and then may be discharged. In this case, the substrate 10 cleaned in the first contact-type cleaning unit 402 may be transferred to the second non-contact-type cleaning unit 504 by the transfer unit 310.

In another embodiment, referring to FIG. 34, the substrate 10 entering the cleaning part 300 after pre-cleaned in the pre-cleaning region P1 may be cleaned along a cleaning path C6 that sequentially goes through the first contact-type cleaning unit 402 and the first non-contact-type cleaning unit 502 without going through the second contact-type cleaning unit 404, and then may be discharged. In this case, the substrate 10 cleaned in the first contact-type cleaning unit 402 may be transferred to the first non-contact-type cleaning unit 502 by the transfer unit 310.

In this embodiment, although the cleaning path of the substrate 10 is described as configured in a forward direction (contact-type cleaning unit to non-contact-type cleaning unit), according to circumstances, the cleaning path of the substrate 10 may be configured in a backward direction (non-contact-type cleaning unit to contact-type cleaning unit). For example, the substrate entering the cleaning part after pre-cleaned in the pre-cleaning region may also be cleaned in the second non-contact-type cleaning unit, and then may be cleaned in the first contact-type cleaning unit to be discharged.

Meanwhile, the plurality of cleaning units 402, 404, 502 and 504 constituting the cleaning part 300 may include a blocking unit that independently blocks each cleaning space from other spaces.

In one embodiment, the blocking unit includes casings (see 402a, 402b, 502a and 504a of FIG. 20) disposed to surround the substrate 10 and providing an independent cleaning processing space, and a shutter (402b, 404b, 502b and 504b of FIG. 20) opening and closing the inlet of the casing (402a, 404a, 502a and 504a).

Thus, since each cleaning space of the plurality of cleaning units 402, 404, 502 and 504 is independently blocked by the blocking unit, a cleaning failure and a cleaning deterioration due to an inflow of fumes generated during the cleaning of the substrate 10 into a cleaning space of another cleaning unit that is adjacent can be prevented.

In addition, the casings (see 402a, 402b, 502a and 504a of FIG. 20) and the shutters (402b, 404b, 502b and 504b of FIG. 20) of each cleaning unit (402, 404, 502 and 504) may be provided in a structure that can maximally prevent leakage of fumes from each cleaning space.

In one embodiment, referring to FIG. 35, the shutter 502b may be configured to open and close the inlet of the casing 502a while straightly moving in a vertical direction. The casing 502a may include a lower stepped part 502a' disposed under the inlet of the casing 502a, an upper stepped part 502a'' disposed over the inlet of the casing 502a, and a side inclination stepped part 502a''' obliquely disposed at a side of the inlet of the casing 502a, which are disposed at an outer surface of the casing 502a. The shutter 502b may include an extension stepped part 502b' formed on an inner surface of the upper portion thereof and making contacting with the top surface of the upper stepped part 502a''. The undersurface of a lower portion of the shutter 502b may make contact with the top surface of the lower stepped part 502a'. The side surface of the shutter 502b may make contact with the side inclination stepped part 502a''.

Thus, the casing 502a may include the lower stepped part 502a', the upper stepped part 502a'', and the side inclination stepped part 502a'' formed on an outer surface thereof. Also, the extension stepped part 502b' formed on an inner surface of an upper portion of the shutter 502b may make contact with the top surface of the upper stepped part 502a''. In addition, the undersurface of a lower portion of the shutter 502b may make contact with the top surface of the lower stepped part 502a', and the side surface of the shutter 502b may make contact with the side inclination stepped part 502a''. In other words, a multi-sealing structure in which the stepped parts 502a', 502a'', 502a''', and 502b' are bent along the circumferential surfaces thereof may be formed. Thus, the sealing performance of each cleaning space of the plurality of cleaning units 402, 404, 502 and 504 can be increased, and fumes generated during the cleaning can be more effectively prevented from being leaked to the outside.

More preferably, each cleaning space of the plurality of cleaning units 402, 404, 502 and 504 can be more effectively sealed, by providing a packing member 150 to seal a gap between the casing 502a and the shutter 502b of the cleaning unit 502.

The packing member 150 may be formed of an elastic material such as rubber, urethane, and silicone, and the material of the packing member 150 may be variously modified in accordance with the required conditions and the design specifications.

In one embodiment, the packing member 150 may include an upper packing part 152 disposed between the extension stepped part 502b' and the upper stepped part 502a'', a lower packing part 154 disposed between the undersurface of the lower portion of the shutter 502b and the lower stepped part 502a', and a side packing part 156 disposed between the side surface of the shutter 502b and the side inclination stepped part 502a''.

Thus, a double-sealing structure may be formed around the inlet using the stepped parts 502a', 502a'', 502a''' and 502b'. Also, a gap between the casing 502a and the shutter 502b can be sealed by the packing member 150. Accordingly, the sealing performance of each cleaning space of the plurality of cleaning units 402, 404, 502 and 504 can be increased, and fumes can be more effectively prevented from being leaked from a gap between the casing 502a and the shutter 502b during the cleaning.

Hereinafter, a substrate processing system 2 according to another embodiment of the present invention will be described in detail with reference to FIGS. 36 to 39. The substrate processing system 2 described below may be different from the previous substrate processing system 1 in that the substrate processing system 2 includes a buffer module. However, other configurations may be identical or similar to those according to the previous embodiment. Accordingly, other configurations except the buffer module will be assigned with the same reference numerals as the previous embodiment, and a detailed description thereof will be omitted herein.

Figure 36:
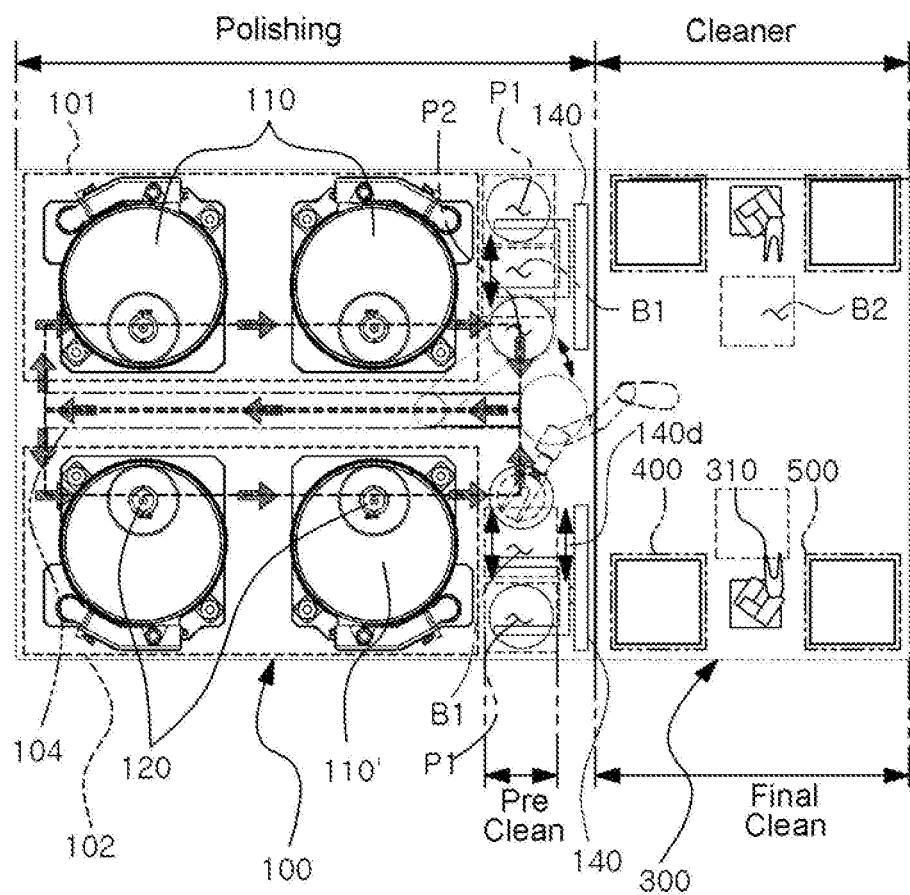
FIG. 36 is a view illustrating a substrate processing system according to another embodiment of the present invention.

Referring to FIG. 36, the substrate processing system 2 may include a polishing part 100 for performing a Chemical Mechanical Polishing (CMP) process on a substrate, a pre-cleaning region P1 which is prepared in the polishing part 100 and in which pre-cleaning is performed on a substrate 10 having undergone the CMP process, a cleaning part 300 for cleaning the substrate 10 pre-cleaned in the pre-cleaning region P1, and a buffer module B disposed in at least one of the polishing part 100 and the cleaning part 30 and providing a space where the substrate 10 is located and stands by until a next process.

The polishing part 100 may be provided in various structures by which the chemical mechanical polishing process can be performed, and may be configured identically or similarly to the configuration 1 of the above-mentioned embodiment.

Similarly, the pre-cleaning region P1 may be disposed in the region of the polishing part 100, and the substrate 10 having undergone the polishing process may be unloaded to the pre-cleaning region P1. Also, the pre-cleaning region P1 may be provided to perform pre-cleaning on the substrate 10 that is unloaded.

Thus, since pre-cleaning is performed along with unloading of the substrate 10 having undergone the polishing process from the pre-cleaning region P1, a separate space for the pre-cleaning need not to be additionally prepared. Accordingly, the layout of existing equipment can be almost maintained without a change or an addition, and the increase of contamination of the cleaning part 300 due to a direct entrance of the substrate 10 having undergone the polishing into the cleaning part 300 can be reduced.

Referring again to FIG. 36, the substrate processing system 2 may include buffer modules (B1, B2; B). The first module B1 may be disposed between the circulation path of the wafer carrier 120 and the pre-cleaning region P1 of the polishing part 100.

The substrate 10 having undergone the polishing process in the polishing part 100 and gripped by the carrier head 120 may be supplied to the pre-cleaning region P1, and may undergo pre-cleaning. Thereafter, the substrate 10 may be transferred to the cleaning part 300, and then may undergo the main cleaning process. In this case, the polishing process performed in the polishing part 100 may have a deviation in processing time in accordance with the material of the polishing layer. Thus, there may be a difference in supply time of the substrate 10 having undergone the polishing in the polishing part to the pre-cleaning region P1.

Accordingly, when the substrate 10 having undergone the polishing process in the polishing part 100 is transferred to the pre-cleaning region but there is another substrate on which the pre-cleaning process is being performed in the pre-cleaning region P1, a first mode in which the first buffer module B1 is supplied with the substrate 10 from the wafer carrier 120 and piles up the substrate 10 may be performed.

Figure 37:
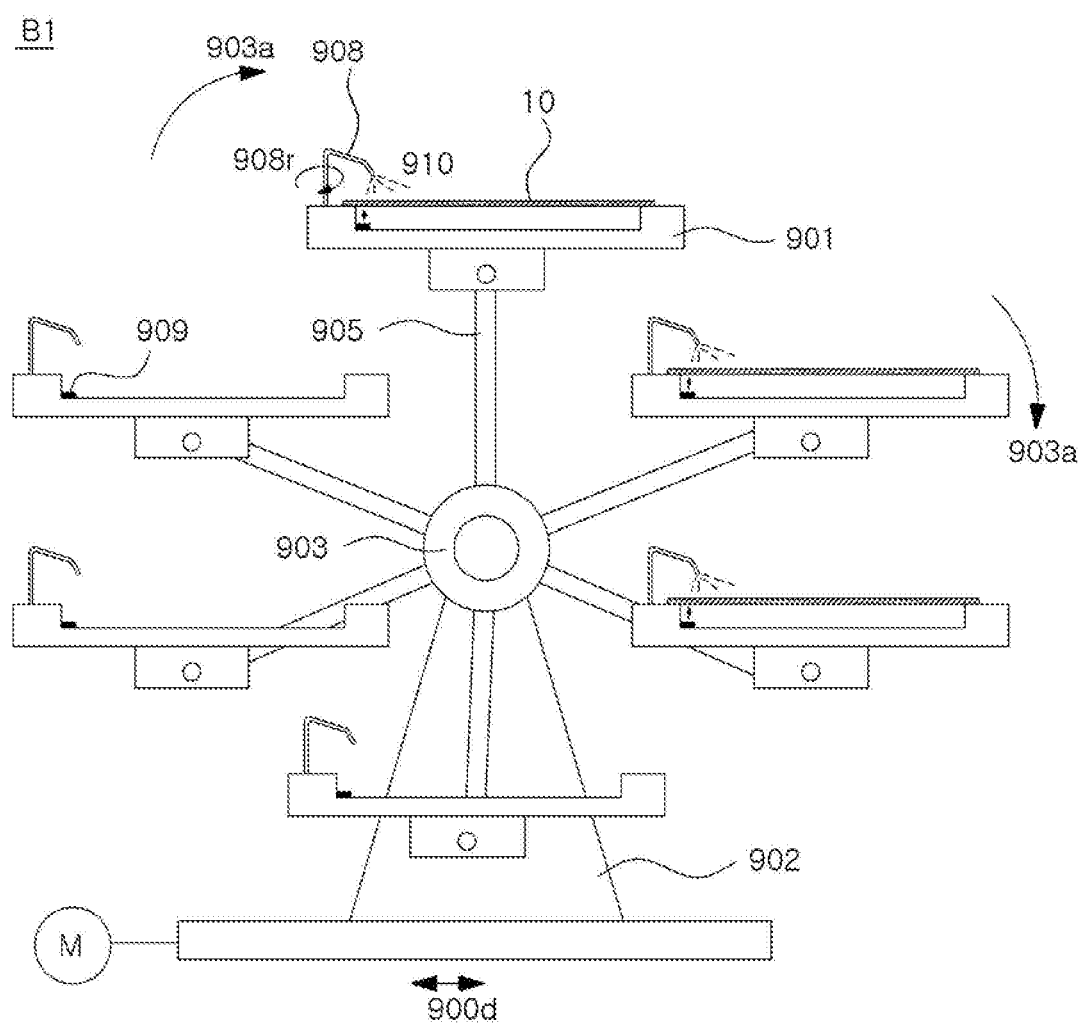
FIG. 37 is a view illustrating a configuration of a first buffer module of FIG. 16, in a substrate processing system according to an embodiment of the present invention.

Referring to FIG. 37, the first buffer module B1 may include a plurality of cradles 901 on which the substrate 10 is located. The cradles 901 may be hinge-connected to connection members 905 that are radially extended from a rotary driving part 903. The first buffer module B1 may be configured to allow the cradles 901 to rotatably circulate (903a) while maintaining the horizontal state of the cradles 901.

Also, a sensor 909 may be disposed to detect whether or not the substrate 10 is seated on each cradle 901. When the substrate 10 is placed on the cradle 901, pure water 910 may be supplied from a pure water supply opening 908, and thus the substrate 10 placed on the cradle 901 may be maintained at a wetted state. In the drawing, the pure water supply opening 908 is illustrated as supplying pure water 910 toward the substrate 10 from the upper side, but simultaneously or separately, the pure water supply opening 908 may upwardly supply pure water 910 from the lower side. Thus, regardless of the direction which the polishing surface of the substrate 10 faces, the polishing surface of the substrate 10 can be maintained at a wetted state, thereby preventing foreign substances adhering to the polishing surface from being dried and stuck to the polishing surface and simultaneously preventing the substrate 10 from being damaged while being dried in accordance with the properties of the substrate 10.

Figure 38:
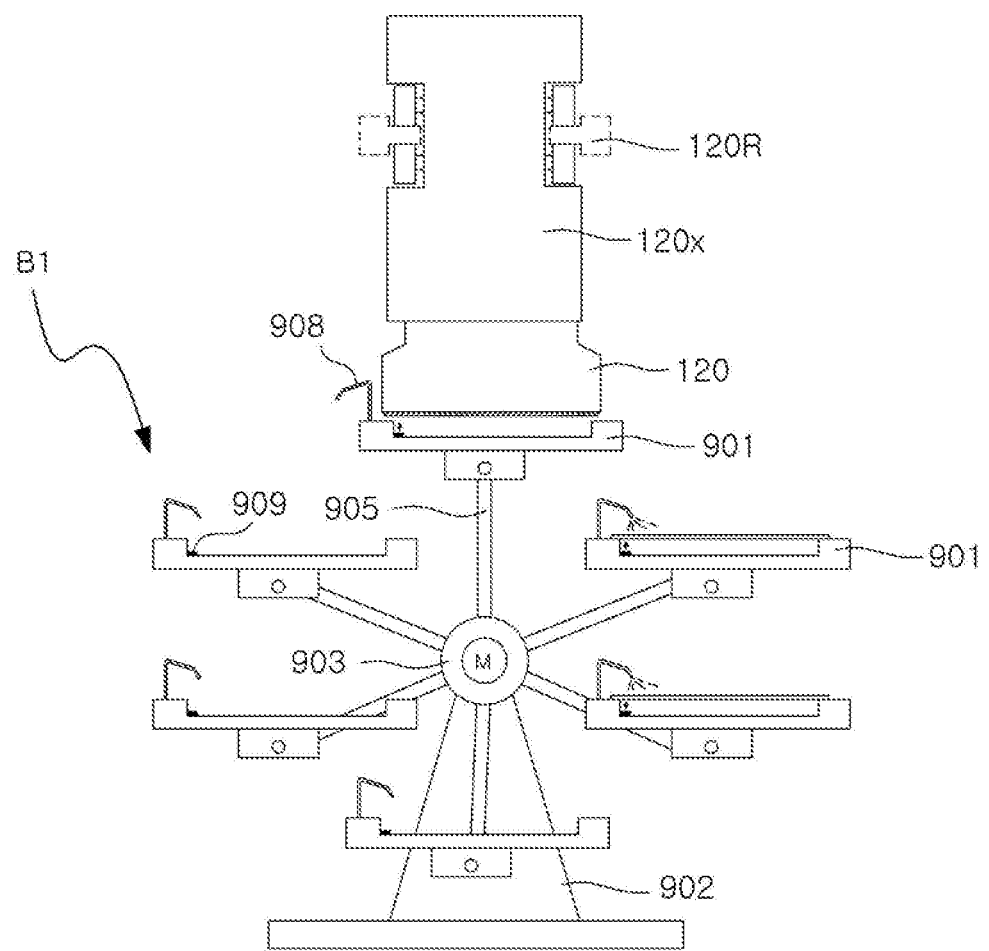
FIG. 38 is a view illustrating a substrate seated on a cradle of a first buffer module of FIG. 36 from a carrier head, in a substrate processing system according to an embodiment of the present invention.

Above all, since the first buffer module B1 is configured to include the plurality of cradles 901 rotatably circulating so as to have a vertical directional component, any cradle 901 can be located at the uppermost side. Accordingly, as shown in FIG. 38, when the cradle 901 on which the substrate 10 is to be placed is rotated to an upper location (903a), a spindle 120x carrying the carrier head 120 along a guide rail 120R may be located over the first buffer module B1, and the substrate 10 may be released from the carrier head 120. Thus, the substrate 10 may be directly placed on the cradle 901 from the carrier head 120 even though there is no moving unit (e. g., transfer arm or transfer robot) that grips and moves the substrate 10.

In addition, the first buffer module B1 may be configured to reciprocate (900d) along a predetermined path between the circulation path of the carrier head 120 and the pre-cleaning region P1 by a driving part M. Accordingly, although the carrier head 120 is not deviated from the circulation path (arrow path of FIG. 2) for the polishing process of the substrate 10, the carrier head 120 may downwardly drop the substrate 10 from the upper side of the first buffer module B1 when the first buffer module B1 moves to the lower side of the circulation path of the carrier head 120. Thus, although the moving path and moving time of the carrier head 120 are not additionally needed, the substrate 10 of the carrier head 120 may be moved to the first buffer module B1, and then the carrier head 120 may immediately start the polishing process by being supplied with a new substrate from the loading unit 20.

In the drawings, the plurality of cradles of the first buffer module B1 are configured to rotate, but the present invention is not limited thereto. For example, the first buffer module B1 may also be implemented in a vehicle parking tower or other various forms.

Thus, according to an embodiment, even though the feeding cycle for supplying a substrate into the pre-cleaning process after the polishing process of the substrate does not coincide with the time spent for the pre-cleaning process, the carrier head 120 can continuously perform the polishing process of the substrate, thereby increasing the efficiency of the polishing process.

Particularly, as disclosed in Korean Patent Application No. 2014-173576 filed by the present applicant, when various polishing processes are performed in a single layout of polishing part, the polishing process may be finished in the polishing part, and thus the feeding cycle in the pre-cleaning process may not be constant. Nevertheless, in this embodiment, the treatment process of a substrate can be continuously performed even on a substrate having undergone the polishing process at a non-uniform time interval in the polishing part, by providing the first buffer module B1 near the pre-cleaning region P1.

Also, substrates may move along two circulation paths in the polishing part 100 shown in FIG. 36, but the polishing processes performed in the two polishing circulation paths may be different from each other. In this case, when the substrate 10 is supplied to the pre-cleaning regions P1 disposed at lower and upper sides, the substrate 10 having undergone the polishing process at an upper side may be supplied to the pre-cleaning region P1 at a lower side using the substrate loading transfer device, and the substrate 10 having undergone the polishing process at a lower side may also be supplied to the pre-cleaning region P1 at an upper side using the substrate loading transfer device.

Thus, since there occurs a deviation in polishing time spent to finish polishing in the polishing process that is performed in two polishing circulation paths, the substrate may be selectively supplied to any one of the pre-cleaning regions P1 disposed at upper and lower sides without standing by as much as the time deviation. Thus, the time for supplying the substrate from the pre-cleaning process to the main cleaning process can be shortened.

In other words, although the feeding cycle of the substrate 10 that is supplied to the pre-cleaning regions P1 disposed at upper and lower sides is irregular, the first buffer module B1 may receive the substrate 10 that is excessively supplied. When the substrate that is being pre-cleaned in the pre-cleaning region P1 is transferred to the cleaning part 300 for the main cleaning process, the first mode in which the substrate 10 is supplied to the pre-cleaning region P1 may be performed in the first buffer module B1. Accordingly, despite the deviation of the feeding cycle of the substrate having undergone different polishing processes in the polishing part, the efficiency of the process can be maximized. In this case, the carrier head that is gripping the substrate 10 having undergone the polishing process may supply and pile up the substrate 10 to the first buffer module B1 disposed at upper and lower sides and having fewer substrates piled up. Thus, although different polishing processes are performed in one equipment 2, the continuous processing of the substrate 10 can be performed.

Also, the supplying of the substrate 10 from the first buffer module B1 to the pre-cleaning region P1 may be performed by a device such as a robot arm, but may also be performed by the inverting unit 140 shown in FIGS. 27 and 28. When being transferred from the first buffer module B1 to the pre-cleaning region P1 by the inverting unit 140, the substrate 10 may be inverted 180 degrees, and may be supplied to the pre-cleaning region P1 while the polishing surface faces upward.

Meanwhile, a second mode in which the substrate 10 gripped by the carrier head 120 is directly supplied from the carrier head 120 to the pre-cleaning region P1 may be performed on the substrate 10 having undergone the polishing process at the upper and lower sides of the polishing part 100 when the pre-cleaning process of another substrate is not being performed in the pre-cleaning region P1.

In this case, as shown in FIGS. 27 and 28, the substrate 10 may be transferred from the carrier head 120 to the inverting unit 140, and may be supplied to the pre-cleaning region P1 while being inverted 180 degrees by the inverting unit 180 such that the polishing surface faces upward. That is, the grip assembly 148 of the inverting unit 140 may be disposed at an upper side or one side of the first buffer module 148 may move (140d) between the circulation path of the carrier head 120 and the pre-cleaning region P1.

Accordingly, when the pre-cleaning region P1 is vacant and thus the pre-cleaning can be immediately performed on the substrate having undergone the polishing process, the inverting unit 140 that is movable may receive the substrate 10 from the carrier head 120, and may move the substrate 10 to the pre-cleaning region P1. According to circumstances, the pre-cleaning may also be performed in the pre-cleaning region P1 while the substrate is being gripped by the inverting unit 140.

The inverting unit 140 may invert the polishing surface of the substrate 10 in an opposite direction before the substrate 10 having undergone the chemical mechanical polishing process is supplied to the cleaning part 300.

That is, when the pre-cleaning region of the substrate is provided at an outer side of the moving path of the carrier head, the carrier head needs to move along the moving path, and then needs to move again to the pre-cleaning region of the substrate provided at the outer side of the moving path. In this case, the moving path of the carrier head may inevitably increase. However, in a structure where the substrate 10 is gripped by the inverting unit 140, since the carrier head 120 need not move to the pre-cleaning region P1 and may move only along the moving path, the moving path of the carrier head 120 need not be added except the circulation path.

Meanwhile, as shown in FIG. 36, a cleaning buffer module B2 may be disposed in the cleaning part 300 to accommodate a substrate expected to be supplied to a next cleaning unit while the cleaning process of another substrate is being performed in the next cleaning unit.

Accordingly, the cleaning unit that has undergone the treatment process as early as the cleaning time deviation of the plurality of cleaning units may not hold a substrate, and the substrate having the cleaning process in each cleaning unit may be moved to and located at the cleaning buffer module B2.

Figure 39:
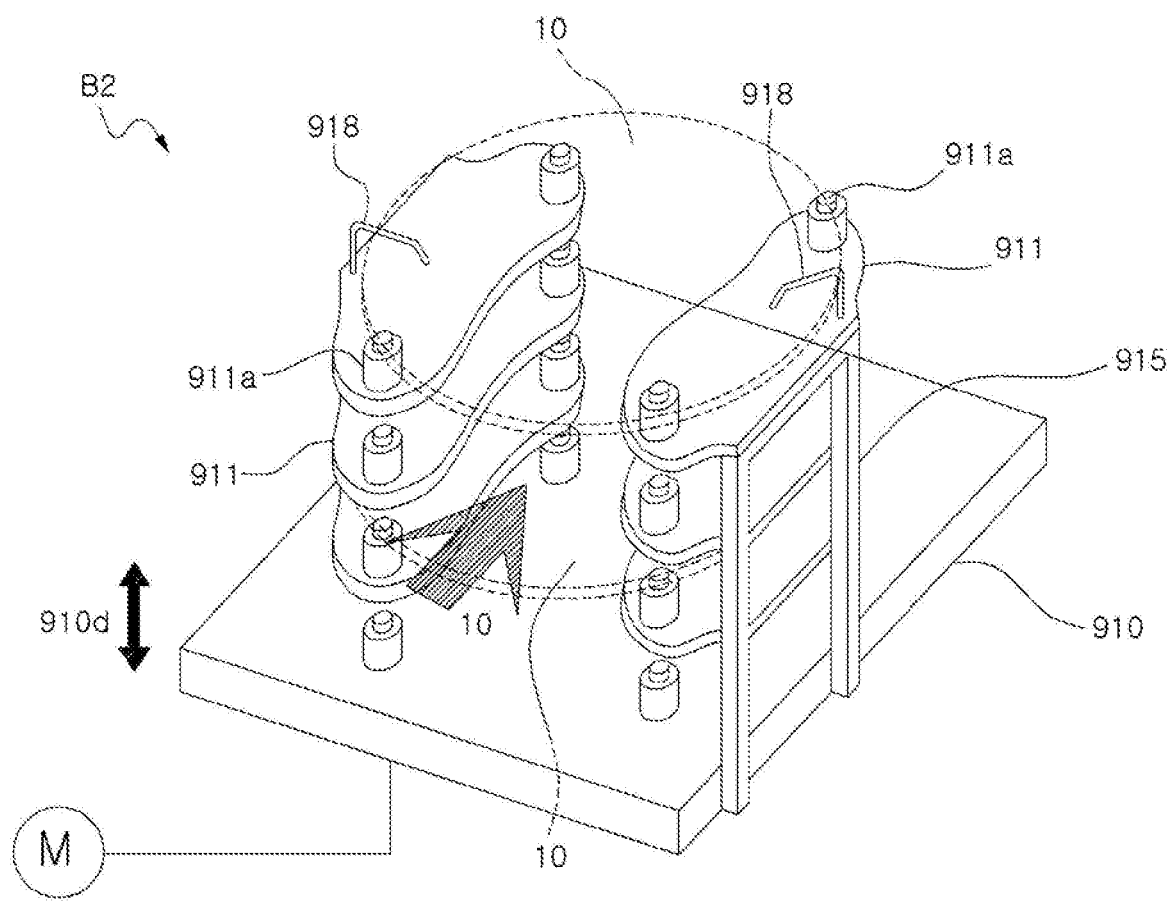
FIG. 39 is a view illustrating a cleaning buffer module in a substrate processing system of FIG. 36.

The cleaning buffer module B2 may be configured to have a similar form to the first buffer module B1. However, as shown in FIG. 39, since the substrate 10 is moved between the cleaning units 400 and 500 by the transfer unit 310, the heights of cradles 911 may be configured to be fixed with respect to each other.

That is, the cradle 911 including a cradle protrusion 911a formed thereon may be disposed in plurality in a vertical direction, and the substrate 10 to be introduced to the cleaning units 400 and 500 may be placed and accommodated thereon. Similarly, a pure water supply unit 918 for supplying pure water may be disposed on each cradle 911, and may maintain the wetted state of the substrate 10 by supplying pure water or cleaning liquid to the substrate 10.

Each cradle 911 may be fixed to a frame 915 extending in a vertical direction, and may move in a vertical direction (910d) together with a bottom support 910 by a driving part M. Thus, the height of the substrate 10 may be adjusted to a height at which the transfer unit can easily grip the substrate 10.

As shown in FIG. 36, the cleaning buffer module B2 may also be disposed at a footprint region different from the cleaning units 400 and 500. When the cleaning buffer module B2 is disposed at the footprint region different from the cleaning units 400 and 500, the cleaning buffer module B2 may be configured to reciprocate between the cleaning units 400 and 500 in order to shorten the time taken by the transfer unit 310 to move the substrate 10 to a next cleaning unit. Thus, when the substrate 10 is supplied to the contact-type cleaning unit 400 by the transfer unit 310, the cleaning buffer module B2 may move closely to the contact-type cleaning unit. Accordingly, the time taken to supply the substrate placed on the cleaning buffer module B2 to the contact-type cleaning unit 400 can be shortened. Also, when the substrate 10 is supplied to the non-contact-type cleaning unit 500 by the transfer unit 310, the cleaning buffer module B2 may move closely to the non-contact-type cleaning unit 500. Accordingly, the time taken to supply the substrate placed on the cleaning buffer module B2 to the non-contact-type cleaning unit 500 can be shortened.

Figure 40:
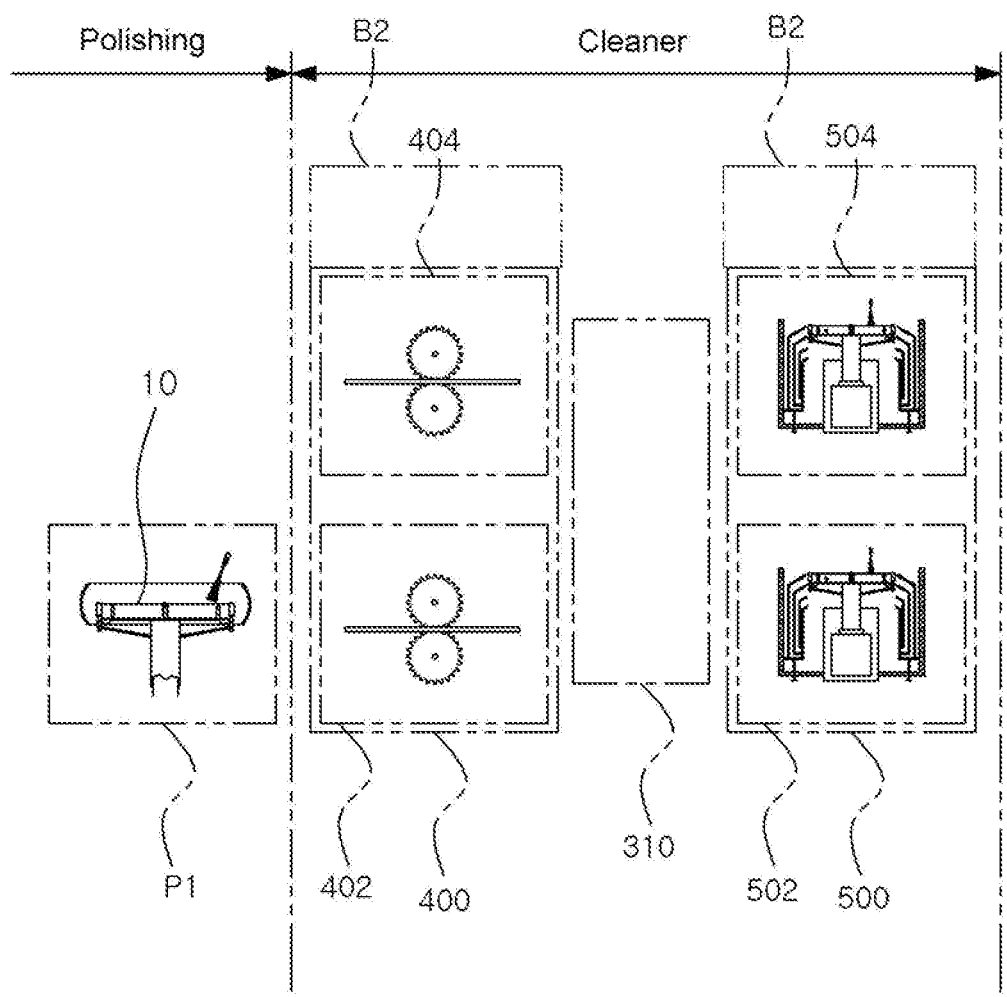
FIG. 40 is a view illustrating another exemplary cleaning buffer module disposed in a cleaning part of a substrate processing system of FIG. 36.

Meanwhile, as shown in FIG. 40, the cleaning buffer module B2 may also be disposed at the same footprint region as at least one of the cleaning units 400 and 500. As shown in FIG. 40, the cleaning buffer module B2 may be stacked over the cleaning units 400 and 500 or may be located under the cleaning units 400 and 500. In this case, since the cleaning buffer module B2 does not occupy an additional footprint, the buffer module can be installed in a limited space. Also, since the transfer unit 310 having a form of robot arm can move between the cleaning units 400 and 500 and the cleaning buffer module B2, the supply and transfer of the substrate can be more conveniently performed.

In the drawings, one cleaning buffer module B2 is illustrated as being disposed in one footprint region, but the present invention is not limited thereto. For example, two or more cleaning buffer modules B2 may be disposed in one footprint region.

Above all, the cleaning buffer module B2 may be disposed between the contact-type cleaning unit 400 and the non-contact-type cleaning unit 500. Here, the term 'between' may be construed as including a 'space' between the contact-type cleaning unit 400 and the non-contact-type cleaning unit 500, but may also be construed as including a 'time' from the treatment process in the contact-type cleaning unit 400 to the supply to the non-contact-type cleaning unit 500. Thus the total tack time in the cleaning part 300 can be reduced.

In other words, since the contact-type cleaning type and the non-contact-type cleaning type have fundamentally different cleaning modalities, the processing time taken for cleaning the substrate 10 in the contact-type cleaning unit 400 may be usually different from the processing time taken for cleaning the substrate 10 in the non-contact-type cleaning unit 500. Accordingly, a substrate cleaned in at least one of the contact-type cleaning units 402 and 404 may be piled up in the cleaning buffer module B2 between the contact-type cleaning units 402 and 404 and the non-contact-type cleaning units 502 and 504 for a residual time prior to the supply to the non-contact-type cleaning units 502 and 504. Thus, the contact-type cleaning units 402 and 404 can continuously perform the contact-type cleaning process on the substrate 10, and the non-contact-type cleaning units 502 and 504 can continuously the non-contact-type cleaning process by being supplied one by one with the substrates 10 that are being piled up in the cleaning buffer module B2. Accordingly, the number of substrate having undergone the cleaning process per unit time can be more increased.

According to the embodiments of the present invention as described above, the cleaning efficiency can be improved, and the cleaning process can be simplified.

Particularly, in the present invention, after foreign substances are preliminarily pre-cleaned in the pre-cleaning region to which the substrate is unloaded, a main cleaning process may be performed on the substrate in the cleaning part. Thus, foreign substances remaining on the surface can be effectively removed, and the cleaning efficiency of the substrate can be improved.

Furthermore, foreign substances remaining on the substrate prior to the cleaning process may be minimized without a reduction of the process efficiency, by performing preparatory cleaning on the substrate in the pre-cleaning region to which the substrate is unloaded, without a change or addition of the layout of existing equipment.

In other words, before the substrate having undergone the polishing process is transferred to undergo the main cleaning process, the substrate may be transferred to a separate cleaning region to be pre-cleaned, and then may be again transferred to the cleaning part. In this case, however, since the substrate needs to go through a complicate transfer process in which the substrate unloaded to the unloading region needs to be transferred to the separate cleaning region and then needs to be again transferred to the cleaning part, the whole processing efficiency of the substrate may be reduced. Also, in order to additionally prepare a separate cleaning region, since the layout of existing equipment needs to be changed or added, the space utilization may be reduced, and the cost may increase for the change of equipment. However, a process sequence in which the substrate having undergone the polishing process is unloaded to the pre-cleaning region and then is transferred to the cleaning part may be maintained without a change, and foreign substances remaining on the substrate may be preliminarily pre-cleaned in the pre-cleaning region. Thus, without a change or addition of the layout of existing equipment, foreign substances remaining on the substrate can be minimized without a reduction of the process efficiency before a main cleaning process is performed.

Also, since foreign substances remaining on the substrate can be maximally removed through the pre-cleaning process performed in the pre-cleaning region prior to the cleaning process, the cleaning effect by the main cleaning process can be improved, and the cleaning efficiency may also be improved.

Also, a footprint of the cleaning part can be reduced and the space efficiency can be improved, by stacking the plurality of cleaning units constituting the cleaning unit into a multi-layered structure.

Also, the cost according to the cleaning of the substrate can be saved, and the process efficiency and the yield can be improved.

Also, since various pre-cleaning methods can be selected and applied in accordance with the type and characteristics of the substrate, foreign substances stuck to the surface of the substrate can be effectively removed, and the cleaning efficiency can be improved.

In addition, since foreign substances remaining on the substrate can be minimized, the defect rate of the substrate can be minimized, and the stability and the reliability may be improved.

Also, each treatment process can be continuously performed without a break by improving the processing efficiency of the substrate.

Above all, the present invention can shorten taken for unloading of a substrate and thus improve the whole process efficiency, by implementing a structure that can directly pile up substrates transferred by the carrier head in the buffer module without a separate robot arm or gripper.

That is, various polishing processes may be performed with one layout, and in a process of performing the pre-cleaning process and the multi-step cleaning process, the stand-by time can be minimized in spite of the time difference spent for each treatment process. Thus, the treatment process can be continuously performed without a break, thereby improving the process efficiency.

The above-disclosed subject matter is to be considered illustrative and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate processing system comprising:
a polishing part for performing a Chemical Mechanical Polishing process on a substrate;
a pre-cleaning region prepared in the polishing part and allowing pre-cleaning to be performed on the substrate having undergone the polishing process therein;
an inverting unit disposed in the pre-cleaning region and gripping the substrate in the pre-cleaning region to invert the substrate; and
a cleaning part for cleaning the substrate pre-cleaned in the pre-cleaning region.

2. The substrate processing system of claim 1, wherein the substrate having undergone the polishing process is unloaded to the pre-cleaning region, and the pre-cleaning is performed on the substrate that is unloaded.

3. The substrate processing system of claim 1, comprising a cleaning fluid spraying part that is disposed in the pre-cleaning region and sprays a cleaning fluid onto the surface of the substrate.

4. The substrate processing system of claim 3, wherein the cleaning fluid comprises at least one of the following: Standard Clean-1 ammonia hydroxide-hydrogen peroxide-water mixture, ammonia, sulfuric acid, hydrogen peroxide, and pure water.

5. The substrate processing system of claim 3, wherein the cleaning fluid spraying part comprises a steam spraying part that sprays steam onto the surface of the substrate.

6. The substrate processing system of claim 3, wherein:
the cleaning fluid spraying part comprises a heterogeneity fluid spraying part that sprays different heterogeneity fluids onto the surface of the substrate;
the heterogeneity fluid spraying part comprises:
a dry ice supply unit for supplying dry ice particles; and
a fluid spraying unit for vertically spraying a fluid onto the surface of the substrate; and the dry ice particles and the fluid are sprayed onto the surface of the substrate while being mixed with each other.

7. The substrate processing system of claim 1, comprising a megasonic generator that is disposed in the pre-cleaning region and supplies vibration energy to the surface of the substrate.

8. The substrate processing system of claim 1, comprising a cleaning brush that is disposed in the pre-cleaning region and makes rotational contact with the surface of the substrate.

9. The substrate processing system of claim 1, comprising a substrate mounting part disposed in the pre-cleaning region and allowing the substrate to be placed thereon,
wherein the substrate is pre-cleaned while being unloaded to the substrate mounting part.

10. The substrate processing system of claim 1, wherein the polishing part comprises:
a first polishing region allowing a plurality of first polishing surface plates to be disposed therein;
a second polishing region facing the first polishing region and allowing a plurality of second polishing surface plates to be disposed therein; and
a substrate transfer line disposed between the first polishing region and the second polishing region, and transferring the substrate loaded to a loading region prepared in the polishing part, and
the substrate loaded to the loading region is transferred along the substrate transfer line to be polished in the first polishing region or the second polishing region, and then is unloaded to the pre-cleaning region.

11. The substrate processing system of claim 1, wherein the inverting unit is disposed to be movable from a loading region, to which the substrate prepared in the polishing part is loaded, to the pre-cleaning region, receiving the substrate from the loading region, and transferring the substrate to the pre-cleaning region to invert the substrate,
wherein the substrate is pre-cleaned in the pre-cleaning region while being supported by the inverting unit.

12. The substrate processing system of claim 11, wherein the inverting unit comprises:
an operation assembly moving the loading region to the pre-cleaning region; and
a rotation assembly invertibly connected to the operation assembly, and
the rotation assembly allows the substrate to be vertically disposed while the pre-cleaning is being performed.

13. A substrate processing system comprising:
a polishing part for performing a Chemical Mechanical Polishing process on a substrate;
a pre-cleaning region prepared in the polishing part and allowing pre-cleaning to be performed on the substrate having undergone the polishing process therein;
a blocking unit for blocking a pre-cleaning processing space of the pre-cleaning region from other spaces while the pre-cleaning is being performed in the pre-cleaning region; and
a cleaning part for cleaning the substrate pre-cleaned in the pre-cleaning region.

14. The substrate processing system of claim 13, wherein the blocking unit comprises:
a casing provided to surround the substrate and providing the independent pre-cleaning processing space; and
a shutter for opening or closing an inlet of the casing.

15. A substrate processing system comprising:
a polishing part for performing a Chemical Mechanical Polishing process on a substrate;
a pre-cleaning region prepared in the polishing part and allowing pre-cleaning to be performed on the substrate having undergone the polishing process therein;
a first buffer module prepared in the polishing part so as to receive the substrate having undergone the polishing process in the polishing part when the pre-cleaning process is being performed on the substrate in the pre-cleaning region, wherein the first buffer module comprises a plurality of cradles to receive a plurality of substrates, which are placed on the plurality of cradles; and
a cleaning part for cleaning the substrate pre-cleaned in the pre-cleaning region.

16. The substrate processing system of claim 15, wherein the plurality of cradles circulate in a component of upward and downward directions.

17. The substrate processing system of claim 15, wherein the polishing part is configured to perform the polishing process on a polishing surface plate when the carrier head moves while gripping the substrate, and
the first buffer module moves between a moving path of the carrier head and the pre-cleaning region.

18. The substrate processing system of claim 10, wherein the polishing part is configured to perform the polishing process on a polishing surface plate when the carrier head moves while gripping the substrate, and
the first buffer module is disposed between a moving path of the carrier head and the pre-cleaning region.

19. A substrate processing system comprising:
a polishing part performing a Chemical Mechanical Polishing process on a substrate;
a pre-cleaning region prepared in the polishing part and allowing pre-cleaning to be performed on the substrate having undergone the polishing process therein; and
a cleaning part for cleaning the substrate pre-cleaned in the pre-cleaning region, wherein the cleaning part comprises:
a plurality of cleaning units stacked in a vertical direction and individually performing cleaning on the substrate; and
a transfer unit transferring the substrate from one of the plurality of cleaning units to another of the plurality of cleaning units,
wherein the substrate is cleaned along a cleaning path that passes through at least one of the plurality of cleaning units in the cleaning part.

20. The substrate processing system of claim 19, further comprising a cleaning buffer module disposed in the cleaning part and providing a space for the substrate to stand by until the cleaning process performed by one of the plurality of cleaning units.

21. The substrate processing system of claim 20, wherein the stacked cleaning units comprise:
a contact-type cleaning unit stacked in one footprint region in a vertical direction; and
a non-contact-type cleaning unit stacked in another footprint region in a vertical direction.

22. The substrate processing system of claim 21, wherein the cleaning buffer module is disposed between the non-contact-type cleaning unit and the contact-type cleaning unit.

23. The substrate processing system of claim 22, wherein the cleaning buffer module comprises a plurality of cradles to receive a plurality of substrates, which are placed on the plurality of cradles.

24. The substrate processing system of claim 23, wherein the cleaning buffer module is stackedly disposed in a footprint region that one of the non-contact-type cleaning unit and the contact-type cleaning unit occupies.

25. The substrate processing system of claim 21, wherein the contact-type cleaning unit comprises:
- a cleaning brush rotatably provided and making contact with the surface of the substrate; and
- a chemical supply part for supplying a chemical to a contact portion of the cleaning brush and the substrate while the cleaning brush is contacting the substrate.

26. The substrate processing system of claim 25, wherein the chemical comprises at least one of the following: Standard Clean-1 ammonia hydroxide-hydrogen peroxide-water mixture, sulfuric acid, hydrogen peroxide, and hydrofluoric acid.

27. The substrate processing system of claim 21, wherein the non-contact-type cleaning unit comprises a cleaning fluid spraying part that spraying a cleaning fluid onto the surface of the substrate.

28. The substrate processing system of claim 27, wherein the cleaning fluid sprayed from the cleaning fluid spraying part comprises at least one of the following: Standard Clean-1 ammonia hydroxide-hydrogen peroxide-water mixture, ozone hydrofluoric acid, hydrofluoric acid, ammonia, hydrogen peroxide, chemical, and pure water.

29. The substrate processing system of claim 27, wherein the cleaning fluid spraying part comprises a steam spraying part that sprays steam onto the surface of the substrate.

30. The substrate processing system of claim 27, wherein the cleaning fluid spraying part comprises a heterogeneity fluid spraying part that sprays different heterogeneity fluids onto the surface of the substrate.

31. The substrate processing system of claim 30, wherein the heterogeneity fluid spraying part comprises:
- a dry ice supply unit for supplying dry ice particles; and
- a fluid spraying unit for spraying a fluid onto the surface of the substrate;
  wherein the dry ice particles and the fluid are sprayed onto the surface of the substrate while being mixed with each other.

32. The substrate processing system of claim 21, wherein the non-contact-type cleaning unit comprises:
- a cradle disposed rotatably and allowing the substrate to be placed one by one on a top surface thereof; and
- a recovery container surrounding a circumference of the cradle and collecting a processing fluid scattering from the surface of the substrate.

33. The substrate processing system of claim 32, wherein the cradle is disposed movably along upward and downward directions, and
the recovery container comprises a plurality of recover cups formed on an inner wall of the recovery container and forming a plurality of recovery ducts for collecting different processing fluids at different heights along upward and downward directions.

34. The substrate processing system of claim 21, wherein at least one of the plurality of cleaning units which is predetermined is skippable in the cleaning path.

35. The substrate processing system of claim 21, further comprising a blocking unit for independently blocking a cleaning space of the cleaning unit from other spaces, wherein the blocking unit comprises:
- a casing provided to surround the substrate and providing an independent cleaning processing space; and
- a shutter straightly moving in upward and downward directions to open and close an inlet of the casing,
wherein
the casing comprises a lower stepped part disposed under the inlet of the casing, an upper stepped part disposed over the inlet of the casing, and a side inclination stepped part obliquely disposed at a side of the inlet of the casing, which are disposed at an outer surface of the casing;
the shutter comprises an extension stepped part formed on an inner surface of an upper portion thereof and making contact with a top surface of the upper stepped part;
the shutter has an undersurface of a lower portion thereof making contact with a top surface of the lower stepped part; and
the shutter has a side surface thereof making contact with the side inclination stepped part.

* * * * *